US012720888B2

(12) United States Patent
Kim

(10) Patent No.: US 12,720,888 B2
(45) Date of Patent: Aug. 25, 2026

(54) IMAGE SENSOR INCLUDING A PIXEL SEPARATION REGION HAVING A REDUCED DARK LEVEL

(71) Applicant: Samsung Electronics Co., Ltd., Suwon-si (KR)

(72) Inventor: Kooktae Kim, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 316 days.

(21) Appl. No.: 18/410,059

(22) Filed: Jan. 11, 2024

(65) Prior Publication Data

US 2024/0274629 A1 Aug. 15, 2024

(30) Foreign Application Priority Data

Feb. 13, 2023 (KR) ........................ 10-2023-0018981

(51) Int. Cl.
*H10F 39/00* (2025.01)
*H04N 25/63* (2023.01)
*H10F 39/18* (2025.01)

(52) U.S. Cl.
CPC ......... *H10F 39/8057* (2025.01); *H04N 25/63* (2023.01); *H10F 39/182* (2025.01)

(58) Field of Classification Search
CPC .. H10F 39/8057; H10F 39/182; H10F 39/199; H10F 39/807; H10F 39/12; H10F 39/8053; H10F 39/811; H10F 39/18; H10F 39/8023; H10F 39/8037; H10F 39/803;

(Continued)

(56) References Cited

U.S. PATENT DOCUMENTS 9,741,759 B2 8/2017 Park
2021/0143191 A1 5/2021 Ha et al.
2021/0335861 A1* 10/2021 Cheng .................. H10F 39/807

(Continued)

FOREIGN PATENT DOCUMENTS

CN 108878397 A 11/2018
CN 110050348 A 7/2019
TW 202238979 A 10/2022

OTHER PUBLICATIONS

Notice Of Allowance issued May 22, 2026 in Taiwanese Application No. 113104600.

*Primary Examiner* — William B Partridge
*Assistant Examiner* — Chevy J Boegel
(74) *Attorney, Agent, or Firm* — Harness, Dickey & Pierce, P.L.C.

(57) ABSTRACT

An image sensor includes a substrate having a pixel separation recess, a plurality of photo-sensing elements arranged in the substrate, and a pixel separation region filling the pixel separation recess, wherein the pixel separation region includes a first insulating layer covering an inner wall of the pixel separation recess, a first conductive layer covering at least a portion of a side surface of the first insulating layer within the pixel separation recess, a second insulating layer covering a portion of a side surface of the first conductive layer within an inner space defined by the first conductive layer, and a second conductive layer filling all of a space not filled by the second insulating layer from among the inner space defined by the first conductive layer, and connected to and in contact with the first conductive layer.

20 Claims, 55 Drawing Sheets

(58) Field of Classification Search
CPC .... H04N 25/63; H04N 25/135; H04N 25/703; H04N 23/15; H04N 23/16
See application file for complete search history.

(56) References Cited

U.S. PATENT DOCUMENTS

| | | | | |
|---|---|---|---|---|
| 2022/0013566 | A1 | 1/2022 | Kim et al. | |
| 2022/0037381 | A1 | 2/2022 | Xia et al. | |
| 2022/0130888 | A1 | 4/2022 | Chou et al. | |
| 2022/0149090 | A1 | 5/2022 | Otake et al. | |
| 2022/0149101 | A1 | 5/2022 | Lee et al. | |
| 2022/0230909 | A1 | 7/2022 | Li et al. | |
| 2022/0367535 | A1* | 11/2022 | Cheng | H10F 39/807 |

* cited by examiner 1
200
232
242
234
236
DTI(DTIN)
STR
DTR
222
224
226
STI
550
540
530
520
510
210
200
PX
PX
PD
PD
X1
420
WFL
A
A'
200B
WFO
LV1
DTR
DTI
LV2
ST1
272
274
200F
284
282
432
434
410
270
280
430

1
PX
PX
PD
PD
X2
X2
420
B
B'
WFL
550
540
530
520
510
210
200
200B
WFO
LV1
DTR
DTI
LV2
272
274
270
200F
284
282
280
432
434
430
410
200
STR DTR 244C 244S
222 224 226
STI
236 244 234 242 232
DTI(DTIW)

1
200
PX
PX
PX
PX
PX
PX
DTI
244(244S) 234 242 232
DTR
DTIW DTIN
DTI
LV1

1000a
PD
PX
A'
A
W1
W2
B
B'
DTI
DTIN DTIW
DTR
SUB 1a
200
PX
DTI
244(244C) 234 242 232
DTR
DTIW DTIN
DTI
LV2

2
200
PX
PX
PX
PX
PX
PX
DTIa
244a(244S) 234 242 232
DTR
DTIW DTIN
DTIa
LV1

2a
200
PX
232
DTIa
244a(244C)
DTR
DTIW DTIN
LV2

3
PX
PX
PD
PD
420
200B
WFO
LV1
DTR
DTI
LV2
272
274
200F
284
282
432
434
410
270
280
430
B
B'
WFL
550
540
530
520
510
210
200
STR
DTR
244C
244S
200
222
224
226
STI
236
244b
234
242
232
DTIb(DTIW)

4
200
232
242
234
236
DTIc(DTIN)
STR
DTR
226
224
222
STI
550
540
530
520
510
210
200
PX
PX
PD
PD
X3
420
WFL
A'
A
200B
WFO
LV1
DTR
DTI
LV2
ST1
272
274
200F
284
282
432
434
410
270
280
430

4
PX
PX
X4
PD
PD
420
550
540
530
520
510
210
200
200B
WFO
LV1
DTR
DTI
LV2
ST1
270
272
274
200F
280
284
282
430
432
434
410
B
B'
WFL
STR
DTR
200
222
224
226
STI
236
244c
234
242
232
DTIc(DTIW)

4a
200
PX
DTIc
246 244c 234 242 232
DTR
DTIW DTIN
DTIc
LV2

5
PX
PX
550
540
530
520
510
210
200
PD
PD
420
WFL
A'
A
200B
WFO
DTR
DTId
ST1
272
274
270
200F
284
282
280
432
434
430
410
STR
DTR
200
232
242
234
244d
236
DTId(DTIN)
226
224
222
STI

6
PX
PX
PD
PD
420
410
200B
WFO
DTR
DTIe
STI
272
274
270
200F
284
282
280
432
434
430
A
A'
WFL
550
540
530
520
510
210
200
STR
DTR
222
224
226
STI
236
244e
246a
234
242
232
DTIe(DTIN)

6
PX
PX
550
540
530
520
510
210
200
PD
PD
420
200B
WFO
DTR
DTIf
STI
272
274
270
200F
284
282
280
432
434
430
410
A
A'
WFL
200
STR
DTR
222
224
226
STI
236
244f
246a
234
242
232
DTIf(DTIN)

IMAGE SENSOR INCLUDING A PIXEL SEPARATION REGION HAVING A REDUCED DARK LEVEL

CROSS-REFERENCE TO RELATED APPLICATION

This application is based on and claims priority under 35 U.S.C. § 119 to Korean Patent Application No. 10-2023-0018981, filed on Feb. 13, 2023, in the Korean Intellectual Property Office, the entire contents of which are incorporated herein by reference.

BACKGROUND

The inventive concepts relate to an image sensor, and more particularly, to an image sensor including a plurality of unit pixels separated by a pixel separation region.

The image sensor is configured by arranging a plurality of unit pixels in a two-dimensional array. In general, each of the plurality of unit pixels may include a photo-sensing element, such as a photodiode, and a plurality of pixel transistors. A pixel separation region is arranged between the photo-sensing elements included in the plurality of unit pixels.

When electrons are generated due to heat emission or defects of the image sensor at an interface between the photo-sensing elements and the pixel separation region, a dark level, which is a noise due to dark current, may increase and performance of the image sensor may be degraded or otherwise reduced. Accordingly, research has been conducted on a pixel separation region capable of improving the performance of an image sensor by reducing a dark level.

SUMMARY

According to some example embodiments, the inventive concepts may provide an image sensor with reduced noise and/or enhanced sensitivity.

Some example embodiments according to the inventive concepts provide an image sensor including a substrate having a first surface and a second surface opposite to each other, and having a pixel separation recess extending from the first surface to the second surface, a plurality of photo-sensing elements in the substrate, and a pixel separation region filling the pixel separation recess, and surrounding at least a portion of each of the plurality of photo-sensing elements, the pixel separation region having a narrow region between sides of adjacent photo-sensing elements facing each other from among the plurality of photo-sensing elements, and a wide region between edges of the adjacent photo-sensing elements facing each other, and the pixel separation region including a first insulating layer covering an inner wall of the pixel separation recess, a first conductive layer covering at least a portion of a side surface of the first insulating layer within the pixel separation recess, a second insulating layer covering a portion of a side surface of the first conductive layer within an inner space defined by the first conductive layer, and a second conductive layer filling all of a space not filled by the second insulating layer from among the inner space defined by the first conductive layer such that the second conductive layer is connected to and in contact with the first conductive layer.

Some example embodiments according to the inventive concepts provide an image sensor including a substrate having a first surface and a second surface opposite to each other, and having a pixel separation recess extending from the first surface to the second surface, a plurality of photo-sensing elements in the substrate, and a pixel separation region filling the pixel separation recess, and surrounding at least a portion of each of the plurality of photo-sensing elements, the pixel separation region having a narrow region between sides of adjacent photo-sensing elements facing each other from among the plurality of photo-sensing elements, and a wide region between edges of the adjacent photo-sensing elements facing each other, and the pixel separation region including a plurality of first insulating layers covering an inner wall of the pixel separation recess, and spaced apart from each other and surrounding at least one of the plurality of photo-sensing elements, a plurality of first conductive layers spaced apart from each other and covering at least a portion of a side surface of each of the plurality of first insulating layers within the pixel separation recess, a second insulating layer covering a portion of side surfaces of the plurality of first conductive layers within an inner space defined by the plurality of first conductive layers within the pixel separation recess, and a second conductive layer covering the plurality of first conductive layers and the second insulating layers within the inner space defined by the plurality of first conductive layers within the pixel separation recess, and the second conductive layer including a connection portion adjacent to the first surface of the substrate and electrically connecting at least some first conductive layers spaced apart from each other from among the plurality of first conductive layers, and an extension portion extending in a vertical direction toward the second surface of the substrate from the connection portion and spaced apart from the plurality of first conductive layers with the second insulating layer therebetween.

Some example embodiments according to the inventive concepts provide an image sensor including a substrate having a first surface and a second surface opposite to each other, and having a pixel separation recess extending the first surface to the second surface, a plurality of photo-sensing elements in the substrate, and a pixel separation region filling the pixel separation recess, and surrounding at least a portion of each of the plurality of photo-sensing elements, the pixel separation region having a narrow region between sides of adjacent photo-sensing elements facing each other from among the plurality of photo-sensing elements, and a wide region between edges of the adjacent photo-sensing elements facing each other, and the pixel separation region includes, a plurality of first insulating layers covering an inner wall of the pixel separation recess, and spaced apart from each other and surrounding at least one of the plurality of photo-sensing elements, a plurality of first conductive layers spaced apart from each other and covering at least a portion of a side surface of each of the plurality of first insulating layers within the pixel separation recess, a second insulating layers covering a side surface of the plurality of first conductive layers within an inner space defined by the plurality of first conductive layers within the pixel separation recess, and a second conductive layer covering the plurality of first conductive layer and the second insulating layer within the inner space defined by the plurality of first conductive layers within the pixel separation recess, and the second conductive layer is in the wide region of the pixel separation region, is not in the narrow region of the pixel separation region, and the second conductive layer including a connection portion adjacent to the first surface of the substrate and electrically connecting at least some first conductive layers spaced apart from each other from among the plurality of first conductive layers, and an extension portion extending in a vertical direction from the connection portion to the second surface of the substrate and spaced apart from the plurality of first conductive layers with the second insulating layer therebetween.

BRIEF DESCRIPTION OF THE DRAWINGS

Some example embodiments according to the inventive concepts will be more clearly understood from the following detailed description taken in conjunction with the accompanying drawings in which.

DETAILED DESCRIPTION

Figure 1:
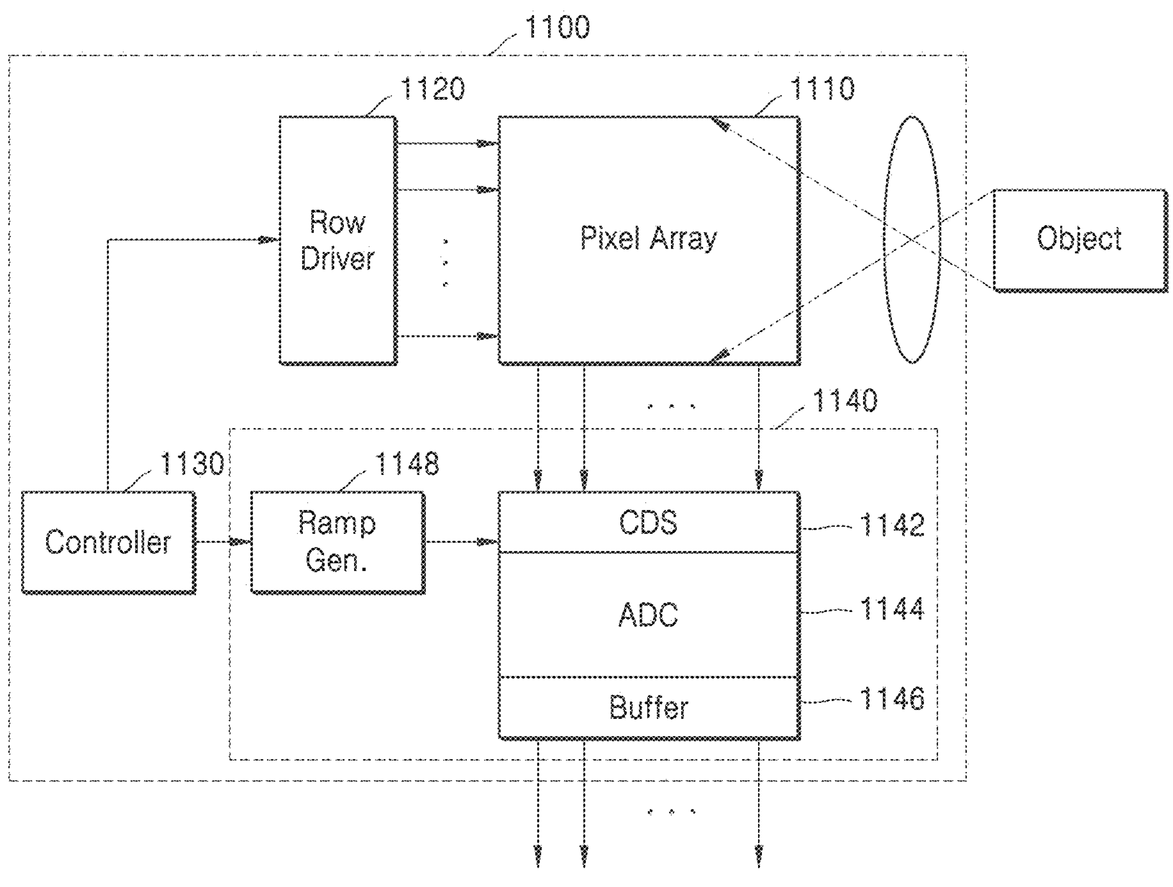
FIG. 1 is a block diagram of a configuration of an image sensor according to some example embodiments.

Hereinafter, some example embodiments according to the inventive concepts will be described in detail with reference to the accompanying drawings. However, the inventive concepts are not limited thereto, and the inventive concepts may be embodied in various other forms. The following example embodiments are simply provided to sufficiently convey the scope of the inventive concepts to those skilled in the art.

Accordingly, the drawings and description are to be regarded as illustrative in nature and not restrictive. For example, unless expressly indicated otherwise, elements shown in the drawings may have exaggerated sizes and/or may be simplified for clarity and/or convenience of explanation.

Likewise, although elements throughout the following description may be referred to as first, second or the like, as used herein, these terms are used to distinguish one element from another element and should not be interpreted to limit the described example embodiments to any specific order and/or to any specific number of elements, unless expressly indicated otherwise.

Moreover, as used herein, the singular forms "a" and "an" are intended to include the plural forms as well, unless expressly indicated otherwise. Likewise, the terms "the" and similar instruction terms may correspond to both singular and plural. Similarly, as used herein, what is referred to as "above" or "on" may include not only directly in a contact manner but also in a non-contact manner.

Additionally, elements may be listed as comprising, including, made of, etc., of one or various materials throughout the following description, but the inventive concepts should not be interpreted as limited to the disclosed materials unless expressly indicated otherwise. For example, one of ordinary skill in the art will appreciate that materials with similar functional properties to those described herein may be used in addition to, or in lieu of, specific materials listed herein.

FIG. 1 is a block diagram of a configuration of an image sensor 1100 according to some example embodiments.

Referring to FIG. 1, the image sensor 1100 may include a pixel array 1110, a controller 1130, a row driver 1120, and a pixel signal processing unit 1140. The image sensor 1100 may include at least one of image sensors 1, 1*a*, 2, 2*a*, 3, 3*a*, 4, 4*a*, 5, 6, 1000, and/or 100*a* described with reference to FIGS. 4 to 21 but is not limited thereto.

The pixel array 1110 may include a plurality of unit pixels in a two-dimensional array, and each of the unit pixels may include a photoelectric conversion layer. The photoelectric conversion layer may absorb light and generate charges, and an electrical signal (output voltage) according to the generated charges may be provided to the pixel signal processing unit 1140 through a vertical signal line. The unit pixels included in the pixel array 1110 may provide an output voltage one at a time for each row, and accordingly, unit pixels belonging to each row of the pixel array 1110 may be simultaneously activated by a select signal output from the row driver 1120. Unit pixels belonging to a selected row may provide an output voltage according to absorbed light to an output line of a corresponding column.

The controller 1130 may allow the pixel array 1110 to absorb light and accumulate charges and/or temporarily store accumulated charges, and may control the row driver 1120 to output an electrical signal according to the stored charges to the outside of the pixel array 1110. In addition, the controller 1130 may control the pixel signal processing unit 1140 to measure an output voltage provided by the pixel array 1110.

The controller 1130 may include processing circuitry such as hardware including logic circuits; a hardware/software combination such as a processor executing software; or a combination thereof. For example, the processing circuitry may include, but is not limited to, a central processing unit (CPU), an arithmetic logic unit (ALU), a digital signal processor, a microcomputer, a field programmable gate array (FPGA), a programmable logic unit, a microprocessor, or application-specific integrated circuit (ASIC).

The pixel signal processing unit 1140 may include a correlated-double sampler (CDS) 1142, an analog-to-digital converter (ADC) 1144, and a buffer 1146. The CDS 1142 may sample and hold the output voltage provided from the pixel array 1110. The CDS 1142 may double sample a particular noise level and a voltage level according to the generated output voltage, and output a voltage level corresponding to the difference. In addition, the CDS 1142 may receive an input of a ramp signal generated by a ramp signal generator 1148, compare the received ramp signals with each other, and output the comparison result. The ADC 1144 may convert an analog signal corresponding to a voltage level received from the CDS 1142, to a digital signal. The buffer 1146 may latch a digital signal, and the latched signal may be sequentially output to the outside of the image sensor 1100 and transmitted to an image processor (not shown).

Figure 2:
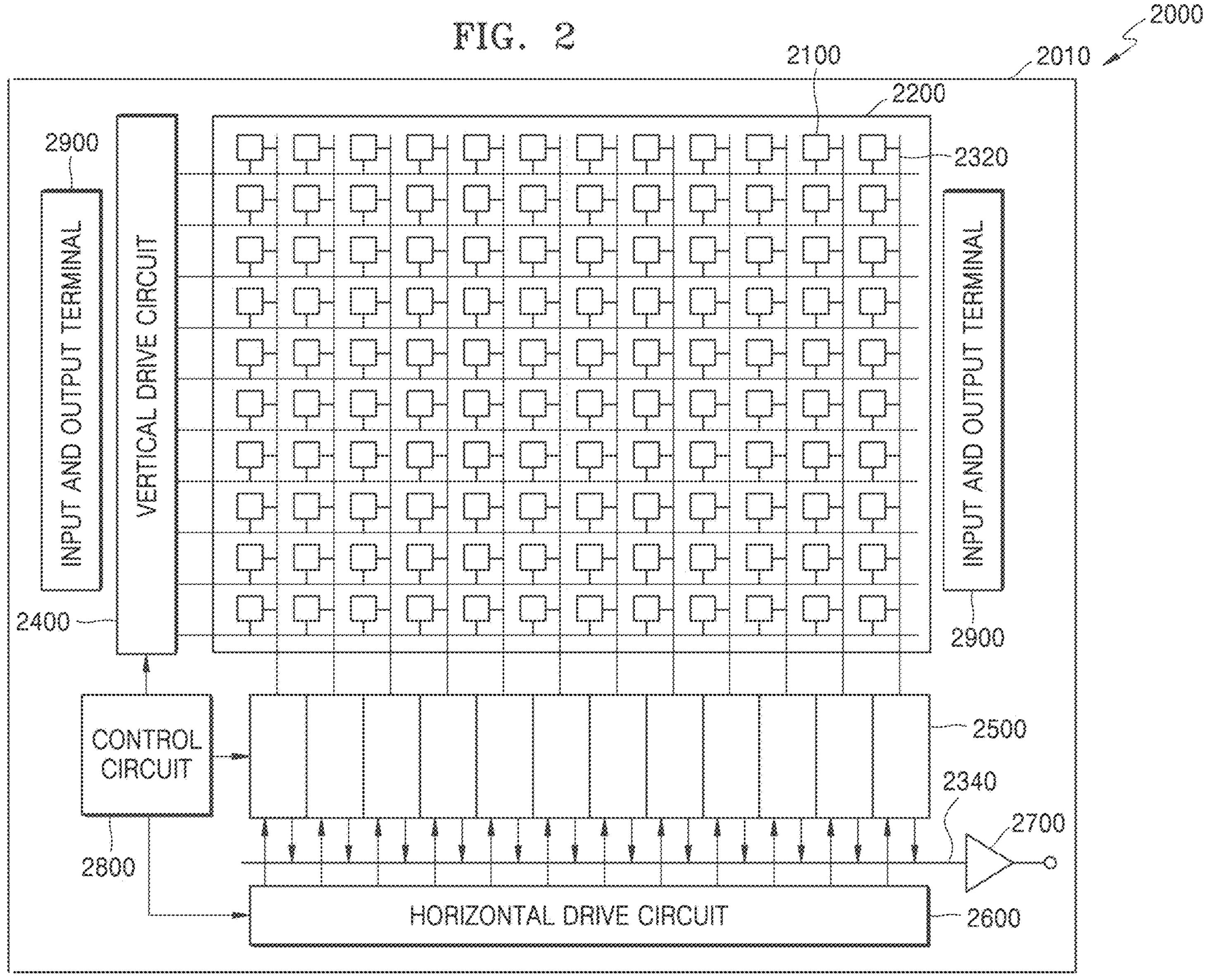
FIG. 2 is a block diagram illustrating a configuration of an image sensor according to some example embodiments.

FIG. 2 is a block diagram of a configuration of an image sensor 2000 according to some example embodiments.

Referring to FIG. 2, the image sensor 2000 may include a pixel unit 2200 and a peripheral circuit unit. The pixel unit 2200 may be formed on a substrate 2010 by regularly arranging the plurality of unit pixels 2100 including a photo-sensing conversion layer in a two-dimensional array structure. The image sensor 2000 may include at least one of the image sensors 1, 1*a*, 2, 2*a*, 3, 3*a*, 4, 4*a*, 5, 6, 1000, and/or 100*a* described with reference to FIGS. 4 to 21 but is not limited thereto.

The peripheral circuit unit may be arranged around the pixel unit 2200, and may include a vertical drive circuit 2400, a column signal processing circuit 2500, a horizontal drive circuit 2600, an output circuit 2700, a control circuit 2800, and/or the like.

The control circuit 2800 may control the vertical drive circuit 2400, the column signal processing circuit 2500, the horizontal drive circuit 2600, and/or the like. For example, the control circuit 2800 may generate a clock signal or control signals, which serve as a reference for operations of the vertical drive circuit 2400, the column signal processing circuit 2500, and the horizontal drive circuit 2600, and/or the like, based on a vertical synchronization signal, a horizontal synchronization signal, and/or a master clock. In addition, the control circuit 2800 may input the clock signal or the control signals to the vertical drive circuit 2400, the column signal processing circuit 2500, and the horizontal drive circuit 2600.

The control circuit 2800 may include processing circuitry such as hardware including logic circuits; a hardware/software combination such as a processor executing software; or a combination thereof. For example, the processing circuitry may include, but is not limited to, a central processing unit (CPU), an arithmetic logic unit (ALU), a digital signal processor, a microcomputer, a field programmable gate array (FPGA), a programmable logic unit, a microprocessor, or application-specific integrated circuit (ASIC).

The vertical drive circuit 2400 may include, for example, a shift register, and may select a pixel drive line, supply pulses for driving unit pixels to the selected pixel drive line, and drive the unit pixels in units of rows. For example, the vertical drive circuit 2400 may sequentially selectively scan pulses in a vertical direction in units of rows to each of the unit pixels of the pixel unit 2200. In addition, a pixel signal according to charges generated in a photo-sensing conversion layer of each of the unit pixels 2100 may be supplied to the column signal processing circuit 2500 through a vertical signal line 2320.

The column signal processing circuit 2500 may be arranged in each column of the unit pixels 2100 and may perform signal processing, such as noise removal, for each unit pixel column on a signal output from the unit pixels 2100 in one row. For example, the column signal processing circuit 2500 may perform signal processing, such as CDS, signal amplification, and/or AD conversion, for removing noise inherent in the unit pixel 2100. A horizontal select switch (not shown) may be installed at an output terminal of the column signal processing circuit 2500.

The horizontal drive circuit 2600 may include, for example, a shift register, and may sequentially output horizontal scan pulses to sequentially select each of the column signal processing circuit 2500 and output a pixel signal of each of the column signal processing circuit 2500 to a horizontal signal line 2340.

The output circuit 2700 may perform signal processing on signals sequentially supplied from the column signal processing circuit 2500 through the horizontal signal line 2340, and output the signals. For example, the output circuit 2700 may perform buffering, or may perform black level adjustment, thermal unevenness correction, various digital signal processing, and/or the like. Meanwhile, an input/output terminal may exchange signals with the outside.

Figure 3A:
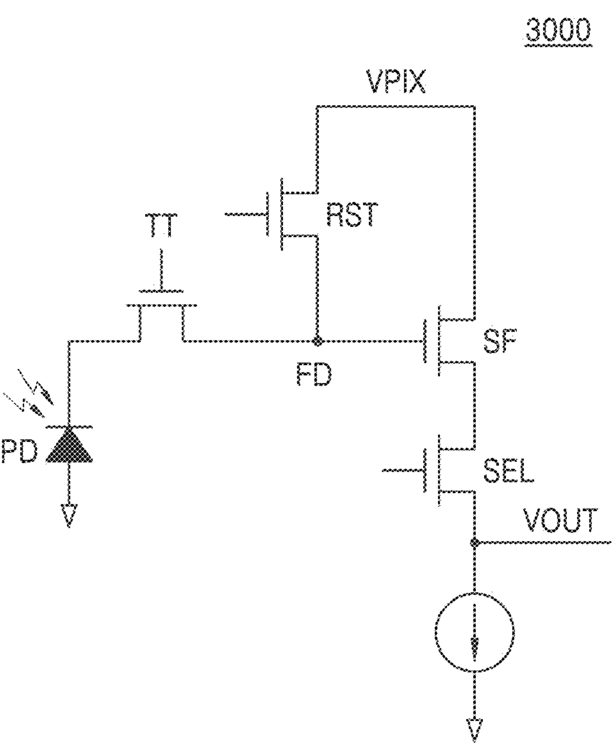
FIGS. 3A and 3B are readout circuit diagrams of an image sensor according to some example embodiments.
Figure 3B:
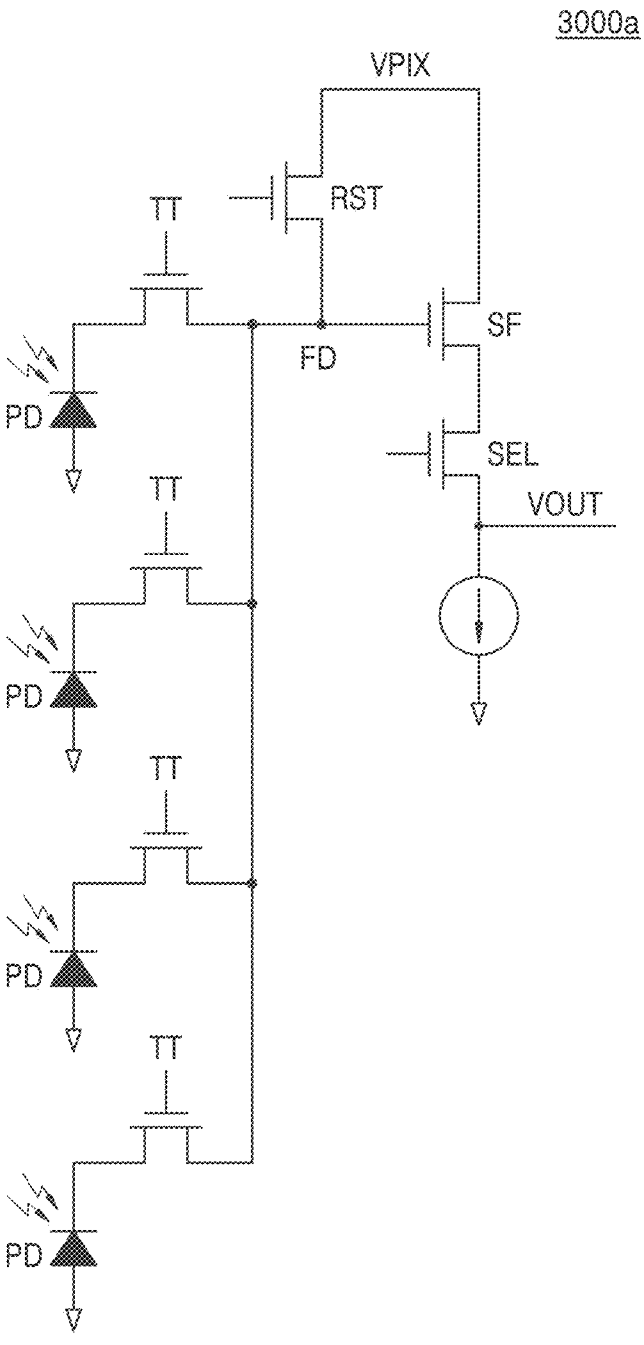

FIGS. 3A and 3B are readout circuit diagrams of image sensors 3000 and 3000*a* according to some example embodiments.

Referring to FIG. 3A, the image sensor 3000 may include a photo-sensing element PD, a transmit transistor TT, a floating diffusion region FD, a reset transistor RST, a source follower transistor SF, and a select transistor SEL. The photo-sensing element PD and the transmit transistor TT may be included in a unit pixel. The image sensor 3000 may include at least one of the image sensors 1, 1*a*, 2, 2*a*, 3, 3*a*, 4, 4*a*, 5, 6, 1000, and/or 1000*a* described with reference to FIGS. 4 to 21 but is not limited thereto.

The transmit transistor TT, the reset transistor RST, the source follower transistor SF, and the select transistor SEL may have a transmit gate, a reset gate, a source follower gate, and/or a select gate, respectively. In some embodiments, the transmit gate may be a vertical gate, and each of the reset gate, the source follower gate, and/or the select gate may be a planar gate. The transmit gate may be arranged between the photo-sensing element PD and the floating diffusion region FD and may transmit charges generated in the photo-sensing element PD to the floating diffusion region FD.

The transmit transistor TT may include the transmit gate, a source region, and/or a drain region, the source region and the drain region may be respectively connected to the floating diffusion region FD and the photo-sensing element PD. The reset transistor RST may include the reset gate, a source region connected to the floating diffusion region FD, and/or a drain region to which a power voltage VPIX is connected. The source follower transistor SF may include the source follower gate connected to the floating diffusion region FD, a source region connected to a source region of the select transistor SEL, and/or a drain region to which the power voltage VPIX is connected. The select transistor SEL may include the select gate, the source region connected to the source region of the source follower transistor SF, and a drain region to which an output voltage VOUT is connected.

Referring to FIG. 3B, according to some example embodiments, the image sensor 3000*a* may include a plurality of photo-sensing elements PD, a plurality of transmit transistors TT, a floating diffusion region FD, a reset transistor RST, a source follower transistor SF, and/or a select transistor SEL. The photo-sensing element PD and the transmit transistor TT may be included in a unit pixel. The image sensor 3000a may include the image sensors 1, 1a, 2, 2a, 3, 3a, 4, 4a, 5, 6, 1000, and/or 1000a described with reference to FIGS. 4 to 21 but is not limited thereto.

In FIG. 3B, four unit pixels including four photo-sensing elements PD may constitute a shared pixel, in which, one floating diffusion region FD, one reset transistor RST, one source follower transistor SF, and one select transistor SEL are shared through four transmit transistors TT. However, the inventive concepts are not limited thereto. For example, in some example embodiments, two unit pixels including two photo-sensing elements PD may constitute a shared pixel, in which one floating diffusion region FD, one reset transistor RST, one source follower transistor SF, and one select transistor SEL are shared through two transmit transistors TT.

Figure 4:
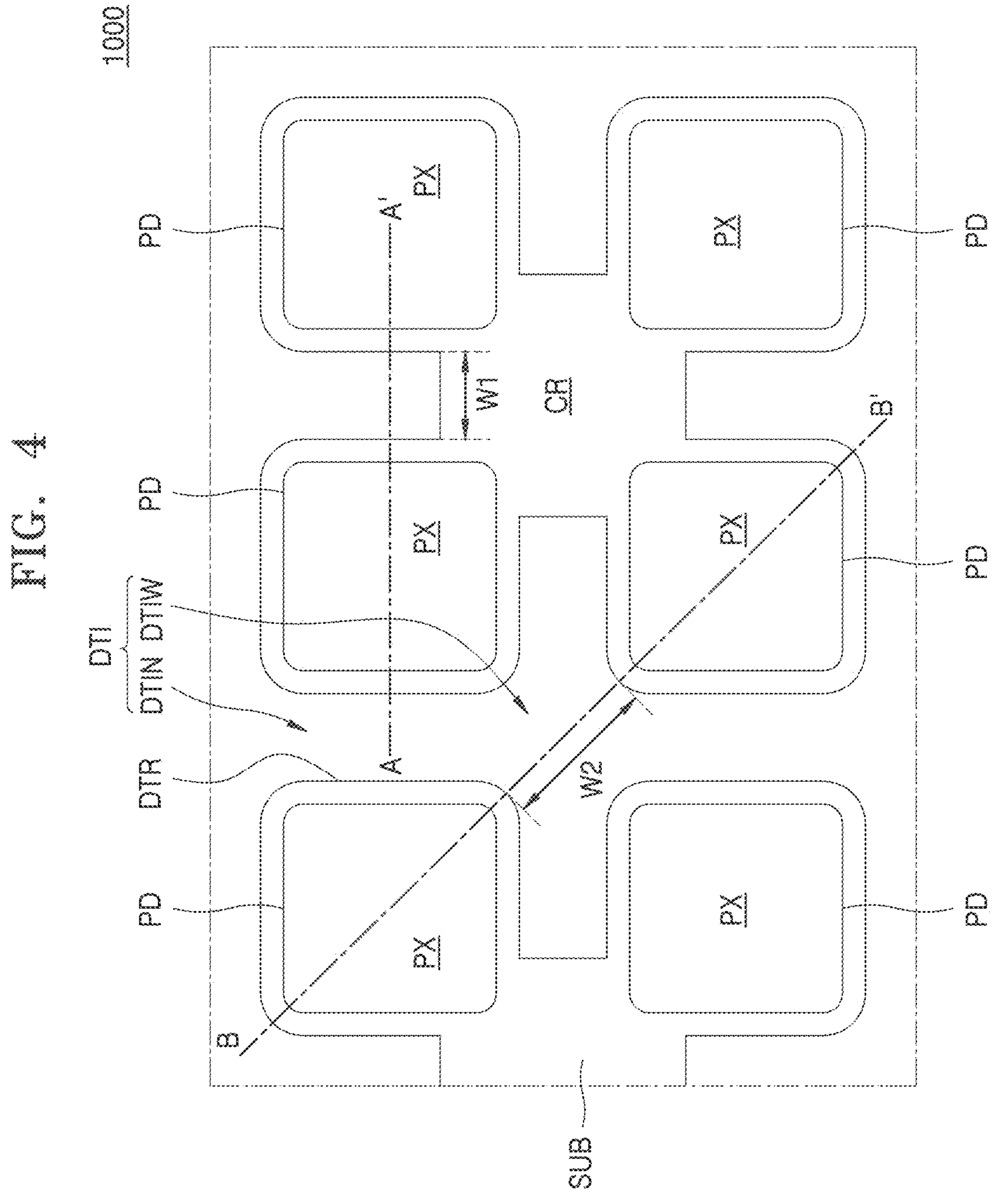
FIG. 4 is a plan layout illustrating unit pixels, which include photo-sensing elements, and a pixel separation region of an image sensor according to some example embodiments.

FIG. 4 is a plan layout illustrating unit pixels PX, which include photo-sensing elements PD, and a pixel separation region DTI of an image sensor 1000 according to some example embodiments.

Referring to FIG. 4, the image sensor 1000 may include a substrate SUB, the plurality of unit pixels PX, and the pixel separation region DTI, wherein the substrate SUB has a pixel separation recess, and the pixel separation region DTI fills the pixel separation recess DTR. Each of the plurality of unit pixels PX may include the photo-sensing element PD. The pixel separation region DTI may be arranged between the plurality of photo-sensing element PD.

In some example embodiments, in a plan view, the pixel separation region DTI may not completely surround each of the plurality of photo-sensing elements PD, but may include only a portion of each of the plurality of photo-sensing elements PD. For example, when each of the plurality of photo-sensing elements PD has an approximately quadrangular shape in a plan view, in a plan view, the pixel separation region DTI may surround all of three edges of each of the plurality of photo-sensing elements PD and two sides connecting the three edges to each other. The pixel separation region DTI may also not surround one edge and a portion of other two sides connected to the edge, but may surround only the remaining portion of the other two sides.

In some example embodiments, in a plan view, the pixel separation region DTI may completely surround four photo-sensing elements PD from among the plurality of photo-sensing elements PD. The substrate SUB may have a connection substrate region CR between the four photo-sensing elements PD completely surrounded by the pixel separation region DTI in a plan view. For example, when each of the plurality of photo-sensing elements PD has an approximately quadrangular shape in a plan view, the connection substrate region CR may be connected to one edge of each of the four photo-sensing elements PD that is not surrounded by the pixel separation region DTI in the plan view, and a portion of other two sides.

For example, each of the four photo-sensing elements PD completely surrounded by the pixel separation region DTI in a plan view may correspond to one color from among red (R), blue (B), and green (G), but is not limited thereto. For example, each of the four photo-sensing elements PD completely surrounded by the pixel separation region DTI in a plan view may correspond to one color from among cyan (C), yellow (Y), and magenta (M). Although described with reference to specific groups of colors, one of ordinary skill in the art will appreciate that each of the four photo-sensing elements PD completely surrounded by the pixel separation region DTI in a plan view may correspond to different colors than those listed above and/or different combinations than those listed above.

The pixel separation region DTI may include a narrow region DTIN having a first horizontal width W1 that is relatively narrow, and a wide region DTIW having a second horizontal width W2 that is relatively wide. The narrow region DTIN may be a portion of the pixel separation region DTI arranged between the photo-sensing elements PD adjacent to each other in a width direction of the photo-sensing element PD, and the wide region DTIW may be a portion of the pixel separation region DTI arranged between the photo-sensing elements PD adjacent to each other in a diagonal direction of the photo-sensing element PD. For example, the narrow region DTIN may be a portion of the pixel separation region DTI arranged between sides facing each other, and the wide region DTIW may be a portion of the pixel separation region DTI arranged between edges facing each other of the photo-sensing elements PD adjacent to each other.

Figure 5A:
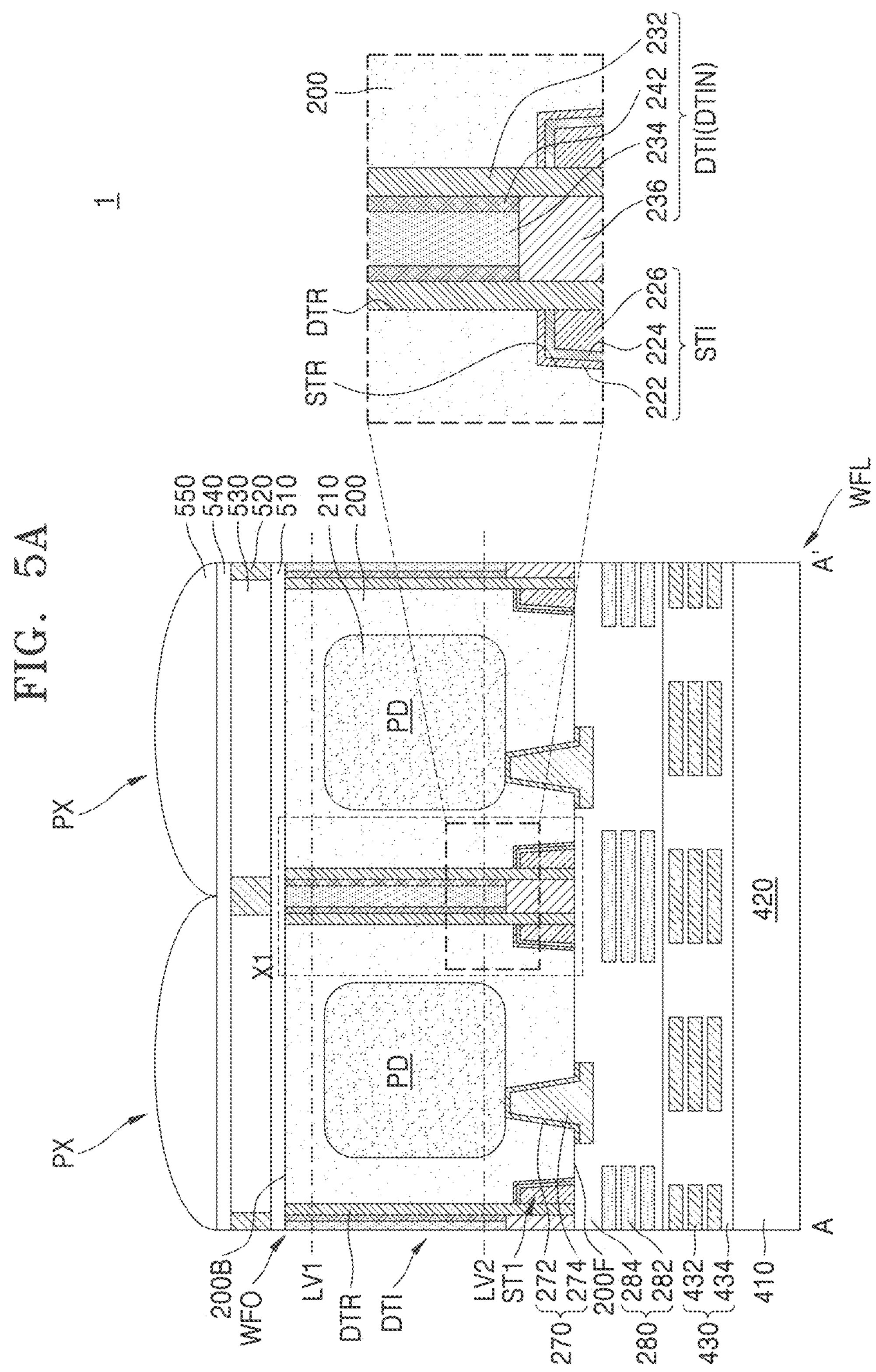
FIGS. 5A and 5B are vertical cross-sectional views of an image sensor according to some example embodiments.
Figure 5B:
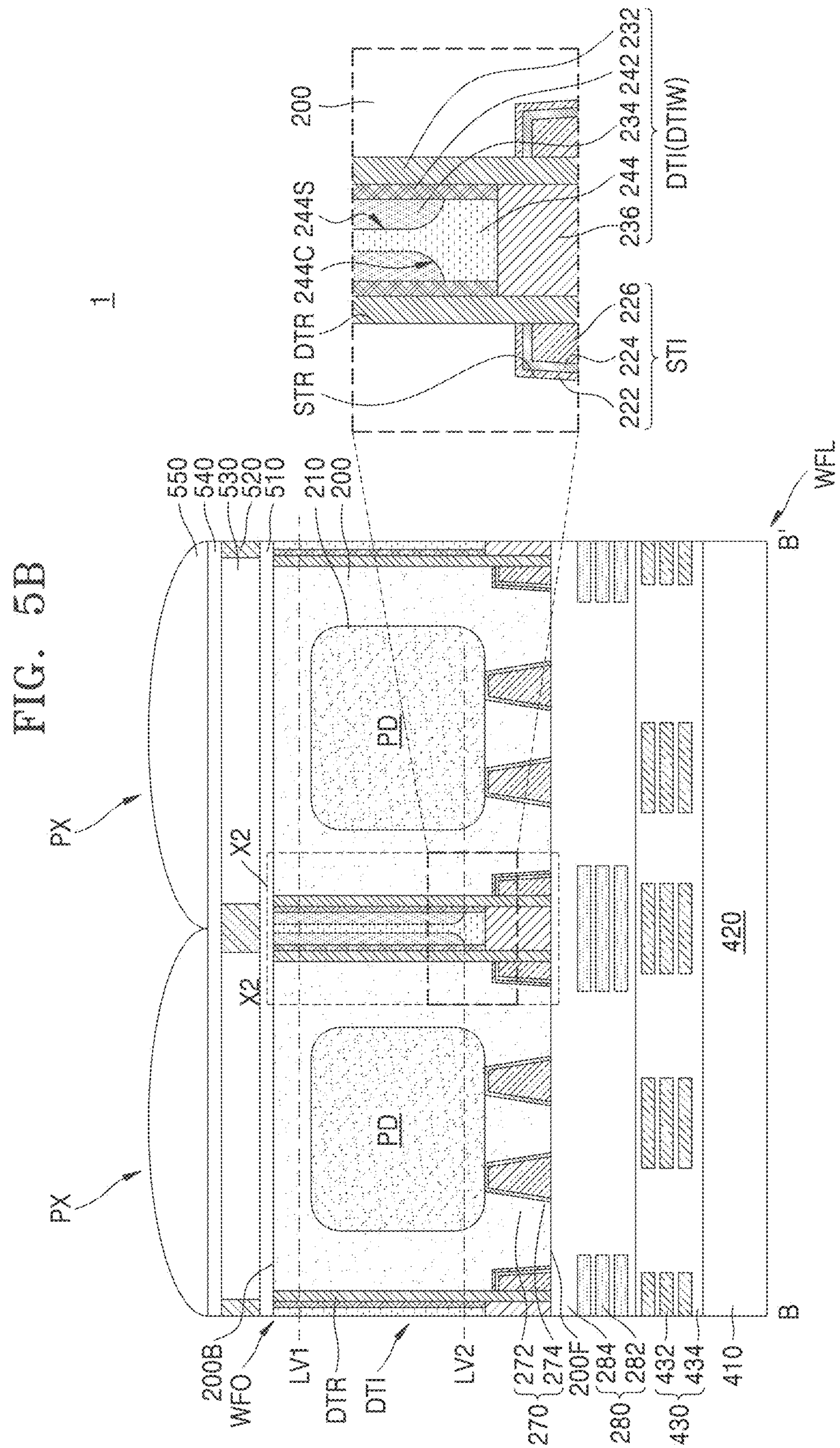
Figure 6A:
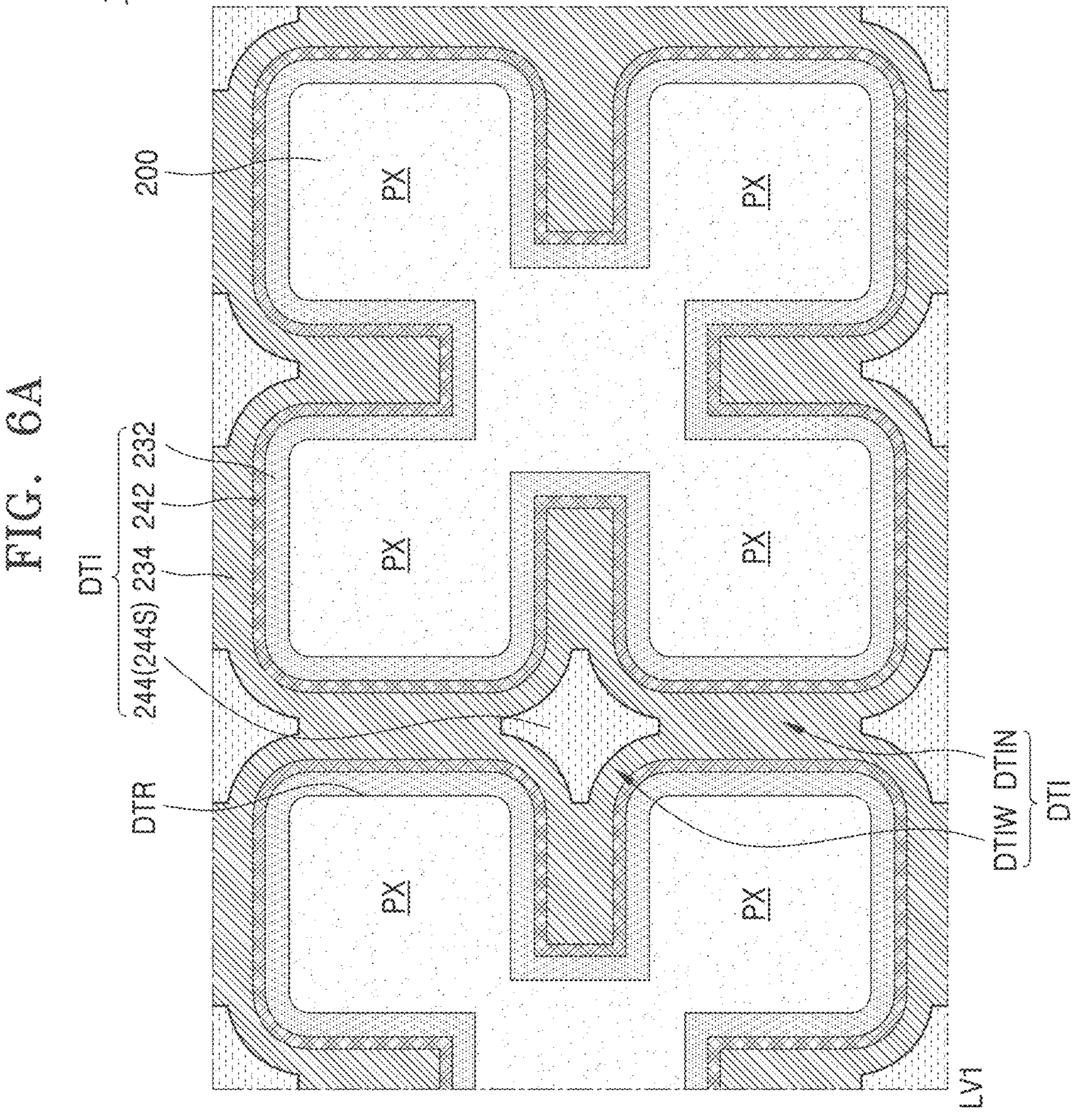
FIGS. 6A and 6B are horizontal cross-sectional views of the same.
Figure 6B:
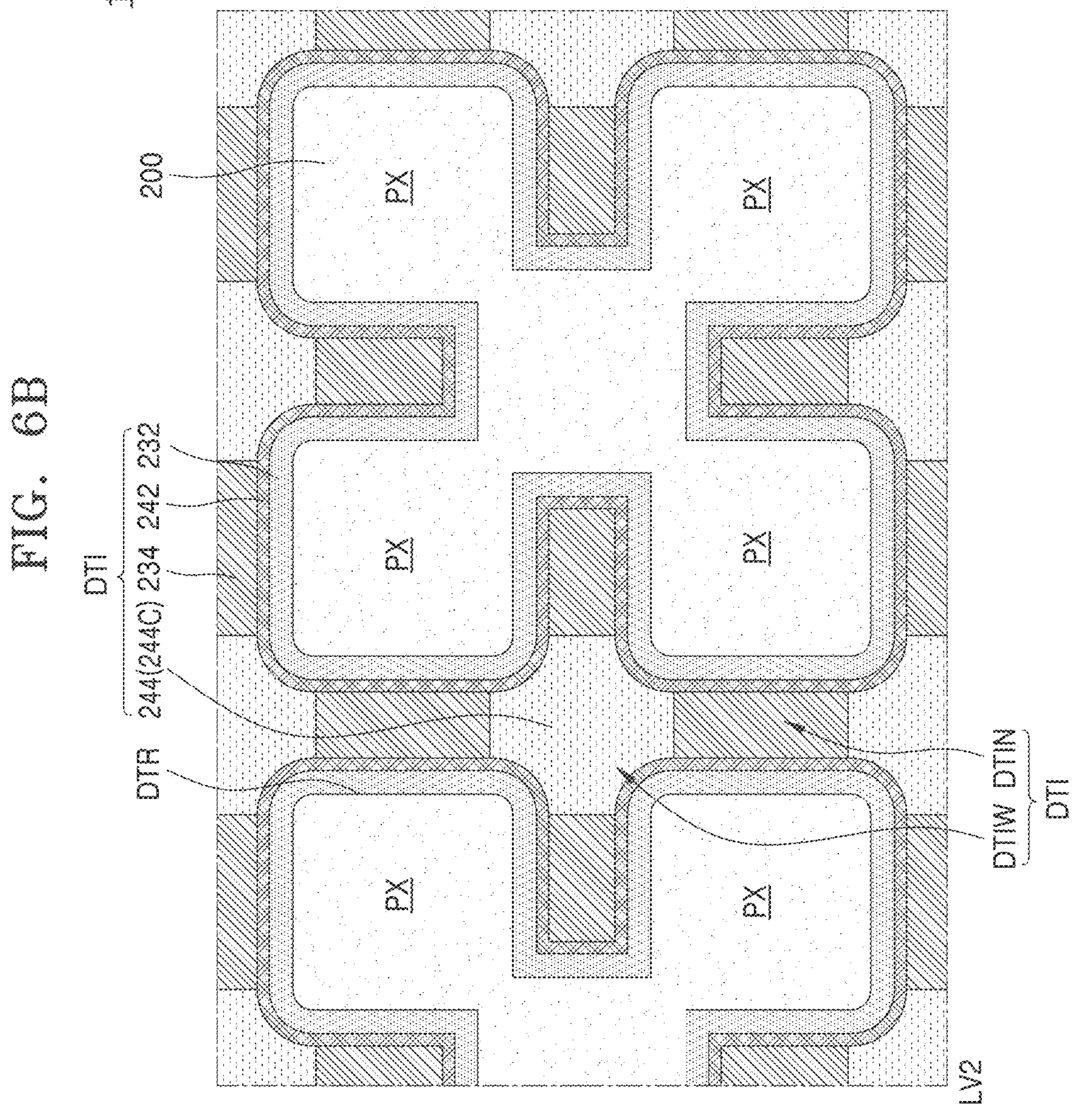

FIGS. 5A and 5B are vertical cross-sectional views of an image sensor 1 according to some example embodiments, and FIGS. 6A and 6B are horizontal cross-sectional views of the same. In detail, FIG. 5A is a vertical cross-sectional view of a portion taken along line A-A' in FIG. 4, FIG. 5B is a vertical cross-sectional view of a portion taken along line B-B' in FIG. 4, FIG. 6A is a horizontal cross-sectional view taken along a first horizontal level LV1 of FIGS. 5A and 5B, and FIG. 6B is a horizontal cross-sectional view taken along a second horizontal level LV2 in FIGS. 5A and 5B.

Referring to FIGS. 5A, 5B, 6A, and 6B together, the image sensor 1 may include an optical element substrate WFO having a plurality of unit pixels PX including a plurality of photo-sensing elements PD 210, a plurality of microlenses 550 disposed on the optical element substrate WFO, and a plurality of color filter layers 530 located between the optical element substrate WFO and the plurality of microlenses 550.

The optical element substrate WFO may include a first substrate 200, which has a first surface 200F and a second surface 200B opposite to each other, and a first interconnection structure 280. The first substrate 200 may include a semiconductor substrate. For example, the first substrate 200 may include a Group IV semiconductor material, a Group III-V semiconductor material, or a Group II-VI semiconductor material. For example, the Group IV semiconductor material may include silicon (Si), germanium (Ge), and/or silicon germanium (SiGe). For example, the Group III-V semiconductor material may include gallium arsenide (GaAs), indium phosphide (InP), gallium phosphide (GaP), indium arsenide (InAs), indium antimonide (InSb), and/or indium gallium arsenide (InGaAs). For example, the Group II-VI semiconductor material may include zinc telluride (ZnTe) and/or cadmium sulfide (CdS). In some example embodiments, the first substrate 200 may include a P-type silicon substrate. In some example embodiments, the first substrate 200 may include a P-type bulk substrate and a P-type or N-type epitaxial layer grown thereon. In some example embodiments, the first substrate 200 may include an N-type bulk substrate and a P-type or N-type epitaxial layer grown on the N-type bulk substrate. The first substrate 200 may be the substrate SUB shown in FIG. 4.

The plurality of unit pixels PX may be arranged in a matrix form in a plan view, within the optical element substrate WFO. The plurality of unit pixels PX may include a plurality of photo-sensing elements PD on the first substrate 200. The first substrate 200 may be doped with impurities of a first conductivity type, and each of the plurality of photo-sensing elements PD 210 may be doped with impurities of a second conductivity type that is different from the first conductivity type. In some embodiments, the first conductivity type may be a p type, and the second conductivity type may be an n type. For example, the first conductivity type-impurities may include one or more of boron (B), aluminum (Al), gallium (Ga), indium (In), thallium (Tl), zinc (Zn), cadmium (Cd), and/or mercury (Hg) and the second conductivity type-impurities may include one or more of nitride (N), phosphorus (P), arsenic (As), antimony (Sb), Bismuth (Bi), Sulfur (S), selenium (Se), tellurium (Te), and/or polonium (Po).

An element separation region STI and the pixel separation region DTI may be arranged in the first substrate 200. A plurality of unit pixels PX may be defined by the pixel separation region DTI in the first substrate 200 and the pixel separation region DTI may surround at least a portion of the each of the plurality of photo-sensing elements PD in a plan view. The pixel separation region DTI may be arranged between one photo-sensing element PD from among the plurality of photo-sensing elements PD and another photo-sensing element PD adjacent thereto. The pixel separation region DTI is arranged between each of the plurality of photo-sensing elements PD arranged in a matrix form in a plan view, and may have a grid or mesh shape in a plan view.

In the first substrate 200, an active region and a floating diffusion region may be defined by the element separation region STI. In some example embodiments, the element separation region STI may include a triple layer including a combination of at least three types of insulating films including a first layer 222, a second layer 224, and a third layer 226. For example, the first layer 222 may include an oxide, the second layer 224 may include a nitride, and the third layer 226 may include an oxide but is not limited thereto. For example, in some example embodiments, the element separation region STI may include a single layer of one type of insulating film, a double layer of two types of insulating films, or a multi-layer of four or more types of insulating films.

The pixel separation region DTI may be formed within the pixel separation recess DTR extending from the first surface 200F of the first substrate 200 to the second surface 200B. The element separation region STI may be formed within the element separation recess STR extending from the first surface 200F of the first substrate 200 to the inside. In some example embodiments, each of the pixel separation region DTI and the element separation region STI may have a tapered shape in which a horizontal width decreases toward the second surface 200B of the first substrate 200 from the first surface 200F. In a vertical direction, an extension length of the pixel separation recess DTR may be greater than an extension length of the element separation recess STR. For example, the pixel separation recess DTR may penetrate through the first substrate 200, and the element separation recess STR may not penetrate through the first substrate 200. In some example embodiments, the pixel separation region DTI may overlap a portion of the element separation region STI in a vertical direction. For example, the pixel separation recess DTR may penetrate a portion of the element separation region STI and the first substrate 200 together.

In some example embodiments, gate electrodes included in a plurality of transistors may be formed on the first surface 200F of the first substrate 200. For example, the plurality of transistors may include a transmit transistor configured to transmit charges generated in the photo-sensing element PD to the floating diffusion region, a reset transistor configured to periodically reset charges stored in the floating diffusion region, a drive transistor which serves as a source follower buffer amplifier and is configured to buffer a signal according to the charges charged in the floating diffusion region, and a select transistor serving to perform switching and addressing for selecting a unit pixel PX. However, the plurality of transistors are not limited thereto.

Each of the gate electrodes included in the plurality of transistors may be a vertical gate or a planar gate. In FIG. 5A, a transmit gate 270 included in the transmit transistor from among the gate electrodes included in the plurality of transistors is shown as a vertical gate as an example. Although it is shown as an example that the transmit gate 270 included in the transmit transistor is a vertical gate formed in a recess gate type extending from the first surface 200F of the first substrate 200 into the first substrate 200, a shape of the transmit gate 270 is not limited thereto.

The first interconnection structure 280 may be disposed on the first surface 200F of the first substrate 200. The first interconnection structure 280 may include a plurality of first interconnection patterns 282 and a first interwiring insulating layer 284 surrounding the plurality of first interconnection patterns 282. The plurality of first interconnection patterns 282 may be electrically connected to the gate electrodes or the active region of the first substrate 200. The plurality of first interconnection patterns 282 may include a stacked structure of a plurality of first interconnection lines and a plurality of first interconnection vias. For example, the plurality of first interconnection patterns 282 may include a conductive material, such as tungsten, Al, copper, tungsten silicide, titanium silicide, tungsten nitride, titanium nitride, and/or doped polysilicon and the first interwiring insulating layer 284 may include an insulating material, such as silicon oxide, silicon nitride, and/or silicon oxynitride.

The plurality of color filter layers 530 may be disposed on the second surface 200B of the first substrate 200. In some example embodiments, a first passivation layer 510 may be located between the second surface 200B of the first substrate 200 and the plurality of color filter layers 530. The first passivation layer 510 may include an oxide, a nitride, an oxynitride, or a combination thereof. For example, the first passivation layer 510 may include one of silicon nitride, hafnium oxide, aluminum oxide, and/or tantalum oxide, or may include a stacked structure thereof.

A guide pattern 520 may be formed on the first passivation layer 510. In a plan view, the guide pattern 520 may have a grid shape or a mesh shape. The guide pattern 520 may prevent light incident on one photo-sensing element PD at an inclination angle from entering an adjacent photo-sensing element PD. For example, the guide pattern 520 may include at least one metal material from among tungsten, Al, titanium, ruthenium, cobalt, nickel, copper, gold, silver, and platinum.

On the first passivation layer 510 having the guide pattern 520 formed thereon, the plurality of color filter layers 530 overlapping the plurality of photo-sensing element PD and the plurality of microlenses 550 disposed on the plurality of color filter layers 530 may be disposed. The plurality of color filter layers 530 may allow light incident through the plurality of microlenses 550 to pass therethrough, and allow only light of a required wavelength to be incident on the plurality of photo-sensing element PD. In some example embodiments, the plurality of color filter layers 530 may only allow light having a wavelength within a range, where the range is between a lower wavelength value and an upper wavelength value. In some example embodiments, a second passivation layer 540 may be located between the plurality of color filter layers 530 and the plurality of microlenses 550. The second passivation layer 540 may include an oxide, a nitride, an oxynitride, or a combination thereof.

For example, each of the plurality of color filter layers 530 may include one of a red (R) filter, a blue (B) filter, and a green (G) filter. In some example embodiments, each of the plurality of color filter layers 530 may include one of a cyan (C) filter, a yellow (Y) filter, and a magenta (M) filter. The color filter layer 530 of one of the R filter, the B filter, and the G filter or the color filter layer 530 of one of the C filter, the Y filter, and the M filter may be formed on each of the photo-sensing elements PD, so that each of the unit pixels PX may detect a separated component of the incident light and recognize one light, e.g., light having a required wavelength or having a wavelength within a range.

The microlenses 550 may condense light incident on the image sensor 1 to the photo-sensing element PD of the unit pixel PX. In some example embodiments, the microlenses 550 may include an organic material layer and an inorganic material layer conformally covering a surface of the organic material layer. For example, the organic material layer may include a TMR-based resin (product of ToKyo Ohka Kogyo, Co.) and/or an MFR-based resin (product of Japan Synthetic Rubber Corporation).

A logic board WFL may be disposed on a lower surface of the first interconnection structure 280. The logic board WFL may include a second substrate 410, a logic circuit element 420 arranged in the second substrate 410, and a second interconnection structure 430. The second interconnection structure 430 may be in contact with the first interconnection structure 280. The second interconnection structure 430 may include a plurality of second interconnection patterns 432 and a second interwiring insulating layer 434 surrounding the plurality of second interconnection patterns 432. In some example embodiments, the first interwiring insulating layer 284 and the second interwiring insulating layer 434 may be in contact with each other. The plurality of second interconnection patterns 432 may be electrically connected to the plurality of first interconnection patterns 282 and/or the logic circuit element 420. The plurality of second interconnection patterns 432 may include a stacked structure of a plurality of second interconnection lines and a plurality of second interconnection vias. For example, the plurality of second interconnection patterns 432 may include a conductive material, such as tungsten, Al, copper, tungsten silicide, titanium silicide, tungsten nitride, titanium nitride, and/or doped polysilicon. For example, the second interwiring insulating layer 434 may include an insulating material, such as silicon oxide, silicon nitride, and/or silicon oxynitride.

The logic circuit element 420 may include at least one of the row driver 1120, the controller 1130, and the pixel signal processing unit shown in FIG. 1, or may include at least one of the vertical drive circuit 2400, the column signal processing circuit 2500, the horizontal drive circuit 2600, the output circuit 2700, and the control circuit 2800 shown in FIG. 2.

The plurality of first interconnection patterns of the optical element substrate WFO and the plurality of second interconnection patterns 432 of the logic board WFL may be electrically connected to each other by a plurality of bonding pads or a plurality of penetration electrodes. In some example embodiments, the optical element substrate WFO and the logic substrate WFL may be stacked by using a metal-oxide hybrid bonding method. The plurality of bonding pads may be formed by expanding by heat, by a plurality of first pad units and a plurality of second pad units corresponding to each other, and being in contact with each other so as to form an integral body through diffusion of metal atoms included therein. The first interwiring insulating layer 284 and the second interwiring insulating layer 434 may be bonded by forming a covalent bond.

The pixel separation region DTI may include a first insulating layer 232, a second insulating layer 234, a third insulating layer 236, a first conductive layer 242, and a second conductive layer 244. Each of the first insulating layer 232, the second insulating layer 234, and the third insulating layer 236 may include an insulating material, such as silicon oxide, silicon nitride, silicon oxynitride, and/or metal oxide. For example, the metal oxide may be hafnium oxide, aluminum oxide, and/or tantalum oxide. Each of the first conductive layer 242 and the second conductive layer 244 may include at least one of silicon, a metal, a metal silicide, a metal nitride, and/or a metal-containing film. For example, each of the first conductive layer 242 and the second conductive layer 244 may include doped polysilicon.

The first insulating layer 232 may cover an inner wall of the pixel separation recess DTR. The first insulating layer 232 may conformally cover the inner wall of the pixel separation recess DTR and may not fill all of the pixel separation recess DTR. In the pixel separation recess DTR, the first insulating layers 232 which are spaced apart from each other and surround at least one photo-sensing element PD in a plan view may be arranged.

The first conductive layer 242 may cover a portion of a side surface of the first insulating layer 232 in the pixel separation recess DTR. For example, the first conductive layer 242 may extend from the second surface 200B of the first substrate 200 toward the first surface 200F, but may not extend to the first surface 200F. The first conductive layer 242 may conformally cover a portion of a side surface of the first insulating layer 232 in the pixel separation recess DTR and may not fill an entire space defined by the first insulating layer 232. In the pixel separation recess DTR, the first conductive layers 242 spaced apart from each other and surrounding at least one photo-sensing element PD in a plan view may be arranged, and the first conductive layers 242 may cover a portion of side surfaces of the first insulating layers 232 spaced apart from each other and surrounding at least one photo-sensing element PD in a plan view.

The second insulating layer 234 may cover a portion of a side surface of the first conductive layer 242 in the inner space defined by the first conductive layer 242. The second insulating layer 234 may conformally cover a portion of an inner surface of an inner space defined by the first conductive layer 242 and may not cover an entire inner space defined by the first conductive layer 242. The second conductive layer 244 may cover the second insulating layer 234. The second conductive layer 244 may fill an entire space not filled by the second insulating layer 234 from among the inner space defined by the first conductive layer 242. The third insulating layer 236 may cover the first conductive layer 242, the second insulating layer 234, and the second conductive layer 244 and may fill the pixel separation region DTI. The third insulating layer 236 may fill a portion adjacent to the first surface 200F of the first substrate 200 from among the inner space defined by the first insulating layer 232. The third insulating layer 236 may extend into the pixel separation region DTI from the same vertical level at which the first surface 200F of the first substrate 200 is.

In the narrow region DTIN of the pixel separation region DTI, the first insulating layer 232, the second insulating layer 234, the third insulating layer 236, and the first conductive layer 242 may be arranged, but the second conductive layer 244 may not be arranged. In the wide region DTIW of the pixel separation region DTI, the first insulating layer 232, the second insulating layer 234, the third insulating layer 236, the first conductive layer 242, and the second conductive layer 244 may be arranged. The second insulating layer 234 may fill all of the inner space defined by the first conductive layer 242 in the narrow are DTIN of the pixel separation region DTI, but may not fill all of the inner space defined by the first conductive layer 242 in the wide region DTIW of the pixel separation region DTI. In the wide region DTIW of the pixel separation region DTI, all of the inner space defined by the first conductive layer 242 may be filled with the second insulating layer 234 and the second conductive layer 244.

The first vertical level LV1 may be relatively adjacent, or close, to the second surface 200B of the first substrate 200, and the second vertical level LV2 may be relatively adjacent, or close, to the first surface 200F of the first substrate 200. At the first vertical level LV1, a portion of the first conductive layer 242 may be relatively adjacent, or close, to the second surface 200B of the first substrate 200, and at the second vertical level LV2, a portion of the first conductive layer 242 may be relatively adjacent, or close, to the first surface 200F of the first substrate 200.

The second conductive layer 244 may include a connection portion 244C and a charging portion 244S. The connection portion 244C of the second conductive layer 244 may be a portion of the second conductive layer 244 relatively adjacent, or close, to the first surface 200F of the first substrate, and the charging portion 244S of the second conductive layer 244 may be a portion relatively adjacent, or close, to the second surface 200B of the first substrate 200. The connection portion 244C of the second conductive layer 244 may be located between the second insulating layer 234 and the third insulating layer 236 and may extend into the second insulating layer 234 from the connection portion 244C. The connection portion 244C of the second conductive layer 244 may extend from the charging portion 244S of the second conductive layer 244 toward the first surface 200F of the first substrate 200, and the charging portion 244S may extend from the connection portion 244C to the second surface 200B of the first substrate 200.

The charging portion 244S of the second conductive layer 244 may fill all of the inner space defined by the second insulating layer 234. The second insulating layer 234 and the third insulating layer 236 may be in contact with each other in the narrow region DTIN of the pixel separation region DTI, but may not be in contact with each other in the wide region DTIW of the pixel separation region DTI. In the wide region DTIW of the pixel separation region DTI, the second insulating layer 234 and the third insulating layer 236 may be spaced apart from each other with the connection portion 244C of the second conductive layer 244 therebetween.

The connection portion 244C of the second conductive layer 244 may be located between the second insulating layer 234 and the third insulating layer 236 and may be in contact with the first conductive layer 242. The charging portion 244S of the second conductive layer 244 may be spaced apart from the first conductive layer 242 with the second insulating layer 234 therebetween. The second conductive layer 244 may be in contact with and connected to the first conductive layer 242 in a portion adjacent to the first surface 200F of the first substrate 200, and may be spaced apart from the first conductive layer 242 with the second insulating layer 234 therebetween, in a portion adjacent to the second surface 200B. The second conductive layer 244 may be in contact with and connected to the first conductive layer 242 in a portion adjacent to an edge of each of the plurality of photo-sensing elements PD, and may be spaced apart from the first conductive layer 242 with the second insulating layer 234 therebetween, in a portion adjacent to a portion spaced apart from an edge from among a side of each of the plurality of photo-sensing elements PD. Accordingly, the first conductive layers 242 spaced apart from each other in the pixel separation region DTI may be electrically connected to each other by the connection portion 244C of the second conductive layer 244.

In the image sensor 1 according to some example embodiments, because the pixel separation region DTI includes the first conductive layer 242 adjacent to the photo-sensing element PD, electrons causing dark current at an interface between the pixel separation region DTI and the photo-sensing element PD are reduced, a dark level is reduced, and performance may be improved. In addition, in the pixel separation region DTI included in the image sensor 1 according to some example embodiments, the inner space defined by the first insulating layer 232 is filled with a conductive material including the first conductive layer 242 and the second conductive layer 244 and an insulating material including the second insulating layer 234 and the third insulating layer 236 together, and thus, a proportion of a volume of an insulating material in the pixel separation region DTI relatively increases, and thus, a ratio of a volume of a conductive material may be relatively reduced. In the image sensor 1 according to some example embodiments, a ratio of a conductive material having a relatively high light absorption rate is reduced, and a proportion of an insulating material having a relatively low light absorption rate increases, and thus, light sensitivity may increase.

Figure 7:
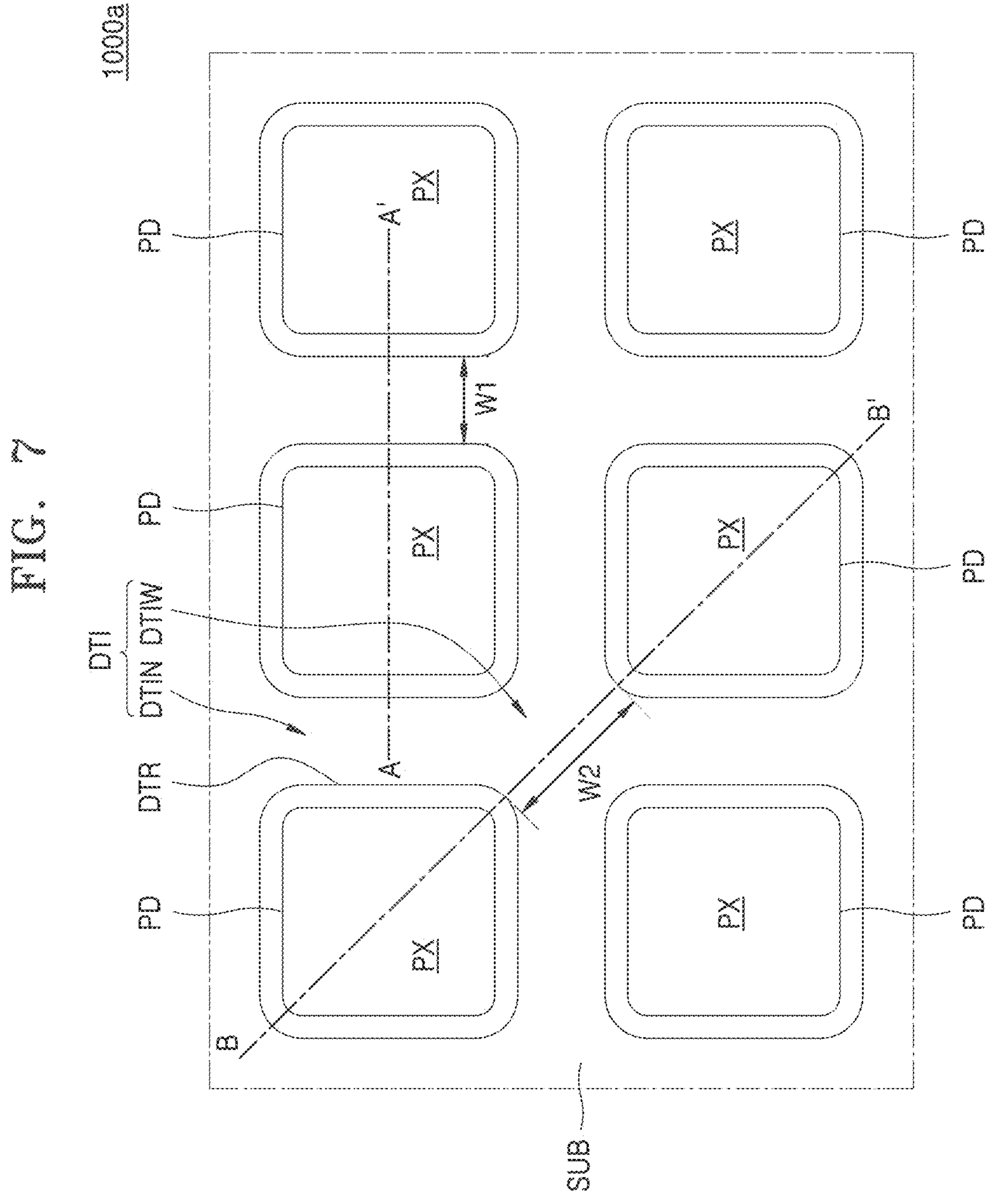
FIG. 7 is a plan layout illustrating unit pixels, which include photo-sensing elements, and a pixel separation region of an image sensor according to some example embodiments.

FIG. 7 is a plan layout illustrating unit pixels PX, which include photo-sensing elements PD, and a pixel separation region DTI of the image sensor 1000*a* according to some example embodiments.

Referring to FIG. 7, the image sensor 1000*a* may include a substrate SB having a pixel separation recess DTR, the plurality of unit pixels, and the pixel separation region DTI filling the pixel separation recess DTR. Each of the plurality of unit pixels PX may include a photo-sensing element PD. The pixel separation region DTI may be located between the plurality of photo-sensing elements PD. In some example embodiments, the pixel separation region DTI may completely surround each of the plurality of photo-sensing elements PD in a plan view.

The pixel separation DTI may include a narrow region DTIN having a first horizontal width W1 that is relatively narrow, and a wide region DTIW having a second horizontal width W2 that is relatively wide. The narrow region DTIN may be a portion of the pixel separation region DTI arranged between the photo-sensing elements PD adjacent to each other in a width direction of the photo-sensing element PD, and the wide region DTIW may be a portion of the pixel separation region DTI arranged between the photo-sensing elements PD adjacent to each other in a diagonal direction of the photo-sensing element PD. For example, the narrow region DTIN may be a portion of the pixel separation region DTI arranged between edges facing each other of each of the photo-sensing elements PD adjacent to each other, and the wide region DTIW may be a portion of the pixel separation region DTI arranged between sides facing each other of the photo-sensing elements PD adjacent to each other.

The vertical cross-sectional view of a portion in FIG. 7, taken along line A-A' in FIG. 7, may be approximately the same as FIG. 5A, the vertical cross-sectional view of a portion in FIG. 7, taken along line B-B' in FIG. 7, may be approximately the same as FIG. 5B, and redundant descriptions thereof is omitted.

Figure 8A:
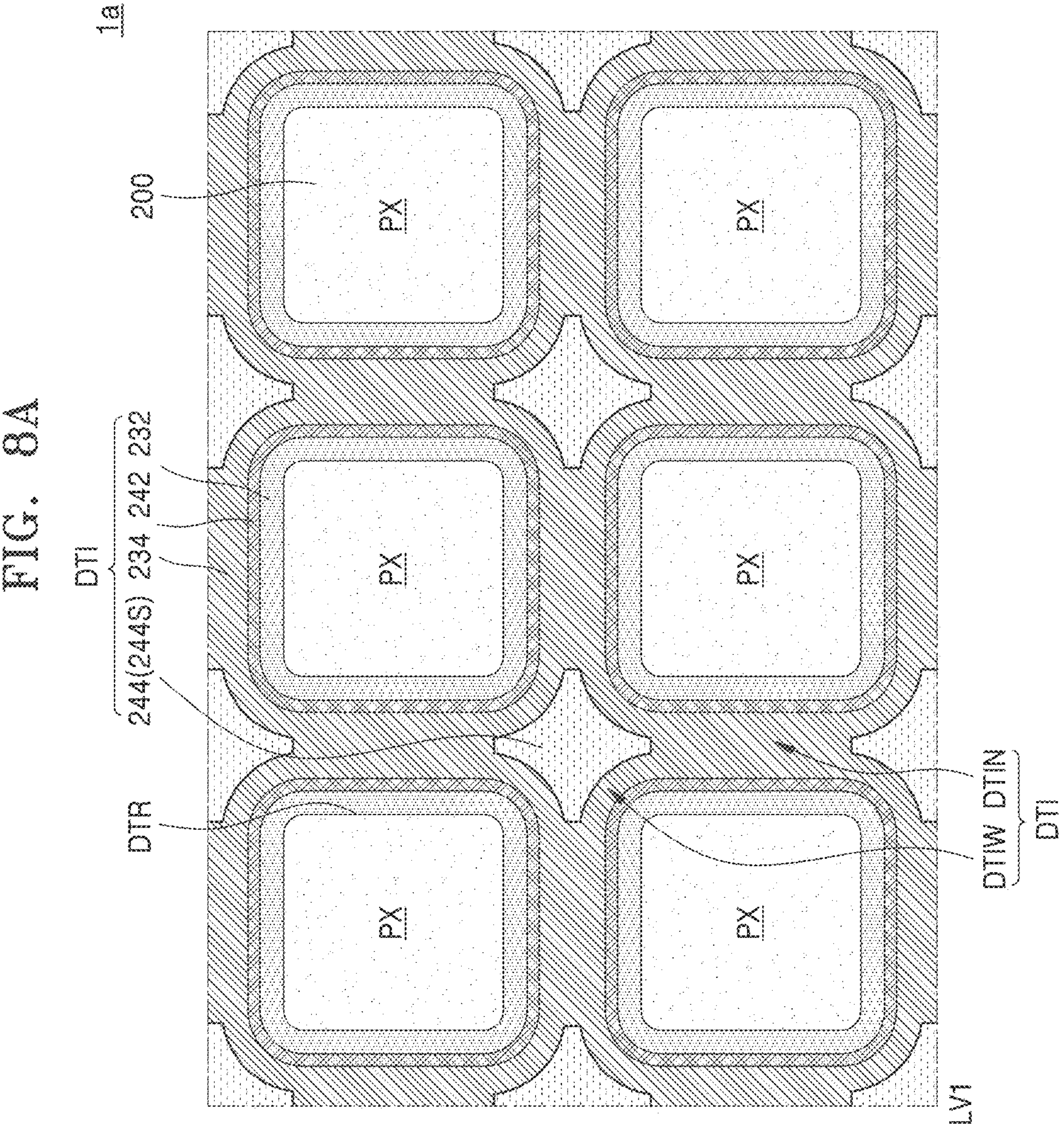
FIGS. 8A and 8B are horizontal cross-sectional views of an image sensor according to some example embodiments.
Figure 8B:
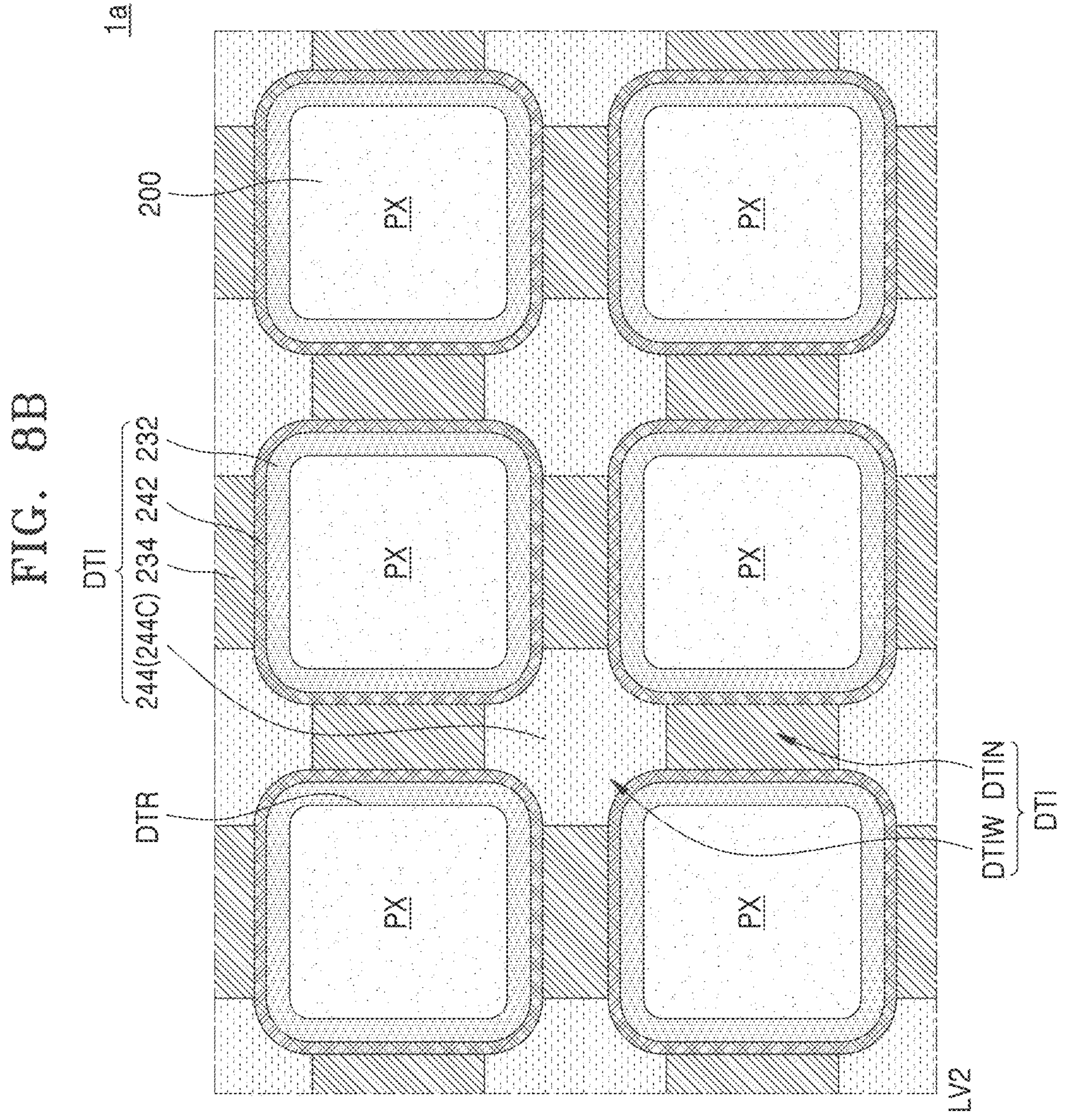

FIGS. 8A and 8B are horizontal cross-sectional views of the image sensor 1*a* according to some example embodiments. FIG. 8A is a horizontal cross-sectional view of a portion in FIGS. 5A and 5B, taken along the first vertical level LV1 in FIGS. 5A and 5B, and FIG. 8B is a horizontal cross-sectional view of a portion in FIGS. 5A and 5B, taken the second vertical level LV2 in FIGS. 5A and 5B.

Referring to FIGS. 8A and 8B together with FIGS. 5A and 5B, the image sensor 1*a* may include the optical element substrate WFO having the plurality of unit pixels PX including the plurality of photo-sensing elements PD, the plurality of microlenses 550 disposed on the optical element substrate WFO, and the plurality of color filter layers 530 located between the phot-sensing substrate WFO and the plurality of microlenses 550.

The element separation region STI and the pixel separation region DTI may be arranged in the first substrate 200. The plurality of unit pixels PX may be defined by the pixel separation region DTI, and the pixel separation region DTI may surround each of the plurality of photo-sensing elements PD in a plan view in the first substrate 200. The pixel separation region DTI may include the first insulating layer 232, the second insulating layer 234, the third insulating layer 236, the first conductive layer 242, and the second conductive layer 244. In the pixel separation recess DTR, the plurality of first insulating layers 232 surrounding each of the plurality of photo-sensing elements PD and spaced apart from each other in a plan view may be arranged. In the pixel separation recess DTR, the plurality of first conductive layers 242 surrounding each of the plurality of photo-sensing elements PD and spaced apart from each other in a plan view may be arranged, and each of the plurality of first conductive layers 242 may cover a portion of a side surface of each of the plurality of first insulating layers 232.

In the narrow region DTIN of the pixel separation region DTI, the first insulating layer 232, the second insulating layer 234, the third insulating layer 236, and the first conductive layer 242 may be arranged, but the second conductive layer 244 may not be arranged. In the wide region of the pixel separation region DTI, the first insulating layer 232, the second insulating layer 234, the third insulating layer 236, the first conductive layer 242, and the second conductive layer 244 may be arranged. The second conductive layer 244 may include the connection portion 244C and the charging portion 244S. The first conductive layers 242 spaced apart from each other in the pixel separation region DTI may be electrically connected to each other by the connection portion 244C of the second conductive layer 244.

FIGS. 9A to 9J are vertical cross-sectional views illustrating a method of manufacturing an image sensor, according to some example embodiments. In detail, FIGS. 9A to 9J are enlarged vertical cross-sectional views of each of a portion corresponding to region X1 in FIG. 5A and a portion corresponding to region X2 in FIG. 5B.

Figure 9A:
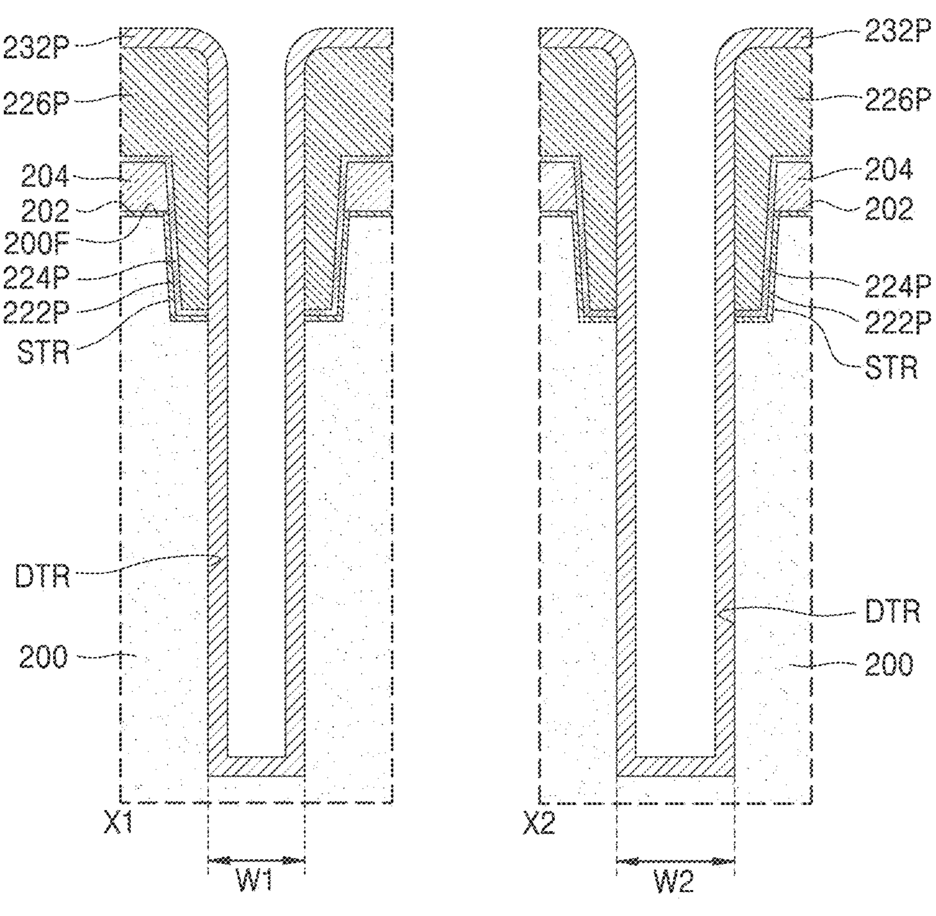
FIGS. 9A to 9J are vertical cross-sectional views illustrating a method of manufacturing an image sensor according to some example embodiments.

Referring to FIG. 9A, the element separation recess STR is formed by forming a first pad layer 202 and a second pad layer 204 on the first surface 200F of the first substrate 200 and then, removing a portion of each of the first pad layer 202, the second pad layer 204, and the first substrate 200. For example, the first pad layer 202 may include an oxide, and the second pad layer 204 may include a nitride. The element separation recess STR passes through the first pad layer 202 and the second pad layer 204 and may be formed to extend into the first substrate 200 from the first surface 200F of the first substrate 200. A preliminary first layer 222P, a preliminary second layer 224P, and a preliminary third layer 226P are sequentially formed on the first substrate 200, the first pad layer 202, and the second pad layer 204, in which the element separation recess STR is formed. The preliminary first layer 222P may include an oxide, the preliminary second layer 224P may include a nitride, and the preliminary third layer 226P may include an oxide.

A portion of each of the preliminary first layer 222P, the preliminary second layer 224P, the preliminary third layer 226P, and the first substrate 200 is removed to form the pixel separation recess DTR. The pixel separation recess DTR passes through the preliminary first layer 222P, the preliminary second layer 224P, and the preliminary third layer 226P, and may be formed to extend into the first substrate 200 from the first surface 200F of the first substrate 200. A portion of the pixel separation recess DTR may be formed to have a first horizontal width W1 that is relatively narrow, and other portions may be formed to have a second horizontal width W2 that is relatively wide.

The preliminary first insulating layer 232P may be formed on the preliminary first layer 222P, the preliminary second layer 224P, the preliminary third layer 226P, and the first substrate 200, in which the pixel separation recess DTR is formed. The preliminary first insulating layer 232P may be formed to conformally cover an inner wall and a bottom surface of the pixel separation recess DTR and the preliminary third layer 226P. The preliminary first insulating layer 232P may include an insulating material, such as silicon oxide, silicon nitride, silicon oxynitride, and/or a metal oxide.

Figure 9B:
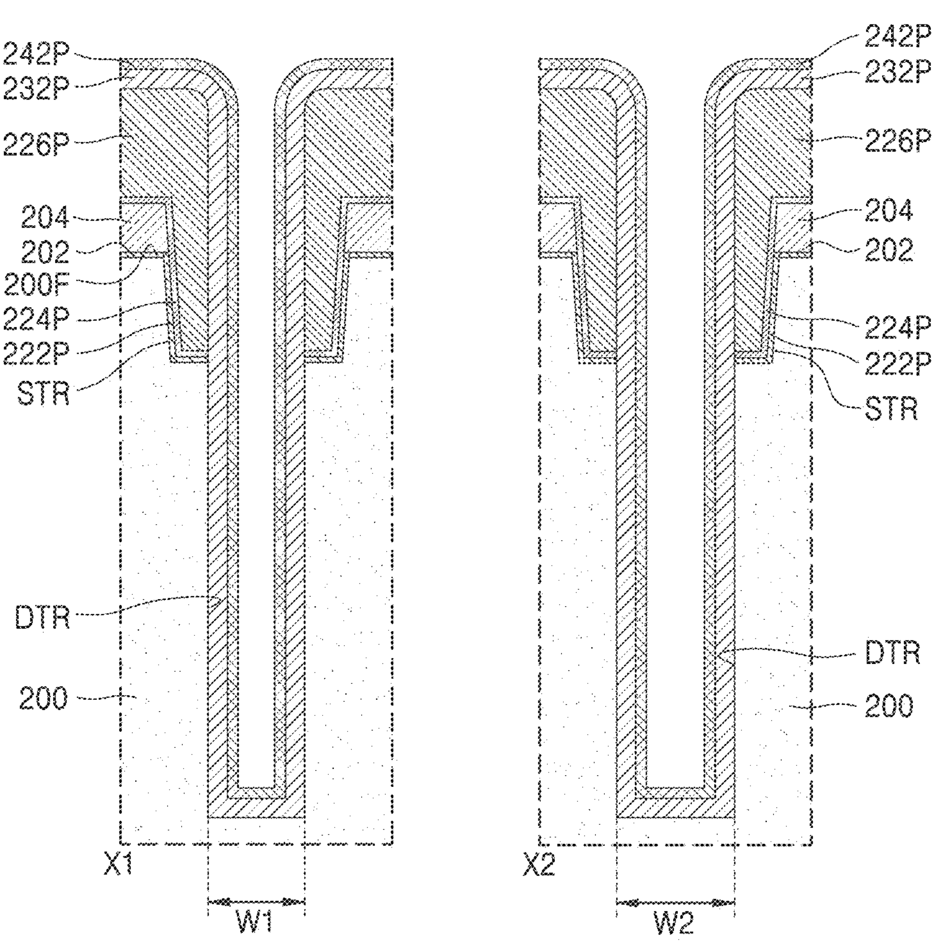

Referring to FIG. 9B, a preliminary first conductive layer 242P is formed on the preliminary first insulating layer 232P. The preliminary first conductive layer 242P may be formed to conformally cover the preliminary first insulating layer 232P. The preliminary first conductive layer 242P may include at least one of silicon, a metal, metal silicide, metal nitride, and/or a metal-containing film. For example, the preliminary first conductive layer 242P may include doped polysilicon.

Figure 9C:
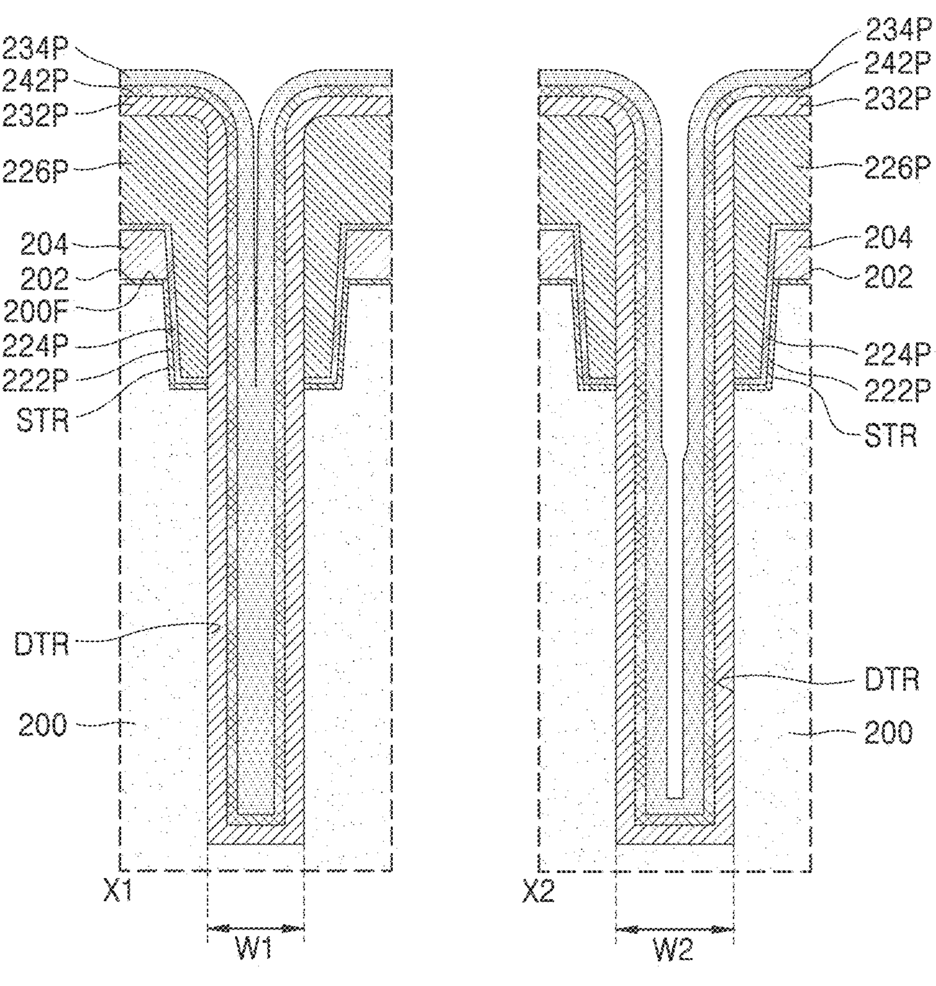

Referring to FIG. 9C, the preliminary second insulating layer 234P may be formed on the preliminary first conductive layer 242P. The preliminary second insulating layer 234P may be formed to conformally cover the preliminary first conductive layer 242P. The preliminary second insulating layer 234P may include an insulating layer, such as silicon oxide, silicon nitride, silicon oxynitride, and/or a metal oxide. The preliminary second insulating layer 234P may fill a lower portion of an inner space defined by the preliminary first conductive layer 242P in a portion X1 of the pixel separation recess DTR corresponding to the narrow region DTIN in FIGS. 5A to 8B, and may fill only a portion of the lower portion of an inner space defined by the preliminary first conductive layer 242P in a portion X2 of the pixel separation recess DTR corresponding to the wide region DTIW.

Figure 9D:
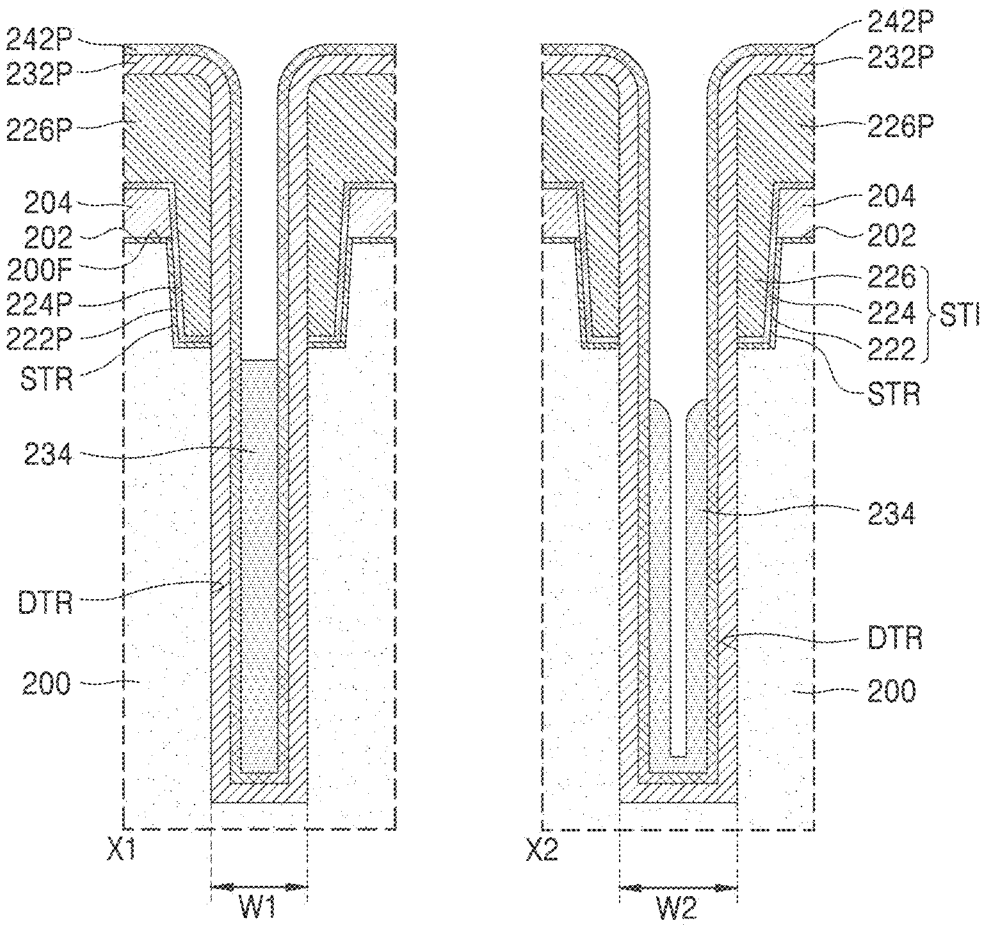

Referring to FIGS. 9C and 9D together, a portion of the preliminary second insulating layer 234P may be removed to form the second insulating layer 234. In order to fill all of a lower portion of the inner space defined by the preliminary first conductive layer 242P and not fill an upper portion in the portion X1 of the pixel separation recess DTR corresponding to the narrow region DTIN in FIGS. 5A to 8B, and to fill only a portion of a lower portion of the inner space defined by the preliminary first conductive layer 242P and not fill an upper portion in the portion X2 of the pixel separation recess DTR corresponding to the wide region DTIW, the preliminary second insulating layer 234P may conformally cover the lower portion.

Figure 9E:
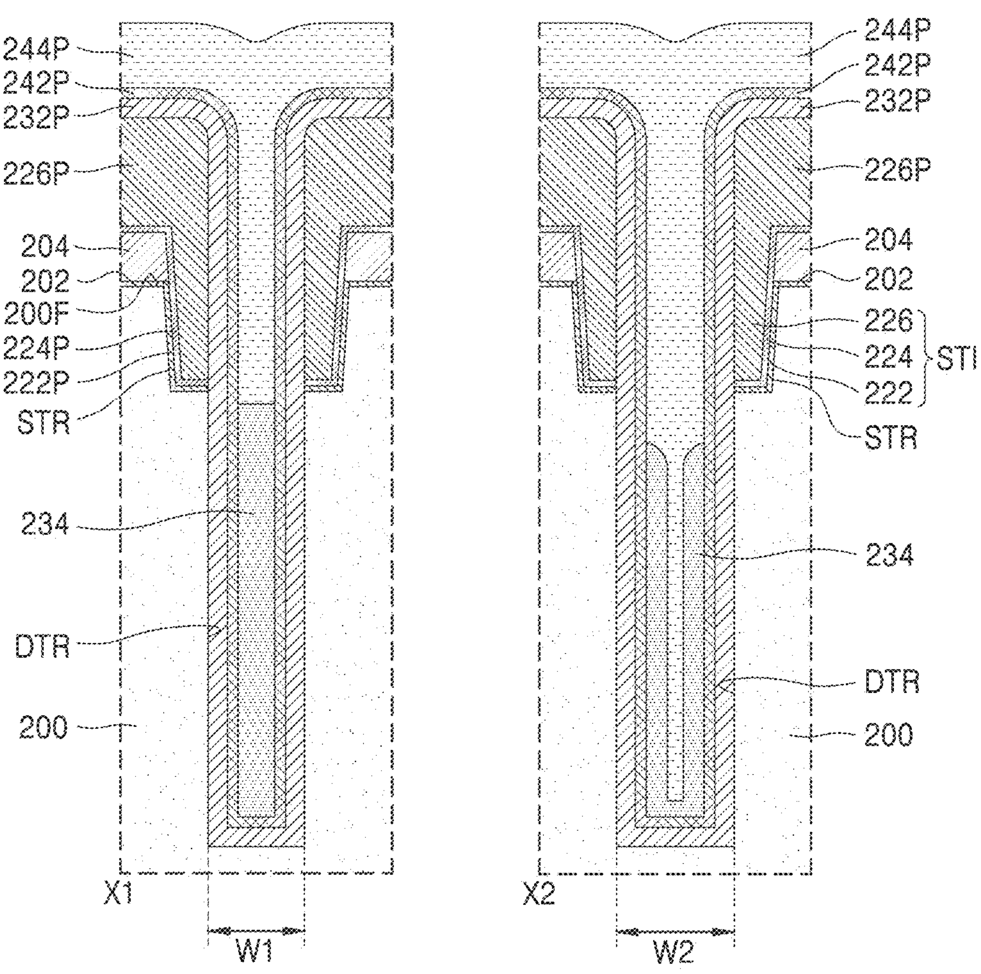

Referring to FIG. 9E, the preliminary second conductive layer 244P may be formed on the second insulating layer 234 and the preliminary first conductive layer 242P. The preliminary second conductive layer 244P may include at least one of silicon, a metal, metal silicide, metal nitride, and/or a metal-containing film. For example, the preliminary second conductive layer 244P may include doped polysilicon. The preliminary second conductive layer 244P may be formed to fill the inner space defined by the preliminary first conductive layer 242P and the second insulating layer 234.

Figure 9F:
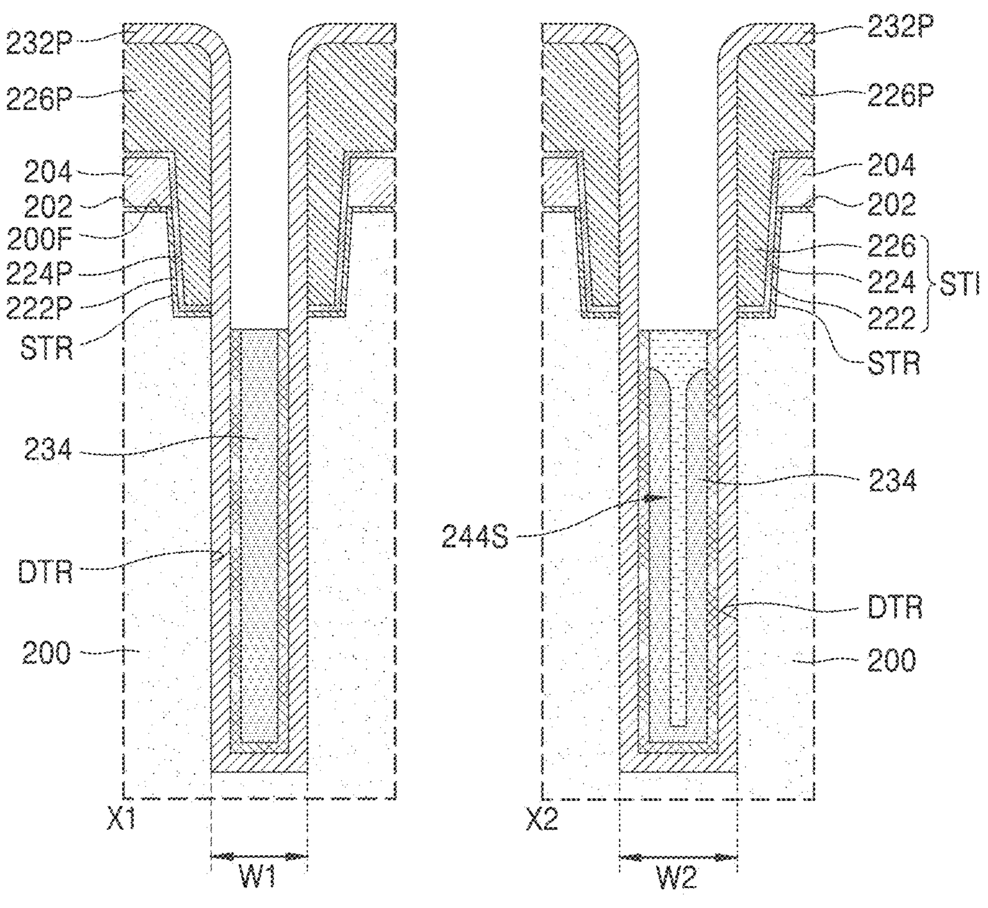

Referring to FIGS. 9E and 9F together, a portion of the preliminary second conductive layer 244P and a portion of the preliminary first conductive layer 242P may be removed to form the second conductive layer 244 and the first conductive layer 242. The inner space defined by the first conductive layer 242 in the portion X1 of the pixel separation recess DTR corresponding to the narrow region DTIN in FIGS. 5A to 8B may be filled with the second insulating layer 234, and the inner space defined by the first conductive layer 242 in the portion X2 of the pixel separation recess DTR corresponding to the wide region DTIW may be filled with the second insulating layer 234 and the second conductive layer 244 together. In the portion X2 of the pixel separation recess DTR corresponding to the wide region DTIW, the second insulating layer 234 may conformally cover a lower portion of the inner space defined by the first conductive layer 242 except for a portion of an upper portion, and the second conductive layer 244 may fill of a portion of an upper side of the inner space defined by the first conductive layer 242 and fill the inner space defined by the second insulating layer 234. In the portion X2 of the pixel separation recess DTR corresponding to the wide region DTIW, the second conductive layer 244 may be connected in contact with the upper portion of the first conductive layer 242.

Figure 9G:
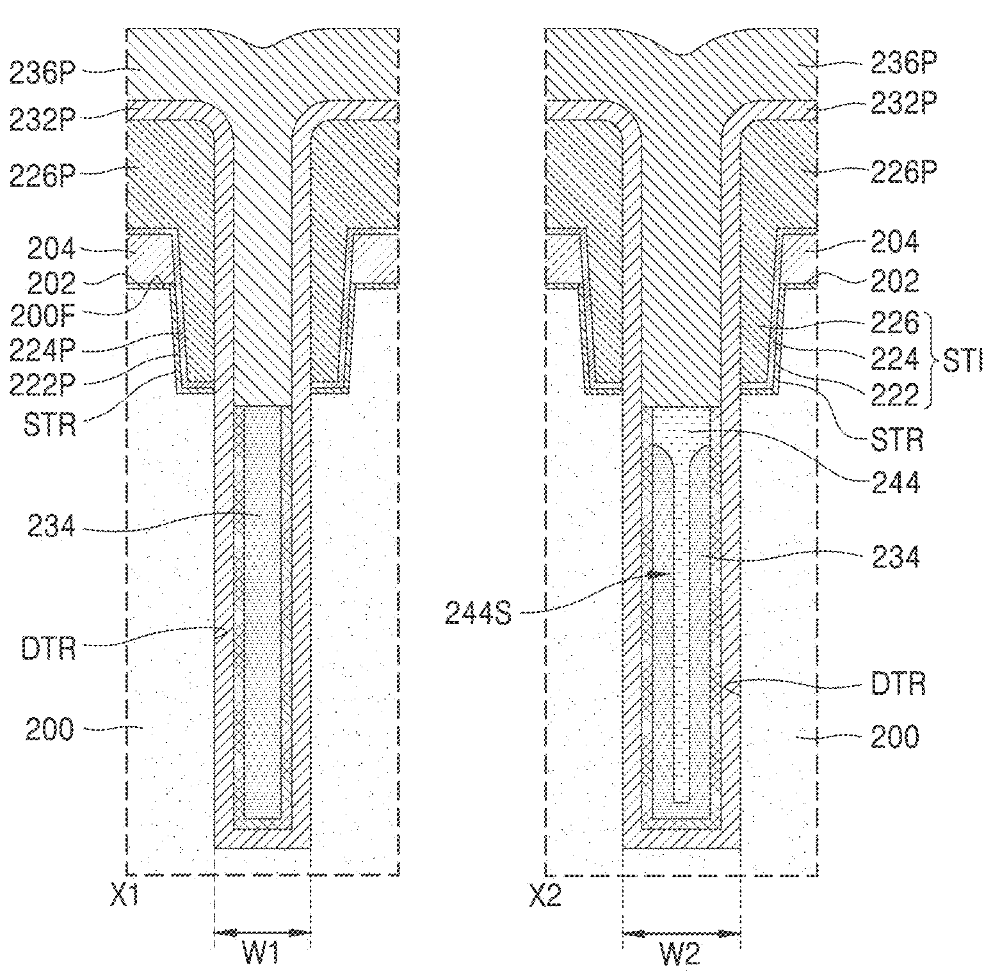

Referring to FIG. 9G, a preliminary third insulating layer 236P may be formed on the preliminary first insulating layer 232P, the second insulating layer 234, the first conductive layer 242, and the second conductive layer 244. The preliminary third insulating layer 236P may be formed to fill the inner space defined by the preliminary first insulating layer 232P. The preliminary third insulating layer 236P may include an insulating material, such as silicon oxide, silicon nitride, silicon oxynitride, and/or a metal oxide.

Figure 9H:
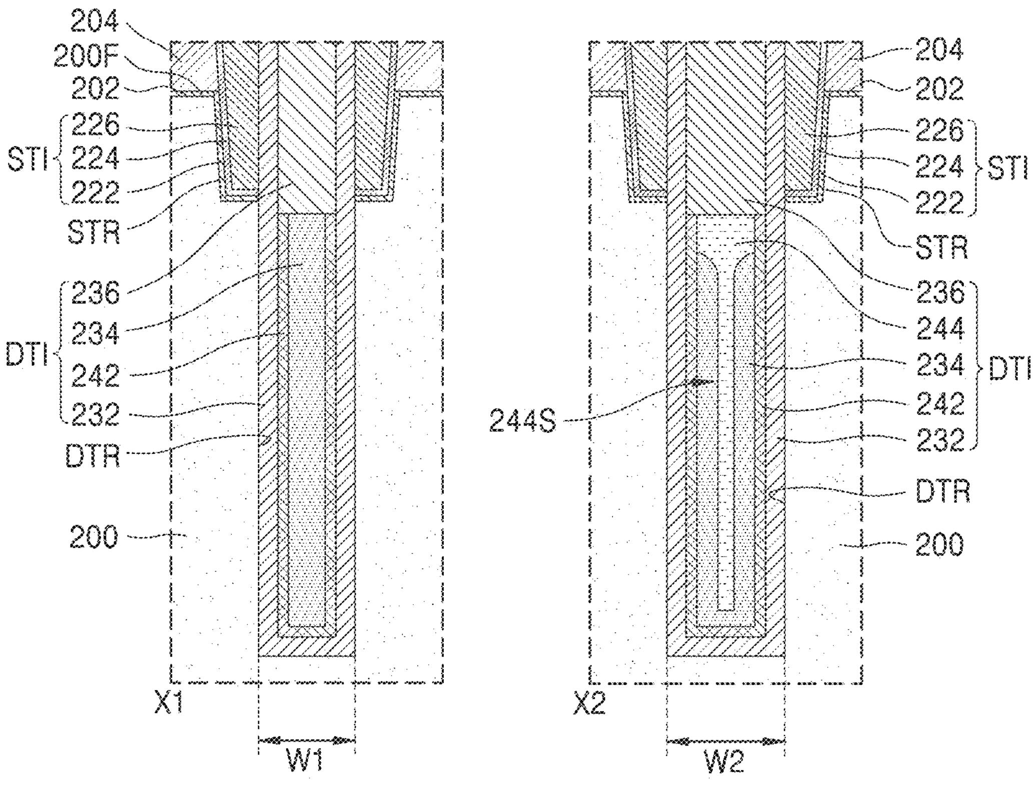

Referring to FIGS. 9G and 9H together, in order for the second pad layer 204 to be exposed, a portion of each of the preliminary first layer 222P, the preliminary second layer 224P, and the preliminary third layer 226P may be removed to form the element separation region STI including the first layer 222, the second layer 224, and the third layer 226, and a portion of each of the preliminary first insulating layer 232P and the preliminary third insulating layer 236P may be removed to form the pixel separation region DTI including the first insulating layer 232, the first conductive layer 242, the second insulating layer 234, the second conductive layer 244, and the third insulating layer 236.

Figure 9I:
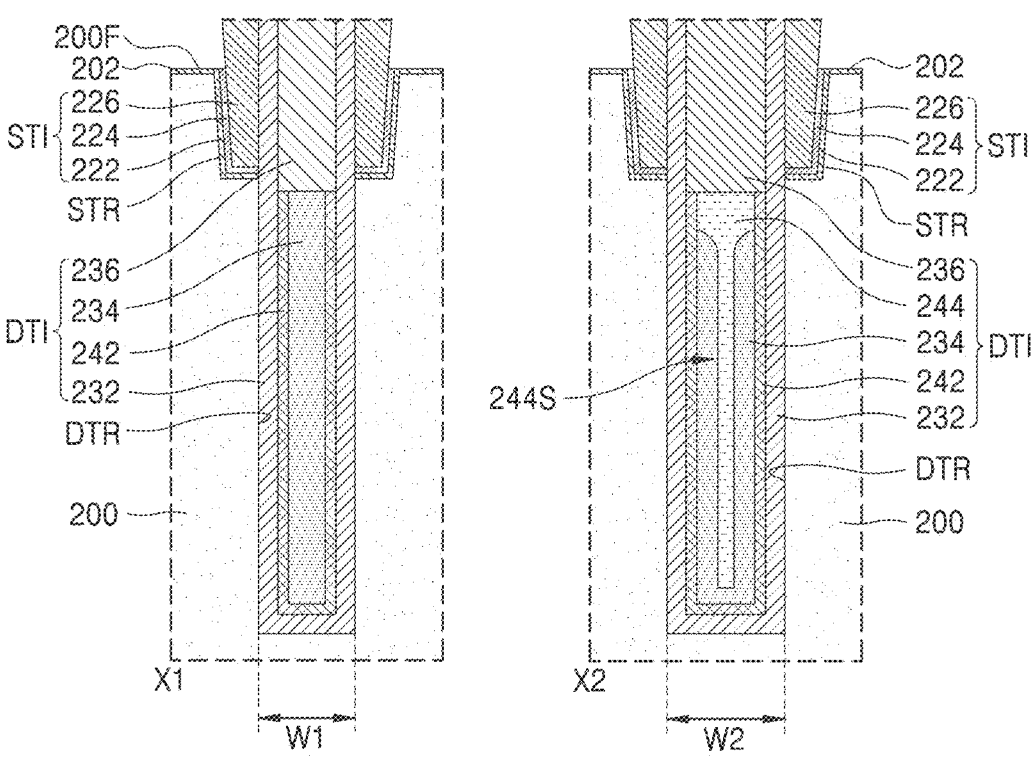

Referring to FIGS. 9H and 9I together, the second pad layer 204 may be removed.

Figure 9J:
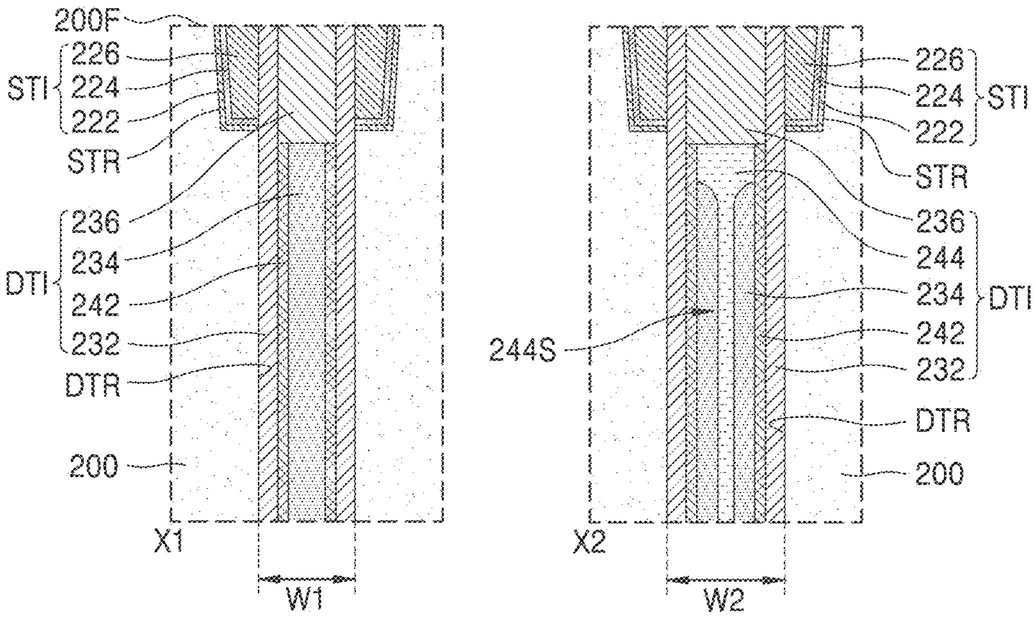

Referring to FIGS. 9I and 9J together, in a subsequent process, the first pad layer 202 may be removed, and a portion of an upper portion of each of the element separation region STI and the pixel separation area DTI may be removed. In some example embodiments, the first surface 200F of the first substrate 200, an upper surface of the element separation region STI, and an upper surface of the pixel separation region DTI may be located at the same vertical level but are not limited thereto.

Figure 10A:
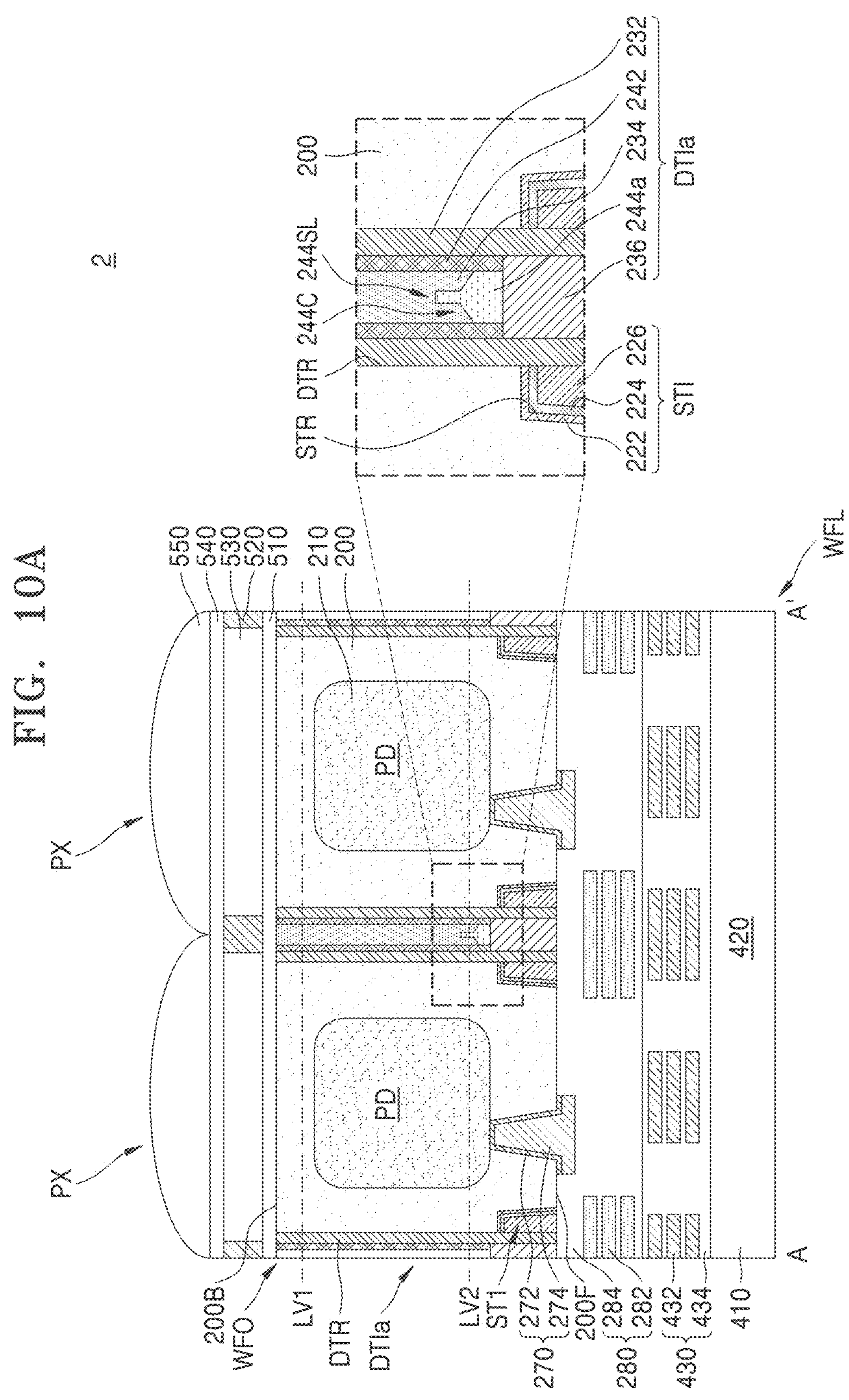
FIGS. 10A and 10B are vertical cross-sectional views of an image sensor according to some example embodiments.
Figure 10B:
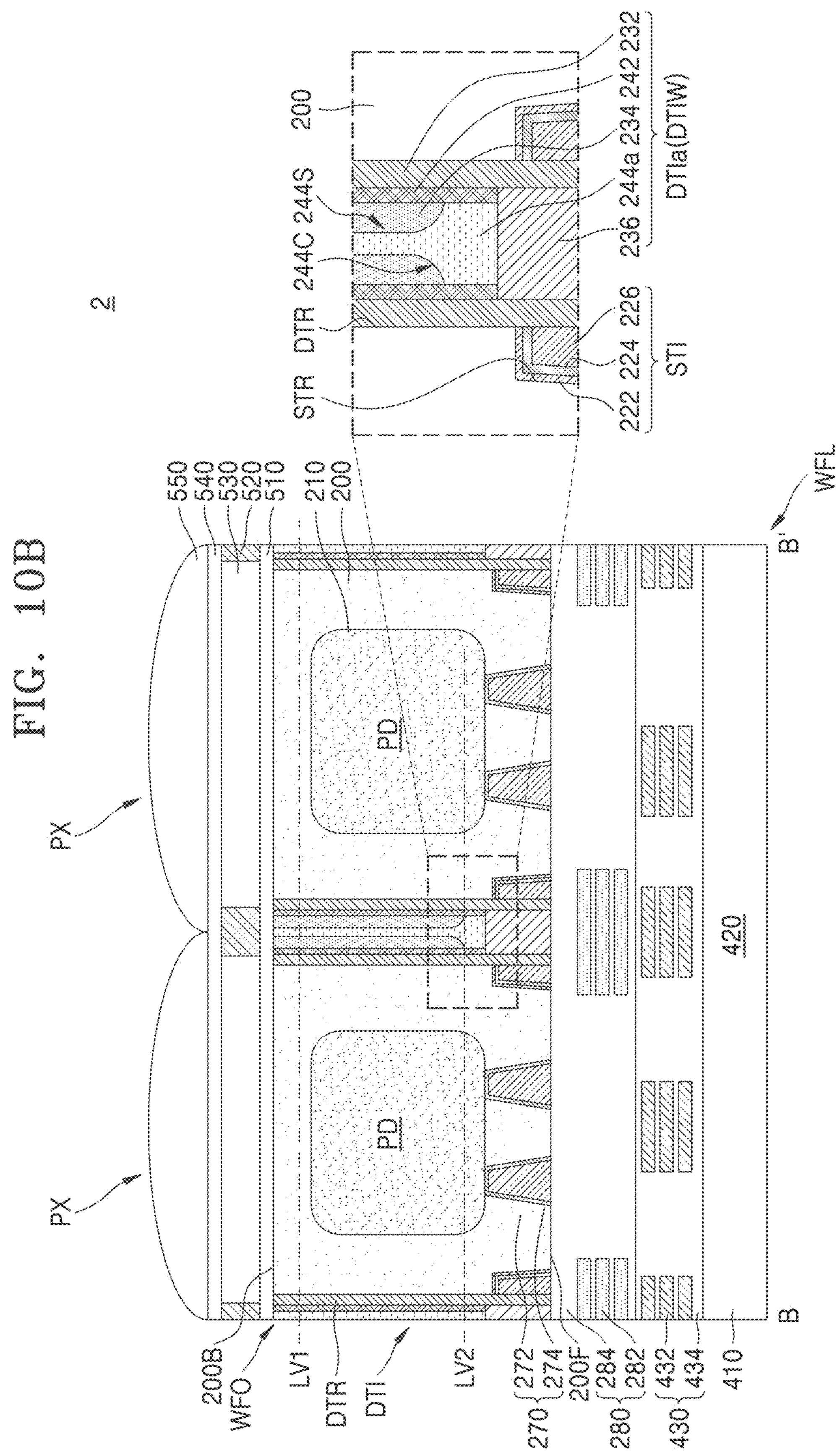
Figure 11A:
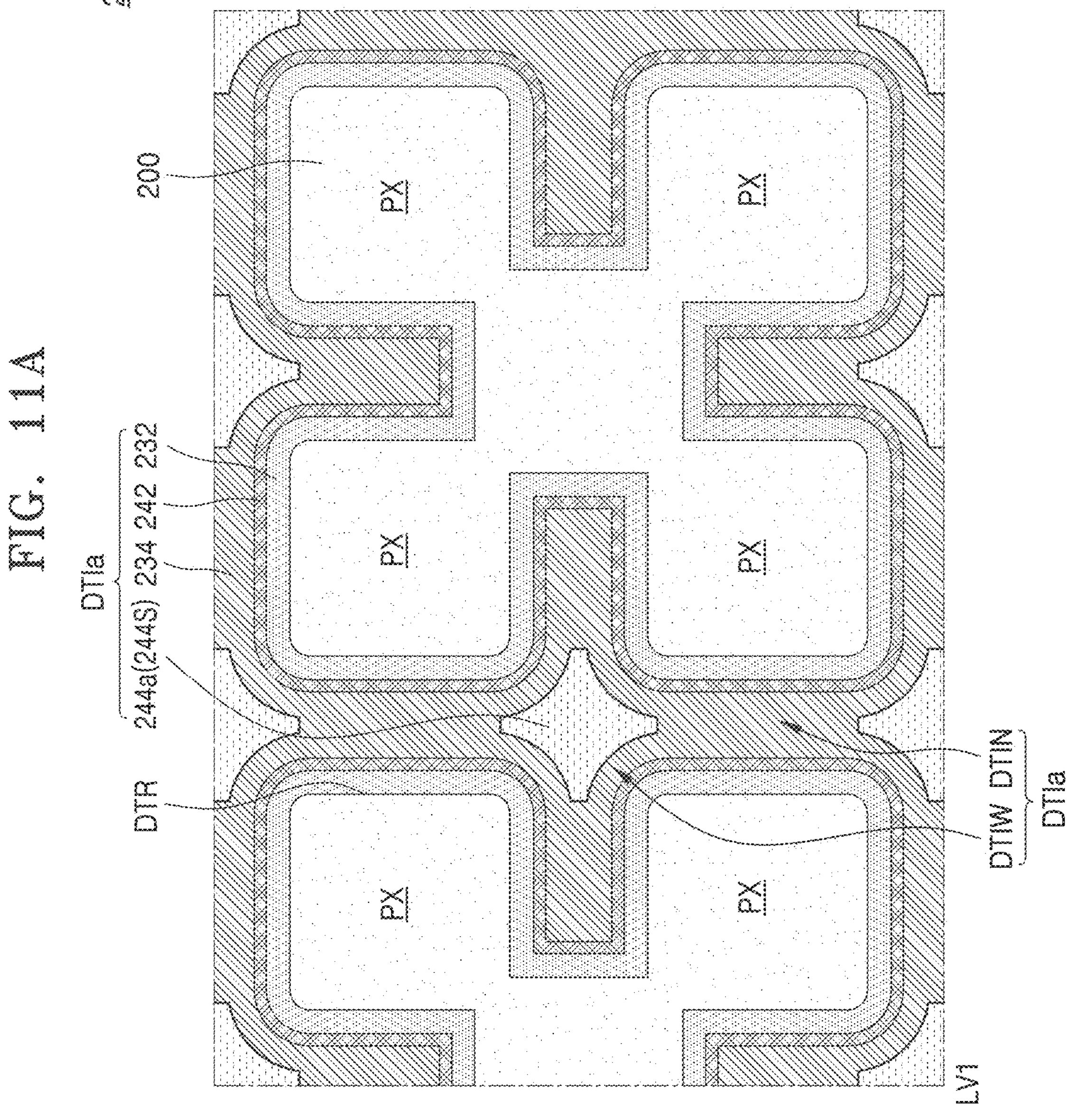
FIGS. 11A and 11B are horizontal cross-sectional views of the same.
Figure 11B:
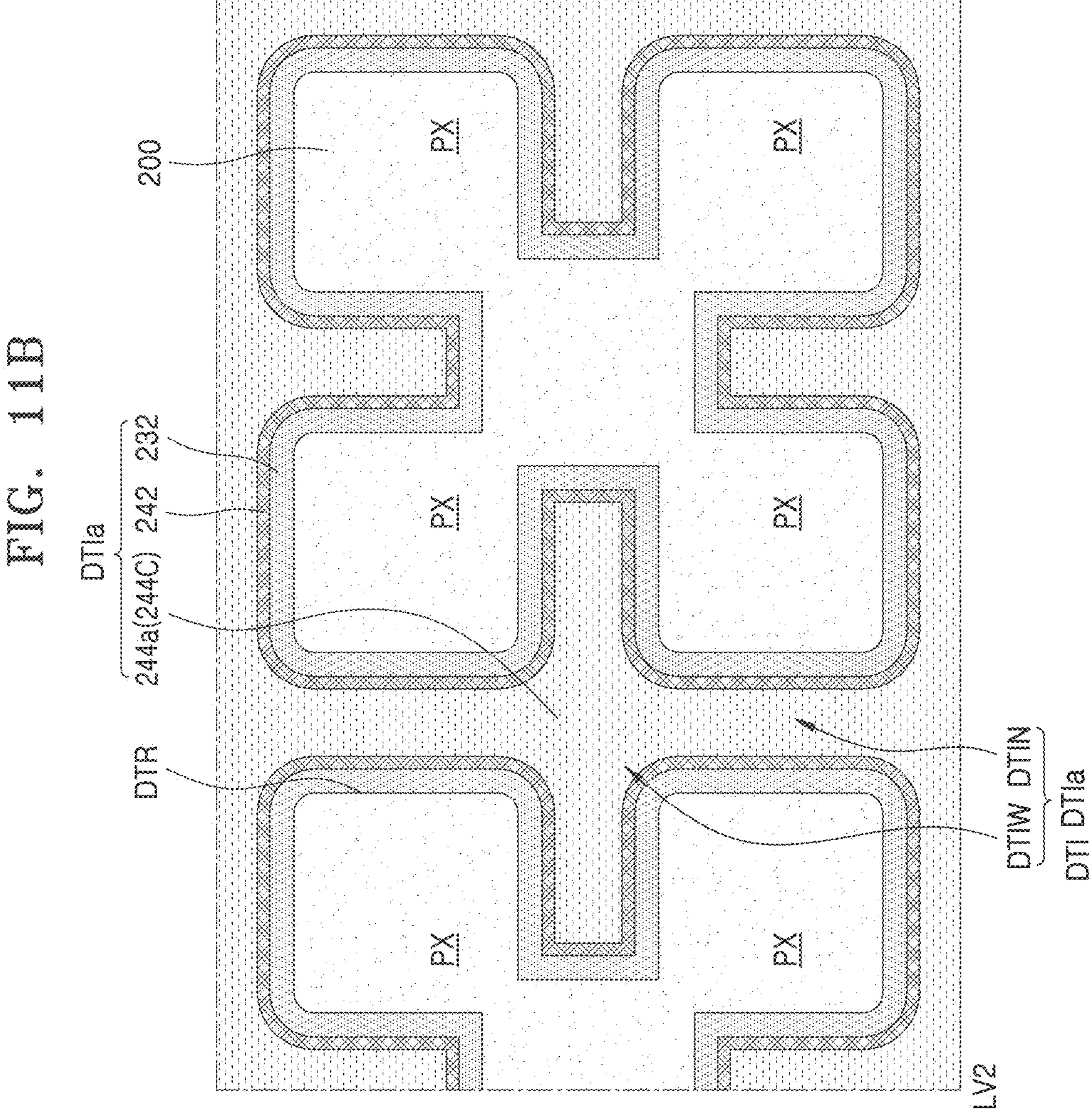

FIGS. 10A and 10B are vertical cross-sectional views of the image sensor 2 according to some example embodiments, and FIGS. 11A and 11B are horizontal cross-sectional views of the same. In detail, FIG. 10A is a vertical cross-sectional view of a portion in FIG. 4, taken along line A-A' in FIG. 4, FIG. 10B is a vertical cross-sectional view of a portion in FIG. 4, taken along line B-B' in FIG. 4, FIG. 11A is a horizontal cross-sectional view taken along the first vertical level LV1 in FIGS. 10A and 10B, and FIG. 11B is a horizontal cross-sectional view taken along the second vertical level LV2.

Referring to FIGS. 10A, 10B, 11A, and 11B together, the image sensor 2 may include the optical element substrate WFO having the plurality of unit pixels PX including the plurality of photo-sensing elements PD, the plurality of microlenses 550 disposed on the optical element substrate WFO, and the plurality of color filter layers 530 located between the optical element substrate WFO and the plurality of microlenses 550.

The element separation region STI and a pixel separation region DTIa may be arranged in the first substrate 200. The plurality of unit pixels PX may be defined by the pixel separation region DTIa, and the pixel separation region DTIa may surround at least a portion of each of the plurality of photo-sensing element PD in a plan view in the first substrate 200. The pixel separation region DTIa may be arranged between one of the photo-sensing elements PD from among the plurality of photo-sensing elements PD and another photo-sensing element PD adjacent thereto. The pixel separation region DTIa may be arranged between the plurality of photo-sensing elements PD arranged in a matrix form, in a plan view, and may have a grid or mesh shape in a plan view.

The pixel separation region DTIa may be formed inside the pixel separation recess DTR extending from the first surface 200F of the first substrate 200 to the second surface 200B. For example, a pixel separation recess DTRa may pass through the first substrate 200, and the element separation recess STR may not pass through the first substrate 200. In some embodiments, the pixel separation region DTIa may overlap a portion of the element separation region STI in a vertical direction.

The pixel separation region DTIa may include the first insulating layer 232, the second insulating layer 234, the third insulating layer 236, the first conductive layer 242, and/or the second conductive layer 244*a*. The first insulating layer 232, the second insulating layer 234, the third insulating layer 236, the first conductive layer 242, and the second conductive layer 244*a* may be arranged in the narrow region DTIN of the pixel separation region DTIa. The first insulating layer 232, the second insulating layer 234, the third insulating layer 236, the first conductive layer 242, and the second conductive layer 244*a* may be arranged in the wide region DTIW of the pixel separation region DTIa.

The second insulating layer 234 may not fill all of the inner space defined by the first conductive layer 242 in each of the narrow region DTIN and the wide region DTIW of the pixel separation region DTIa. The inner space defined by the first conductive layer 242 in the narrow region DTIN and the wide region DTIW of the pixel separation region DTIa may all be filled with the second insulating layer 234 and the second conductive layer 244*a*.

The second conductive layer 244*a* may include the connection portion 244C, a charging portion 244S, and a narrow charging portion 244SL. The inner space defined by the first conductive layers 242 in the narrow region DTIN of the pixel separation region DTIa may all be filled with the second insulating layer 234 and the connection portion 244C and the narrow charging portion 244SL of the second conductive layer 244*a*, and the inner space defined by the first conductive layer 242 in the wide region DTIW of the pixel separation region DTIa may all be filled with the second insulating layer 234, the connection portion 244C of the second conductive layer 244*a*, and the charging portion 244S.

The connection portion 244C of the second conductive layer 244*a* is a portion of the second conductive layer 244*a* relatively adjacent, or close, to the first surface 200F of the first substrate 200, and the charging portion 244S and the narrow charging portion 244SL of the second conductive layer 244*a* is a portion of the second conductive layer 244*a* relatively adjacent, or close, to the second surface 200B of the first substrate 200. The connection portion 244C of the second conductive layer 244*a* may be located between the second insulating layer 234 and the third insulating layer 236, and the charging portion 244S and the narrow charging portion 244SL may extend into the second insulating layer 234 from the connection portion 244C. The connection portion 244C of the second conductive layer 244*a* may extend from the charging portion 244S of the second conductive layer 244*a* toward the first surface 200F of the first substrate 200, the charging portion 244S may extend from the connection portion 244C to the second surface 200B of the first substrate 200, and the narrow charging portion 244SL may extend from the connection portion 244C toward the second surface 200B of the first substrate 200. An extension length of the charging portion 244S in a vertical direction may be greater than an extension length of the narrow charging portion 244SL. A horizontal width of the charging portion 244S may be greater than a horizontal width of the narrow charging portion 244SL.

The charging portion 244S and the narrow charging portion 244SL of the second conductive layer 244*a* may fill all of the inner space defined by the second insulating layer 234. The second insulating layer 234 and the third insulating layer 236 is in contact with each other in the narrow region DTIN of the pixel separation region DTIa, but may not be in contact with each other in the wide region DTIW of the pixel separation region DTIa. In the wide region DTIW of the pixel separation region DTIa, the second insulating layer 234 and the third insulating layer 236 may be spaced apart from each other with the connection portion 244C of the second conductive layer 244*a* therebetween.

The connection portion 244C of the second conductive layer 244*a* may be located between the second insulating layer 234 and the third insulating layer 236, and may be in contact with the first conductive layer 242. The charging portion 244S and the narrow charging portion 244SL of the second conductive layer 244*a* may be spaced apart from the first conductive layer 242 with the second insulating layer 234 therebetween. The second conductive layer 244*a* may be connected to and in contact with the first conductive layer 242 in a portion adjacent to the first surface 200F of the first substrate 200, and may be spaced apart from the first conductive layer 242 with the second insulating layer 234 therebetween, in a portion adjacent to the second surface 200B. The second conductive layer 244*a* may be connected to and in contact with the first conductive layer 242 in a portion adjacent to an edge of each of the plurality of photo-sensing elements PD, and may be spaced apart from the first conductive layer 242 with the second insulating layer 234 therebetween, in a portion adjacent to a portion spaced apart from an edge from among sides of each of the plurality of photo-sensing elements PD. The first conductive layers 242 may be spaced apart from each other in the pixel separation region DTIa and may be electrically connected to each other by the connection portion 244C of the second conductive layer 244*a*.

Figure 12A:
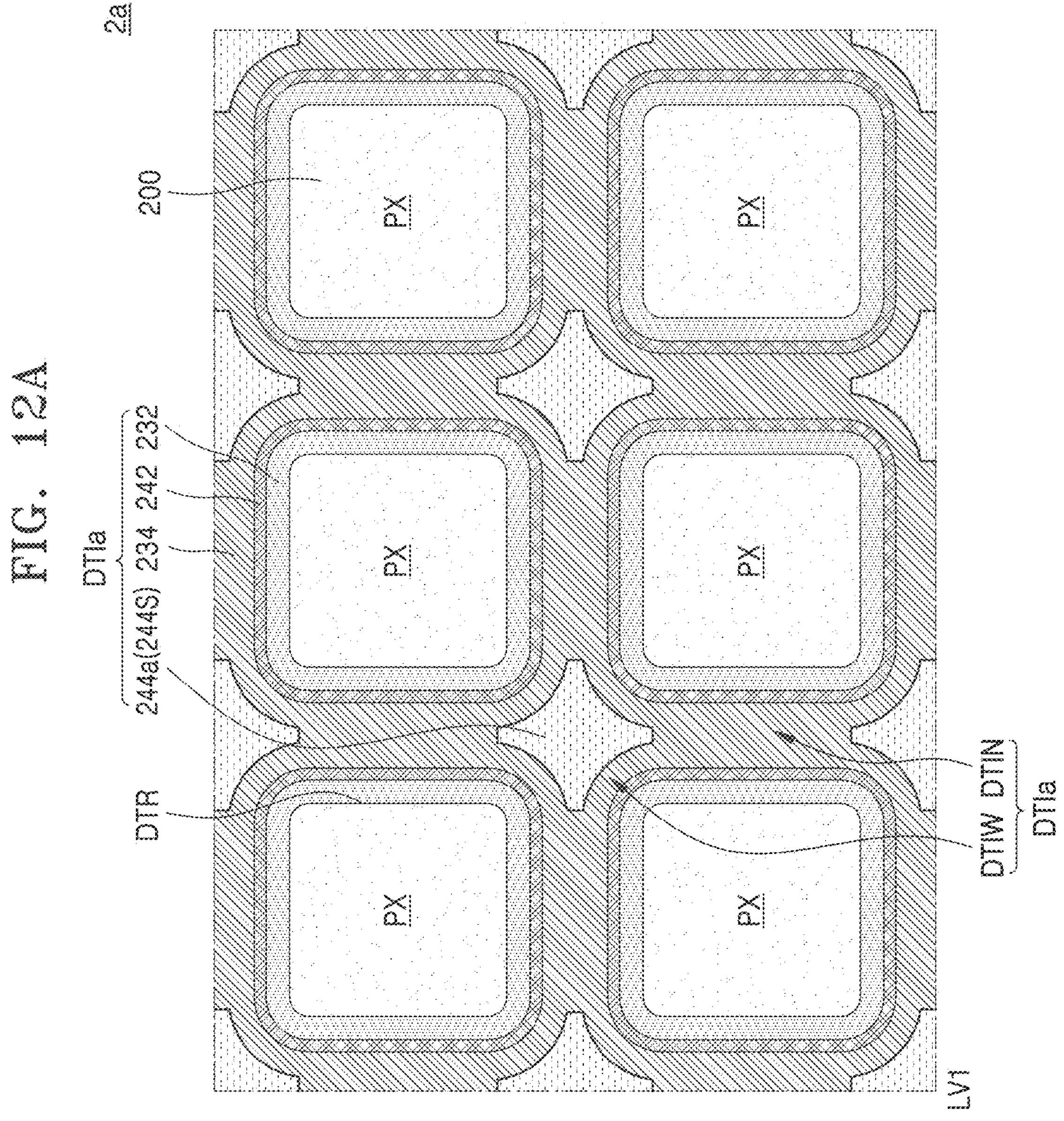
FIGS. 12A and 12B are horizontal cross-sectional views of an image sensor according to some example embodiments.
Figure 12B:
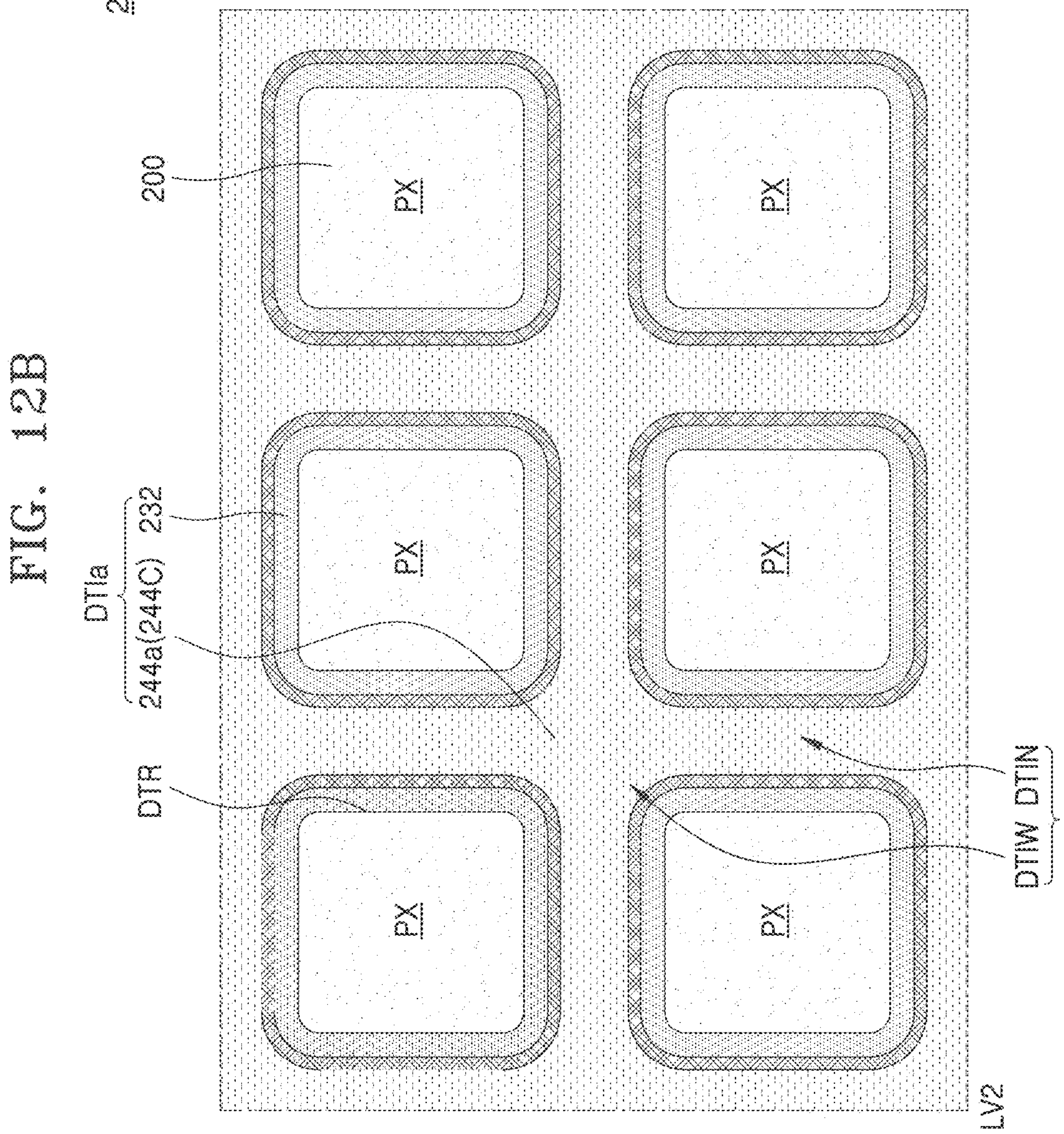

FIGS. 12A and 12B are horizontal cross-sectional views of the image sensor 2*a* according to some example embodiments. FIG. 12A is a horizontal cross-sectional view of a portion in FIGS. 10A and 10B, taken along the first vertical level LV1 in FIGS. 10A and 10B, and FIG. 12B is a horizontal cross-sectional view of a portion in FIGS. 10A and 10B, taken along the second vertical level LV2 in FIGS. 10A and 10B.

Referring to FIGS. 12A and 12B together with FIGS. 10A and 10B, the image sensor 2*a* may include the optical element substrate WFO having the plurality of unit pixels PX including the plurality of photo-sensing elements PD, the plurality of microlenses 550 disposed on the optical element substrate WFO, and the plurality of color filter layers 530 located between the optical element substrate WFO and the plurality of microlenses 550.

The element separation region STI and the pixel separation region DTIa may be arranged in the first substrate 200. The plurality of unit pixels PX may be defined by the pixel separation region DTIa, and the pixel separation region DTIa may surround each of the plurality of photo-sensing elements in a plan view in the first substrate 200. The pixel separation region DTIa may include the first insulating layer 232, the second insulating layer 234, the third insulating layer 236, the first conductive layer 242, and the second conductive layer 244*a*. The first insulating layer 232, the second insulating layer 234, the third insulating layer 236, the first conductive layer 242, and the second conductive layer 244*a* may be arranged in the narrow region DTIN of the pixel separation region DTIa. In the wide region DTIW of the pixel separation region DTIa, the first insulating layer 232, the second insulating layer 234, the third insulating layer 236, the first conductive layer 242, and the second conductive layer 244*a* may be arranged. The second conductive layer 244*a* may include the connection portion 244C, the charging portion 244S, and the narrow charging portion 244SL. The first conductive layers 242 may be spaced apart from each other in the pixel separation region DTIa and may be electrically connected to each other by the connection portion 244C of the second conductive layer 244*a*.

Figure 13A:
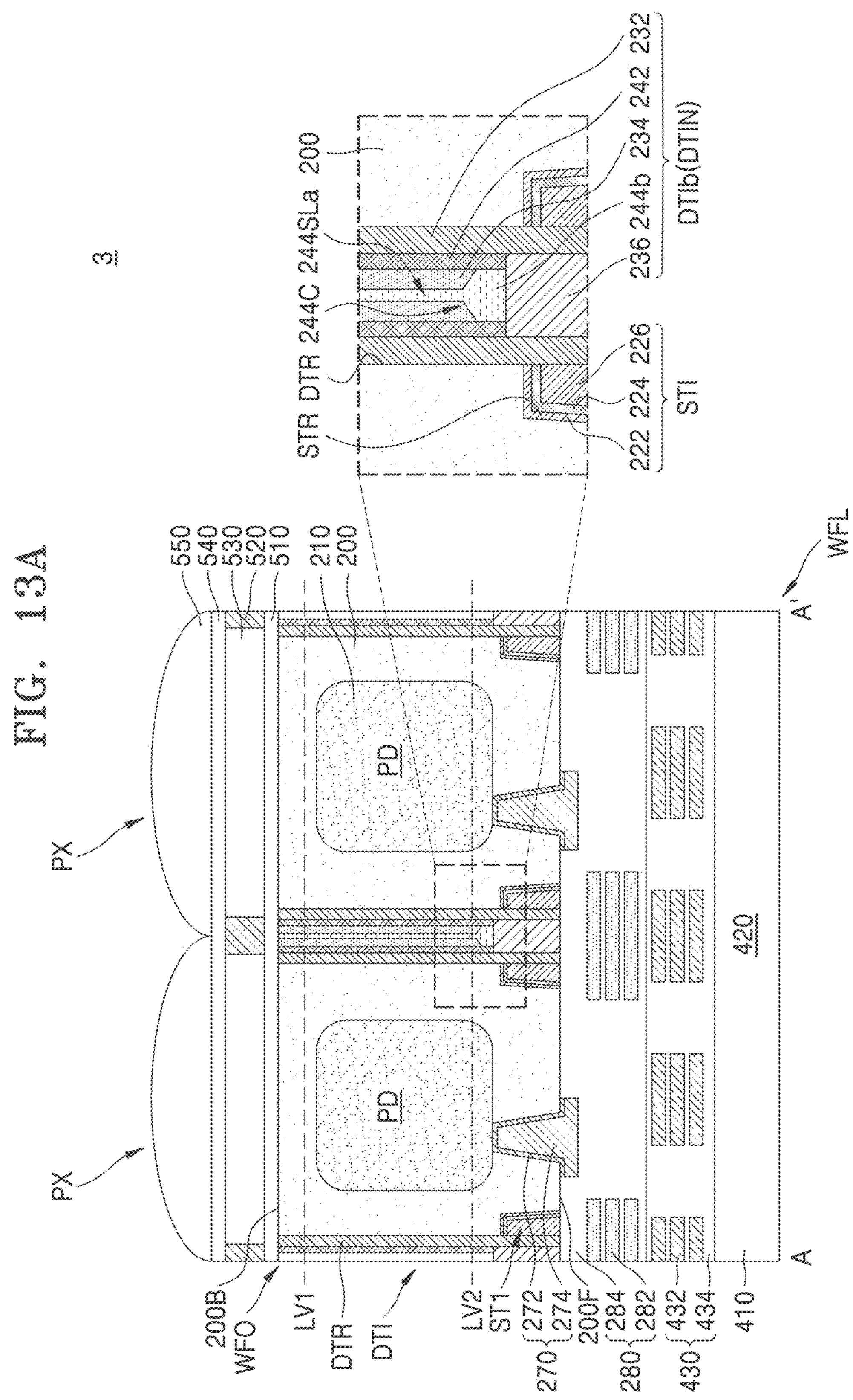
FIGS. 13A and 13B are vertical cross-sectional views of an image sensor according to some example embodiments.
Figure 13B:
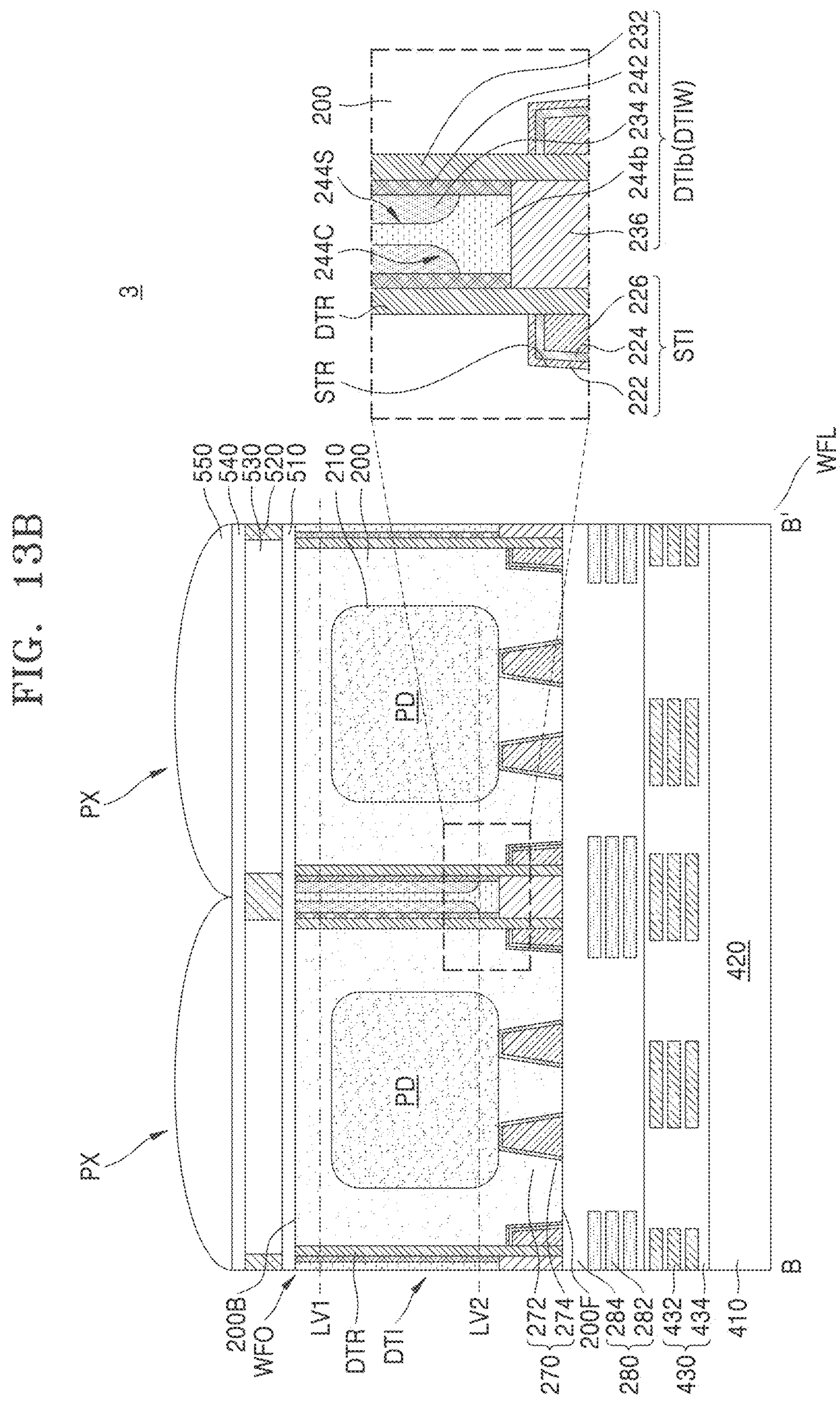
Figure 14A:
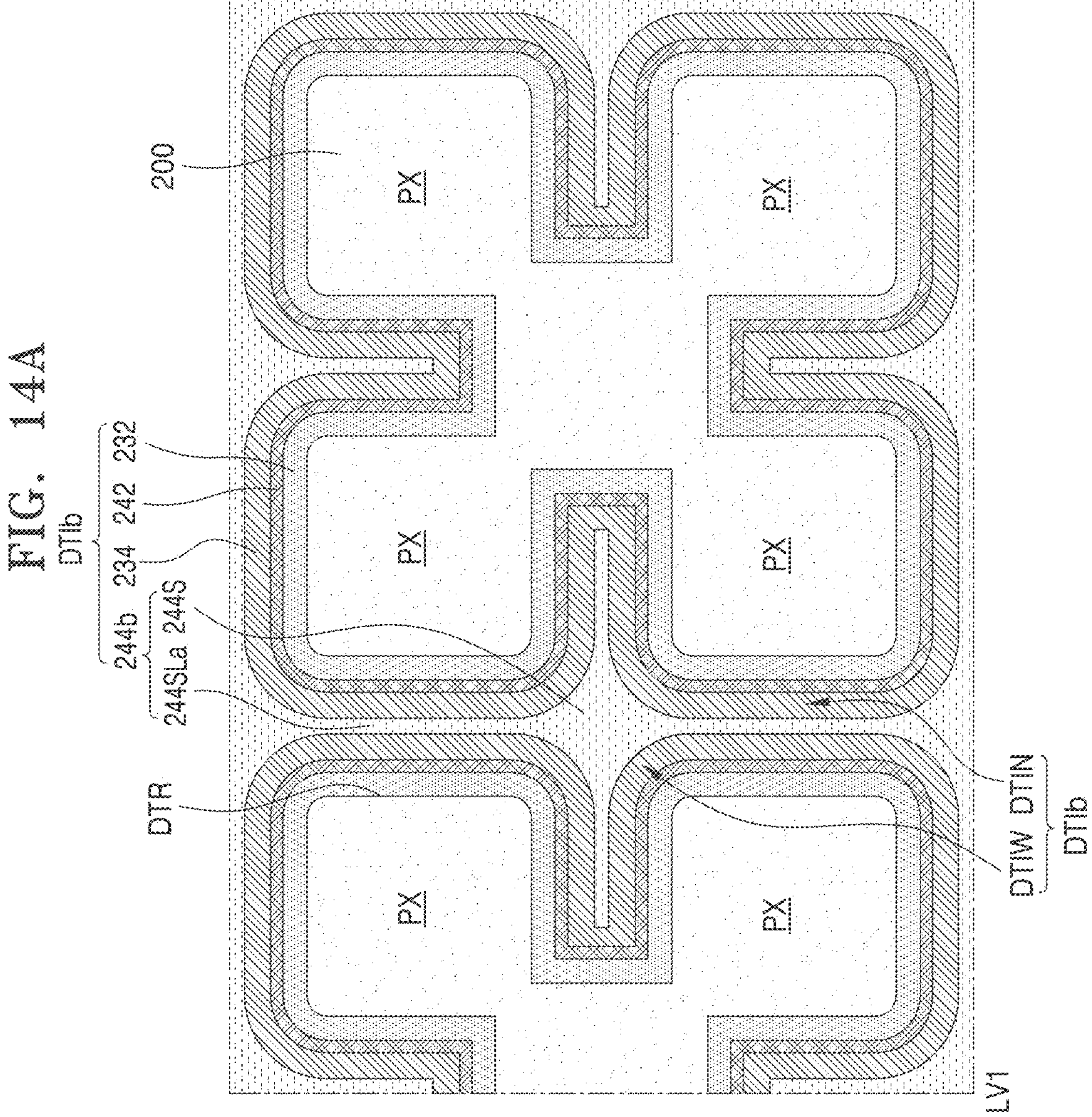
FIGS. 14A and 14B are horizontal cross-sectional views.
Figure 14B:
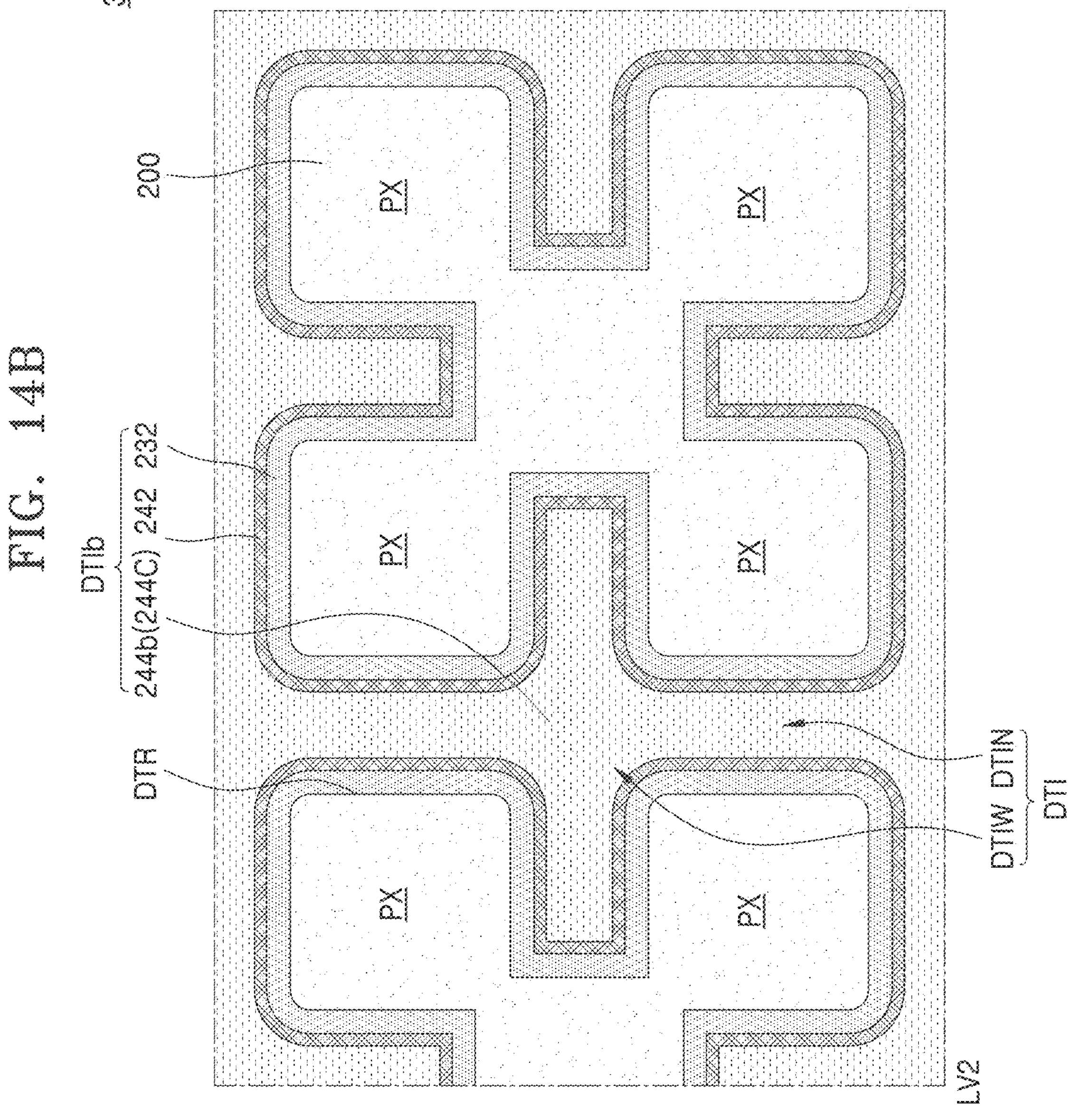

FIGS. 13A and 13B are vertical cross-sectional views of the image sensor 3 according to some example embodiments, and FIGS. 14A and 14B are horizontal cross-sectional views of the same. In detail, FIG. 13A is a vertical cross-sectional view of a portion in FIG. 4, taken along line A-A' in FIG. 4, FIG. 13B is a vertical cross-sectional view of a portion in FIG. 4, taken along line B-B' in FIG. 4, FIG. 14A is a horizontal cross-sectional view taken along the first vertical level LV1 in FIGS. 13A and 13B, and FIG. 14B is a horizontal cross-sectional view taken along the second vertical level LV2 in FIGS. 13A and 13B.

Referring to FIGS. 13A, 13B, 14A, and 14B together, the image sensor 3 may include the optical element substrate WFO having the plurality of unit pixels PX including the plurality of photo-sensing elements PD, the plurality of microlenses disposed on the optical element substrate WFO, and the plurality of color filter layers 530 located between the optical element substrate WFO and the plurality of microlenses 550.

The element separation region STI and a pixel separation region DTIb may be arranged in the first substrate 200. The plurality of unit pixels PX may be defined by the pixel separation region DTIb, and the pixel separation region DTIb may surround at least a portion of each of the plurality of photo-sensing elements PD in a plan view in the first substrate 200. The pixel separation region DTIb may be arranged between one photo-sensing element PD from among the plurality of photo-sensing elements PD and another photo-sensing element PD adjacent thereto. The pixel separation region DTIb may be arranged between each of the plurality of photo-sensing elements PD arranged in a matrix form in a plan view, and may have a grid or mesh shape in a plan view.

The pixel separation region DTIb may be formed in the pixel separation recess DTR extending from the first surface 200F of the first substrate 200 to the second surface 200B. For example, a pixel separation recess DTRb may pass through the first substrate 200, and the element separation recess STR may not pass through the first substrate 200. In some example embodiments, the pixel separation region DTIb may overlap a portion of the element separation region STI in a vertical direction.

The pixel separation region DTIb may include the first insulating layer 232, the second insulating layer 234, the third insulating layer 236, the first conductive layer 242, and a second conductive layer 244*b*. The first insulating layer 232, the second insulating layer 234, the third insulating layer 236, the first conductive layer 242, and the second conductive layer 244*b* may be arranged in the narrow region DTIN of the pixel separation region DTIb. In the wide region DTIW of the pixel separation region DTIb, the first insulating layer 232, the second insulating layer 234, the third insulating layer 236, the first conductive layer 242, and the second conductive layer 244*b* may be arranged.

The second insulating layer 234 may not fill all of the inner space defined by the first conductive layer 242 in each of the narrow region DTIN and the wide region DTIW of the pixel separation region DTIb. The inner space defined by the first conductive layer 242 in the narrow region DTIN and the wide region DTIW of the pixel separation region DTIb may all be filled with the second insulating layer 234 and the second conductive layer 244*b*.

The second conductive layer 244*b* may include the connection portion 244C, the charging portion 244S, and a narrow charging portion 244SLa. The inner space defined by the first conductive layers 242 in the narrow region DTIN of the pixel separation region DTIb may all be filled with the second insulating layer 234 and the connection portion 244C and the narrow charging portion 244SLa of the second conductive layer 244*b*, and the inner space defined by the first conductive layer 242 in the wide region DTIW of the pixel separation region DTIb may all be filled with the second insulating layer 234, the connection portion 244C of the second conductive layer 244*b*, and the charging portion 244S.

The connection portion 244C of the second conductive layer 244*b* is a portion of the second conductive layer 244*b* relatively adjacent, or close, to the first surface 200F of the first substrate 200, and the charging portion 244S and the narrow charging portion 244SLa of the second conductive layer 244*b* is a portion of the second conductive layer 244*b* relatively adjacent, or close, to the second surface 200B of the first substrate 200. The connection portion 244C of the second conductive layer 244*b* is located between the second insulating layer 234 and the third insulating layer 236, and the charging portion 244S and the narrow charging portion 244SLa may extend into the second insulating layer 234 from the connection portion 244C. The connection portion 244C of the second conductive layer 244*b* may extend from the charging portion 244S of the second conductive layer 244*b* toward the first surface 200F of the first substrate 200, the charging portion 244S may extend from the connection portion 244C to the second surface 200B of the first substrate 200, and the narrow charging portion 244SLa may extend from the connection portion 244C toward the second surface 200B of the first substrate 200.

An extension length of the charging portion 244S in a vertical direction may be substantially equal to an extension length of the narrow charging portion 244SLa. A horizontal width of the charging portion 244S may be greater than a horizontal width of the narrow charging portion 244SLa.

The charging portion 244S and the narrow charging portion 244SLa of the second conductive layer 244*b* may fill all of the inner space defined by the second insulating layer 234. The second insulating layer 234 and the third insulating layer 236 may be in contact with each other in the narrow region DTIN of the pixel separation region DTIb, but may not be in contact with each other in the wide region DTIW of the pixel separation region DTIb. In the wide region DTIW of the pixel separation region DTIb, the second insulating layer 234 and the third insulating layer 236 may be spaced apart from each other with the connection portion 244C of the second conductive layer 244*b* therebetween.

The connection portion 244C of the second conductive layer 244*b* may be located between the second insulating layer 234 and the third insulating layer 236 and may be in contact with the first conductive layer 242. The charging portion 244S and the narrow charging portion 244SLa of the second conductive layer 244*b* may be spaced apart from the first conductive layer 242 with the second insulating layer 234 therebetween. The second conductive layer 244*b* may be in contact with and connected to the first conductive layer 242 in a portion adjacent to the first surface 200F of the first substrate 200, and may be spaced apart from the first conductive layer 242 with the second insulating layer 234 therebetween, in a portion adjacent to the second surface 200B. The second conductive layer 244*b* may be in contact with and connected to the first conductive layer 242 in a portion adjacent to an edge of each of the plurality of photo-sensing elements PD, and may be spaced apart from the first conductive layer 242 with the second insulating layer 234 therebetween, in a portion adjacent to a portion spaced apart from an edge from among a side of each of the plurality of photo-sensing elements PD. The first conductive layers 242 may be spaced apart from each other in the pixel separation region DTIb and may be electrically connected to each other by the connection portion 244C of the second conductive layer 244*b*.

Figure 15A:
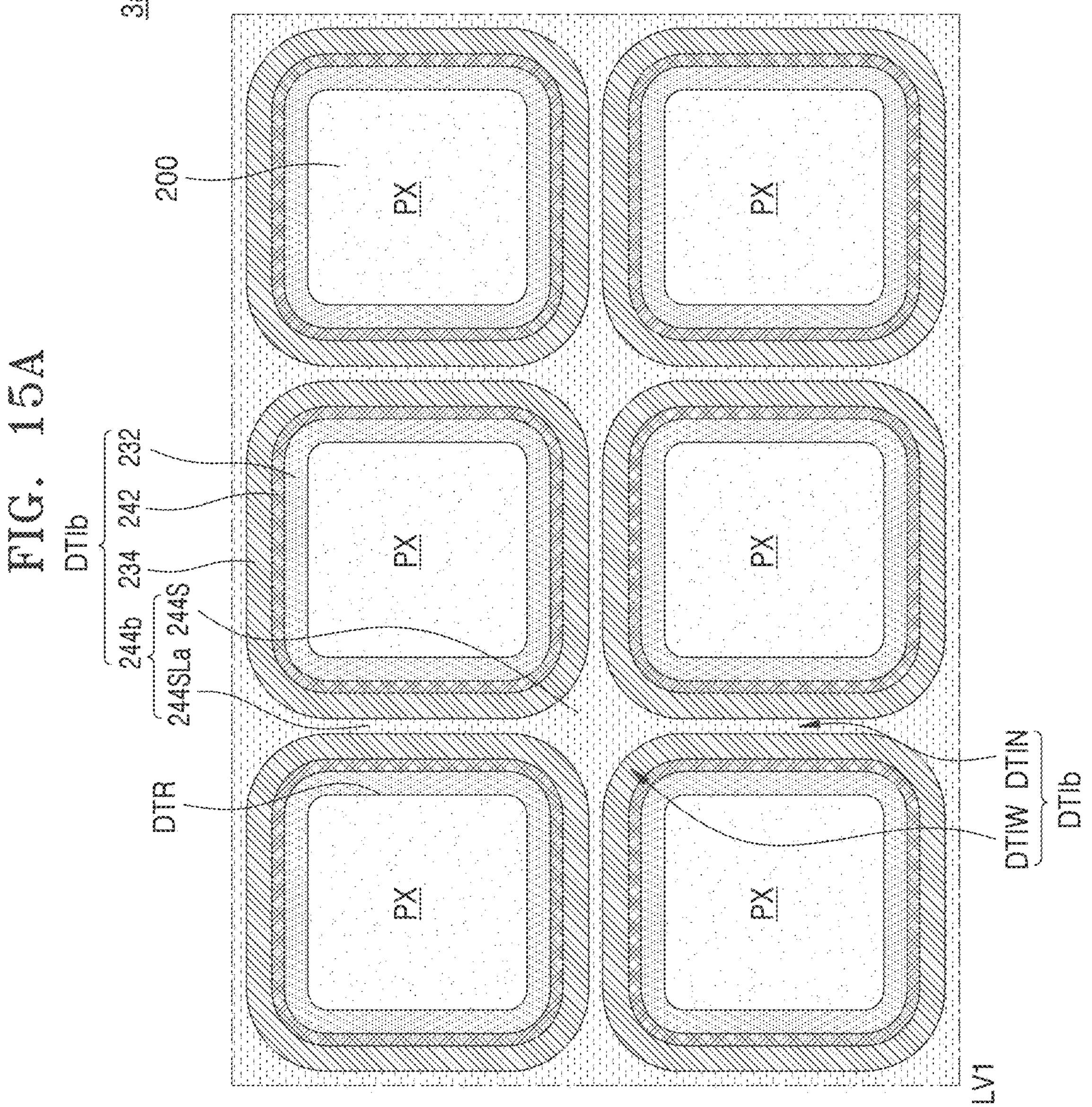
FIGS. 15A and 15B are horizontal cross-sectional views of an image sensor according to some example embodiments.
Figure 15B:
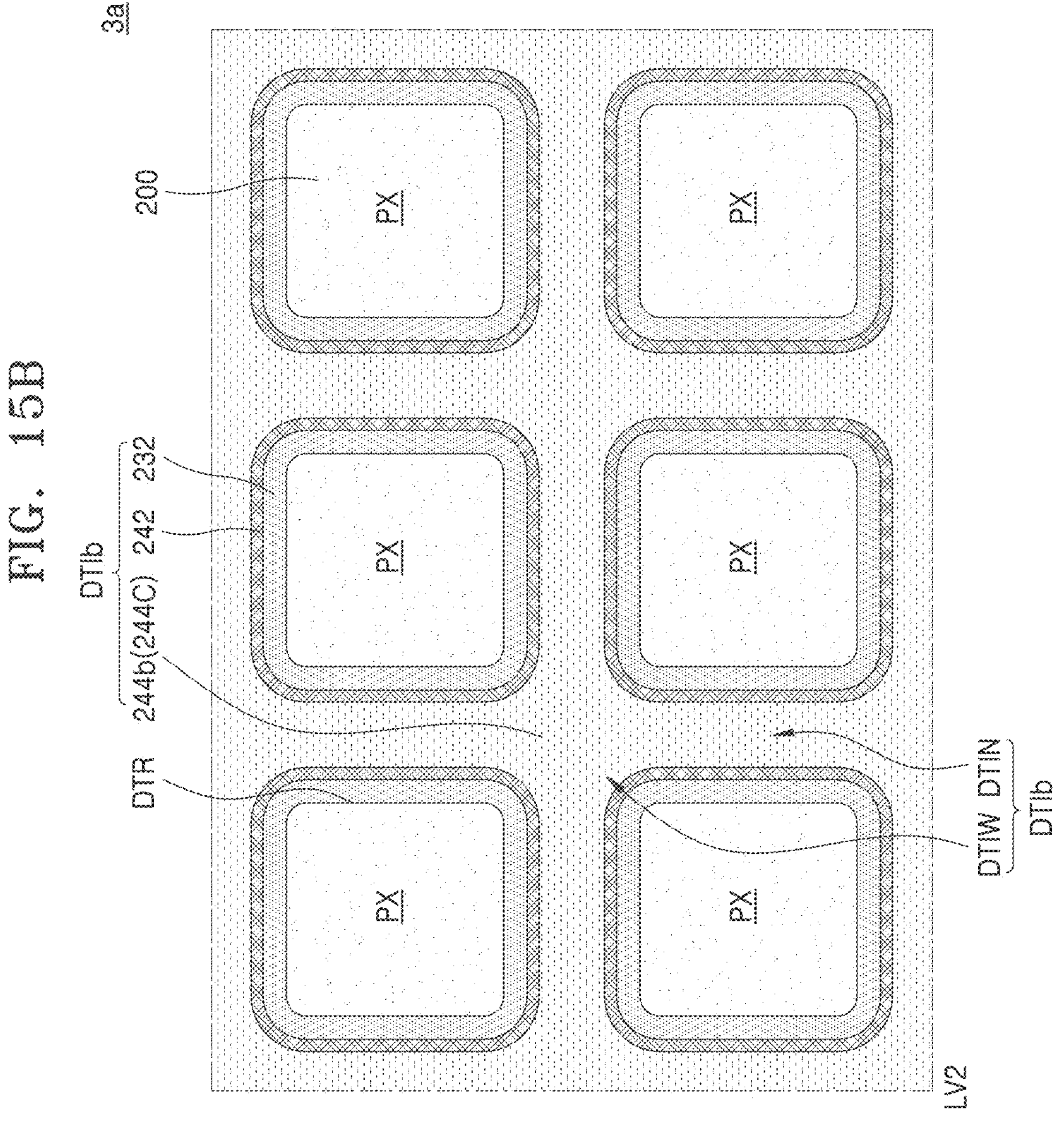

FIGS. 15A and 15B are horizontal cross-sectional views of the image sensor 3*a* according to some example embodiments. FIG. 15A is a horizontal cross-sectional view of a portion in FIGS. 13A and 13B, taken along the first vertical level LV1 in FIGS. 10A and 10B, and FIG. 15B is a horizontal cross-sectional view of a portion in FIGS. 13A and 13B, taken along the second vertical level LV2 in FIGS. 13A and 13B.

Referring to FIGS. 15A and 15B together with FIGS. 13A and 13B, the image sensor 3*a* may include the optical element substrate WFO having the plurality of unit pixels PX including the plurality of photo-sensing elements PD, the plurality of microlenses 550 disposed on the optical element substrate WFO, and the plurality of color filter layers 530 located between the optical element substrate WFO and the plurality of microlenses 550.

The element separation region STI and a pixel separation region DTIb may be arranged in the first substrate 200. The plurality of unit pixels PX may be defined by the pixel separation region DTIb, and the pixel separation region DTIb may surround each of the plurality of photo-sensing elements in a plan view in the first substrate 200. The pixel separation region DTIb may include the first insulating layer 232, the second insulating layer 234, the third insulating layer 236, the first conductive layer 242, and a second conductive layer 244*b*. The first insulating layer 232, the second insulating layer 234, the third insulating layer 236, the first conductive layer 242, and the second conductive layer 244*b* may be arranged in the narrow region DTIN of the pixel separation region DTIb. In the wide region DTIW of the pixel separation region DTIb, the first insulating layer 232, the second insulating layer 234, the third insulating layer 236, the first conductive layer 242, and the second conductive layer 244*b* may be arranged. The second conductive layer 244*b* may include the connection portion 244C, the charging portion 244S, and the narrow charging portion 244SLa. The first conductive layers 242 spaced apart from each other in the pixel separation region DTIb may be electrically connected to each other by the connection portion 244C of the second conductive layer 244*b*.

Figure 16A:
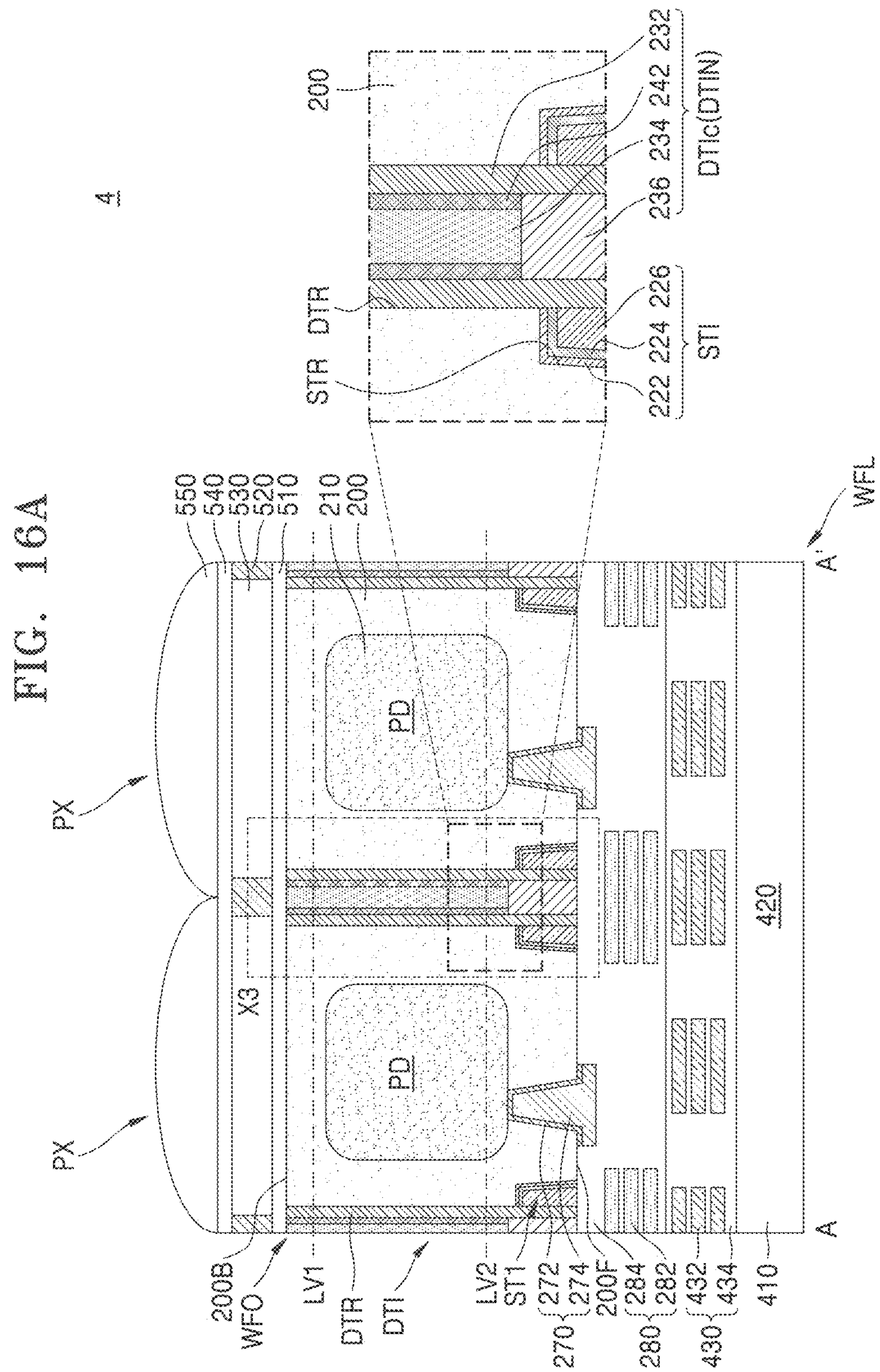
FIGS. 16A and 16B are vertical cross-sectional views of an image sensor according to some example embodiments.
Figure 16B:
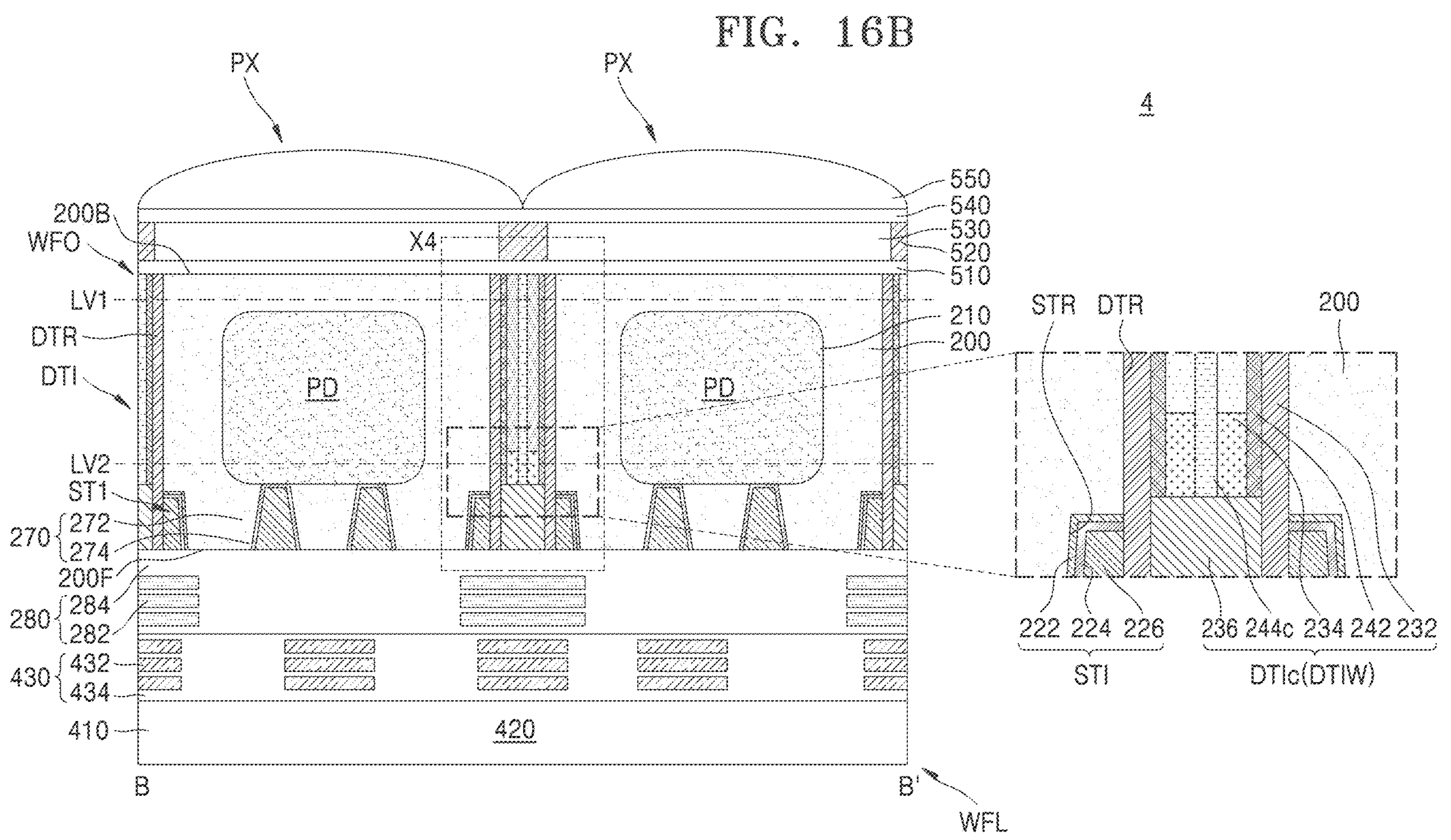
Figure 17A:
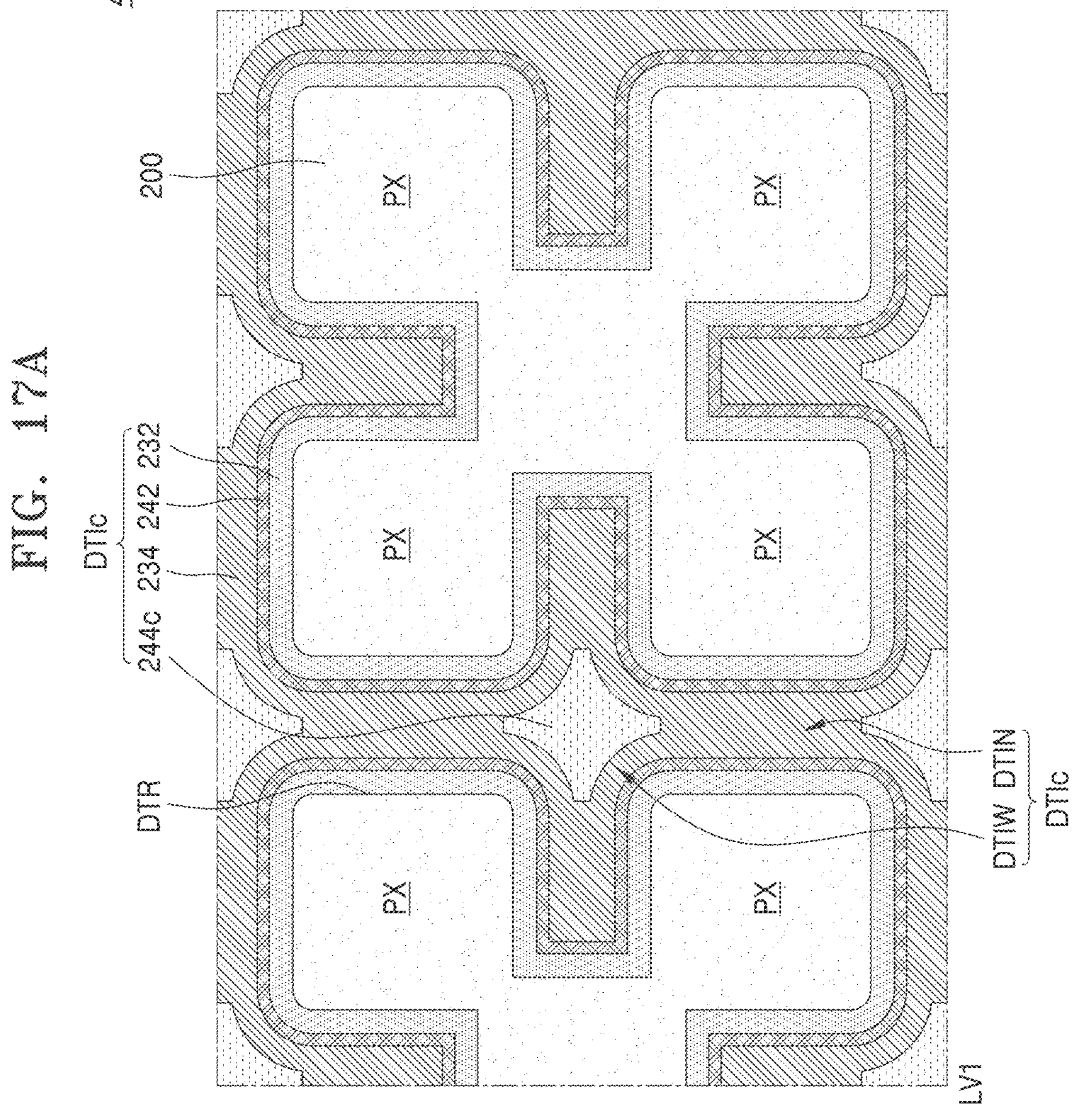
FIGS. 17A and 17B are horizontal cross-sectional views of the same.
Figure 17B:
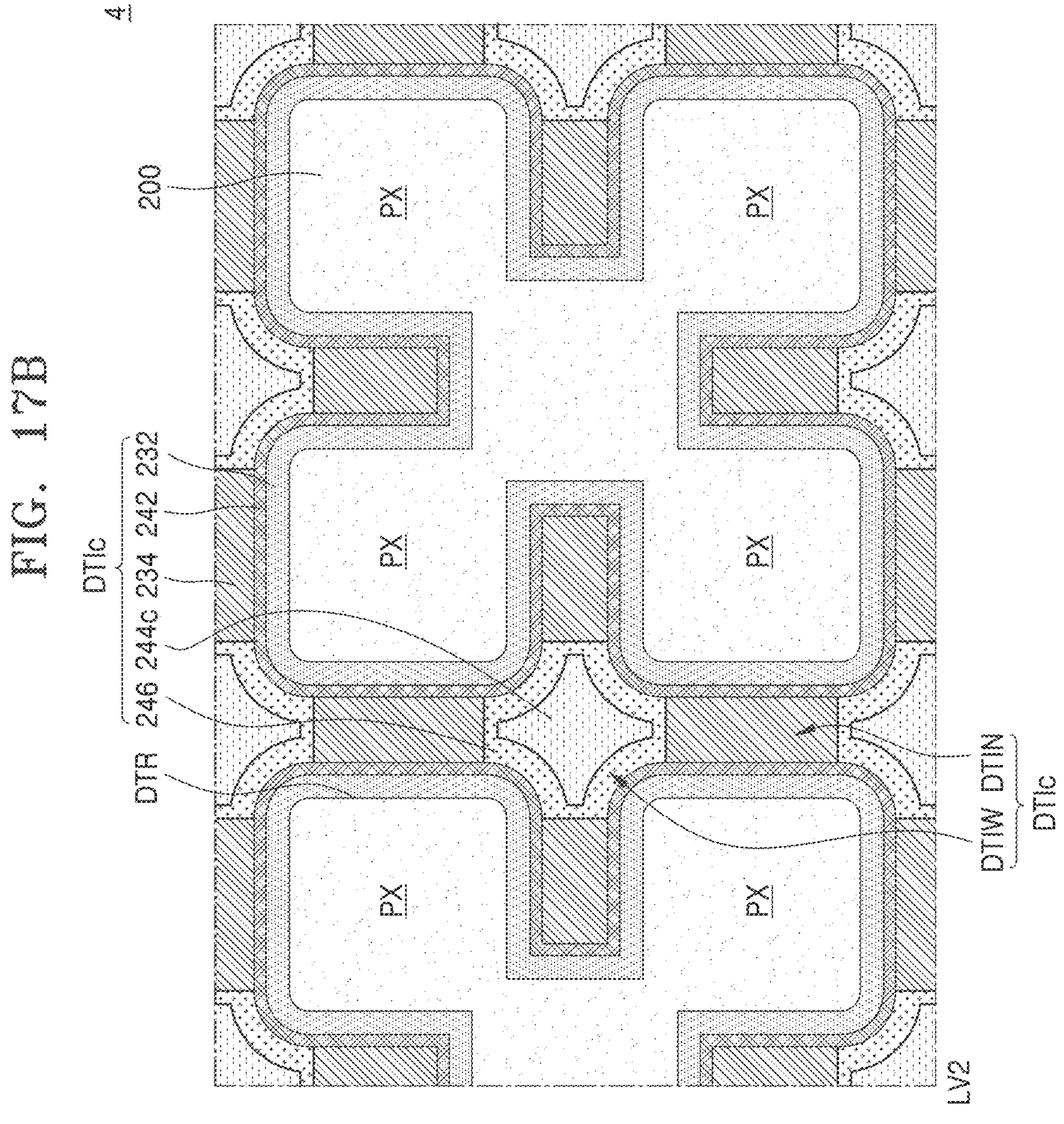

FIGS. 16A and 16B are vertical cross-sectional views of an image sensor 4 according to some example embodiments, and FIGS. 17A and 17B are horizontal cross-sectional views of the same. In detail, FIG. 16A is a vertical cross-sectional view of a portion in FIG. 4, taken along line A-A' in FIG. 4, FIG. 16B is a vertical cross-sectional view of a portion in FIG. 4, taken along line B-B' in FIG. 4, FIG. 17A is a horizontal cross-sectional view taken along the first vertical level LV1 in FIGS. 16A and 16B, and FIG. 17B is a horizontal cross-sectional view taken along the second vertical level LV2 in FIGS. 16A and 16B.

Referring to FIGS. 16A, 16B, 17A, and 17B together, the image sensor 4 may include the optical element substrate WFO having the plurality of unit pixels PX including the plurality of photo-sensing elements PD, the plurality of microlenses disposed on the optical element substrate WFO, and the plurality of color filter layers 530 located between the optical element substrate WFO and the plurality of microlenses 550.

The element separation region STI and a pixel separation region DTIc may be arranged in the first substrate 200. The plurality of unit pixels PX may be defined by the pixel separation region DTIc, and the pixel separation region DTIc may surround at least a portion of each of the plurality of photo-sensing element PD in a plan view in the first substrate 200. The pixel separation region DTIc may be arranged between one photo-sensing element PD from among the plurality of photo-sensing elements PD and another photo-sensing element PD adjacent thereto. The pixel separation region DTIc may be arranged between each of the plurality of photo-sensing elements PD arranged in a matrix form in a plan view, and may have a grid or mesh shape in a plan view.

The pixel separation region DTIc may be formed within the pixel separation recess DTR extending from the first surface 200F of the first substrate 200 to the second surface 200B. For example, the pixel separation recess DTRc may penetrate through the first substrate 200, and the element separation recess STR may not penetrate through the first substrate 200. In some example embodiments, the pixel separation region DTIc may overlap a portion of the element separation region STI in a vertical direction.

The pixel separation region DTIc may include the first insulating layer 232, the second insulating layer 234, the third insulating layer 236, the first conductive layer 242, the second conductive layer 244*c*, and a third conductive layer 246. Each of the first insulating layer 232, the second insulating layer 234, and the third insulating layer 236 may include an insulating material, such as silicon oxide, silicon nitride, silicon oxynitride, and/or metal oxide. Each of the first conductive layer 242, the second conductive layer 244*c*, and the third conductive layer 246 may include at least one of silicon, a metal, a metal silicide, a metal nitride, and/or a metal-containing film. For example, each of the first conductive layer 242, the second conductive layer 244*c*, and the third conductive layer 246 may include doped polysilicon. In the narrow region DTIN of the pixel separation region DTIc, the first insulating layer 232, the second insulating layer 234, the third insulating layer 236, and the first conductive layer 242 are arranged, but the second conductive layer 244*c* and the third conductive layer 246 may not be arranged. In the wide region DTIW of the pixel separation region DTIc, the first insulating layer 232, the second insulating layer 234, the third insulating layer 236, the first conductive layer 242, the second conductive layer 244*c*, and the third conductive layer 246 may be arranged.

The first insulating layer 232 may cover an inner wall of the pixel separation recess DTR. The first conductive layer 242 may cover a portion of a side surface of the first insulating layer 232 in the pixel separation recess DTR. For example, the first conductive layer 242 may extend from the second surface 200B of the first substrate 200 toward the first surface 200F, but may not extend to the first surface 200F. The first conductive layer 242 may conformally cover a portion of a side surface of the first insulating layer 232 in the pixel separation recess DTR and may not fill an entire space defined by the first insulating layer 232. In the inner space defined by the first conductive layer 242, the second insulating layer 234 may cover a portion of a side surface of the first conductive layer 242, and the third conductive layer 246 may cover the remaining portion of the side surface of the first conductive layer 242. The second insulating layer 234 and the third conductive layer 246 may not fill all of the inner space defined by the first conductive layer 242. The second conductive layer 244*c* may extend in a vertical direction from the third insulating layer 236. The second conductive layer 244*c* may fill all of the inner space defined by the second insulating layer 234 and the third conductive layer 246. The third insulating layer 236 may cover the first conductive layer 242, the second insulating layer 234, the second conductive layer 244*c*, and the third conductive layer 246 and fill the pixel separation region DTIc. The third insulating layer 236 may fill a portion adjacent to the first surface 200F of the first substrate 200 from among the inner space defined by the first insulating layer 232.

In the narrow region DTIN of the pixel separation region DTIc, the first insulating layer 232, the second insulating layer 234, the third insulating layer 236, and the first conductive layer 242 may be arranged, but the second conductive layer 244*c* and the third conductive layer 246 may not be arranged. In the wide region DTIW of the pixel separation region DTIc, the first insulating layer 232, the second insulating layer 234, the third insulating layer 236, the first conductive layer 242, the second conductive layer 244*c*, and the third conductive layer 246 may be arranged.

The second conductive layer 244*c* and the third conductive layer 246 may respectively correspond to the charging portion 244S and the connection portion 244C of the second conductive layer 244 shown in FIGS. 5A to 6B. The third conductive layer 246 may be located between the second insulating layer 234 and the third insulating layer 236 and may be in contact with the first conductive layer 242. The second conductive layer 244*c* may be spaced apart from the first conductive layer 242 with the third conductive layer 246 therebetween. The first conductive layers 242 spaced apart from each other in the pixel separation region DTIc may be electrically connected to each other by the third conductive layer 246. The second conductive layer 244*c* and the third conductive layer 246 may be collectively referred to as a second conductive layer, and portions of the second conductive layer 244*c* which protrude from the third conductive layer 246 and extend in a vertical direction may be referred to as a charging portion of the second conductive layer and a connection portion of the second conductive layer, respectively. For example, the charging portion 244S of the second conductive layer 244 shown in FIGS. 5A to 6B may be connected from the connection portion 244C to the second surface 200B of the first substrate 200, and the second conductive layer 244*c* may pass through the third conductive layer 246 and the second insulating layer 234 and extend from an upper surface of the third insulating layer 236 to the second surface 200B of the first substrate 200. Lower surfaces of the first conductive layer 242, the second conductive layer 244*c*, and the third conductive layer 246 may be located at the same vertical level, and upper surfaces of the first conductive layer 242 and the second conductive layer 244*c* may be located at the same vertical level.

Figure 18A:
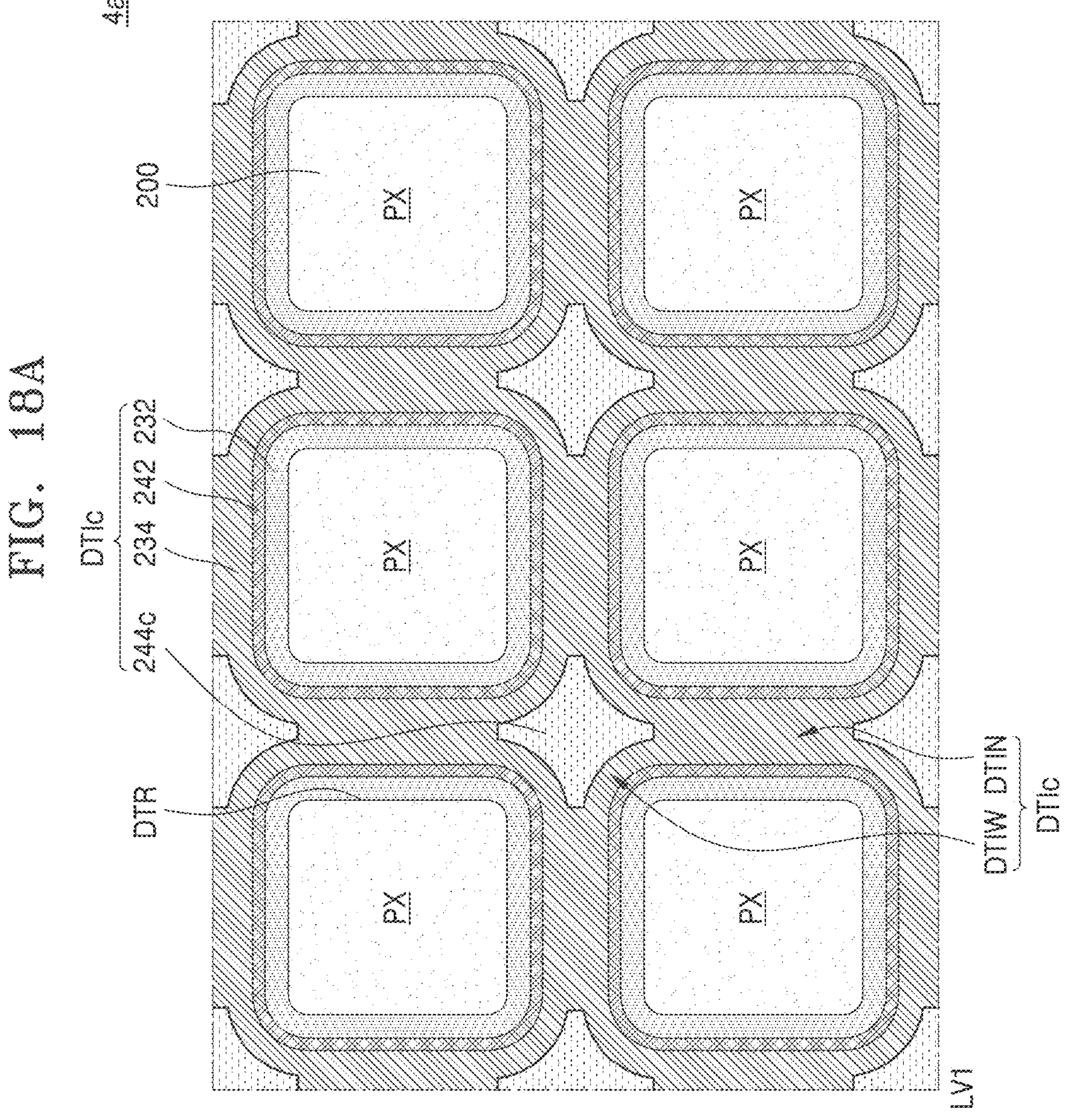
FIGS. 18A and 18B are horizontal cross-sectional views of an image sensor according to some example embodiments.
Figure 18B:
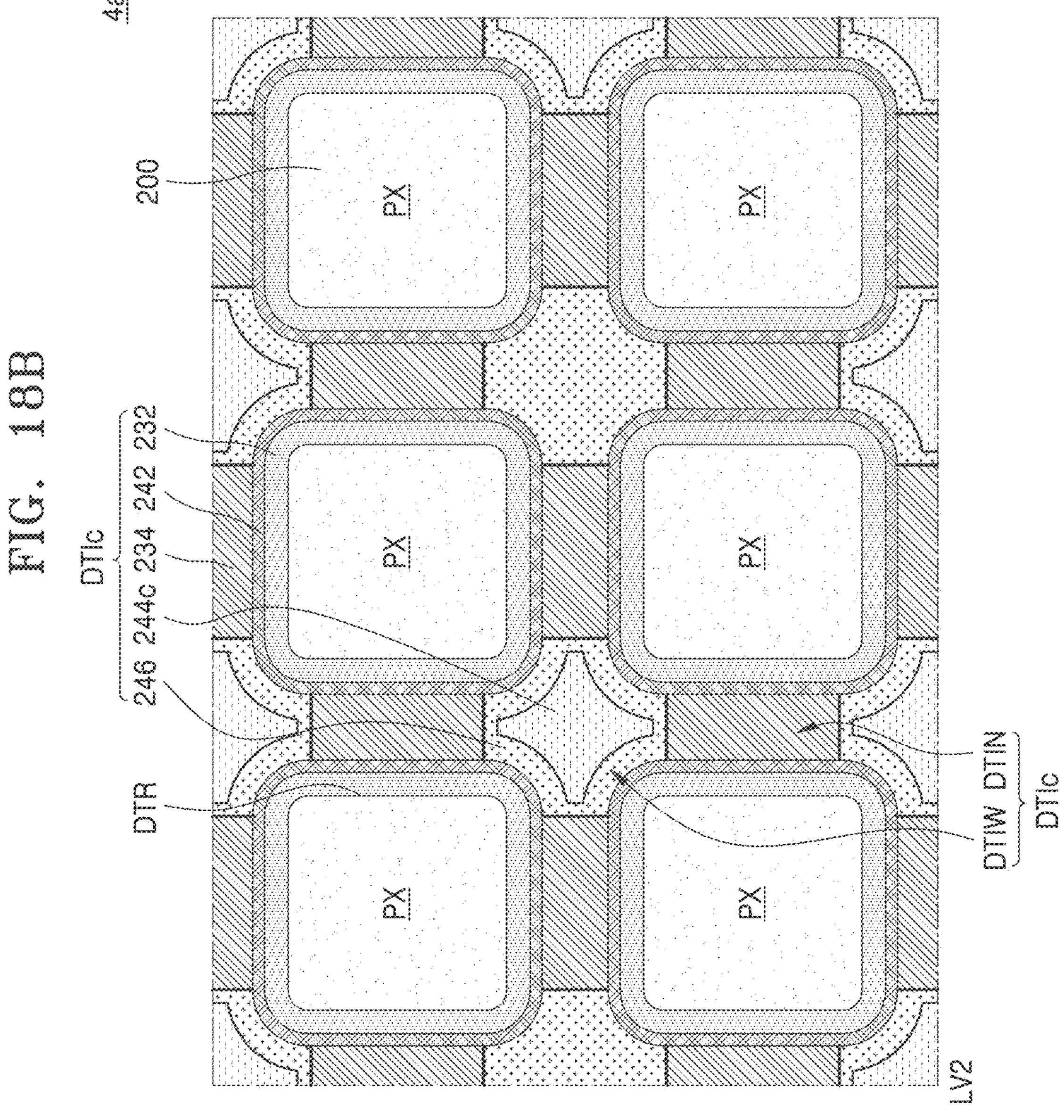

FIGS. 18A and 18B are horizontal cross-sectional views of the image sensor 4*a* according to some example embodiments. FIG. 18A is a horizontal cross-sectional view of a portion in FIGS. 16A and 16B, taken along the first vertical level LV1 in FIGS. 16A and 16B, and FIG. 18B is a horizontal cross-sectional view of a portion in FIGS. 16A and 16B, taken along the second vertical level LV2 in FIGS. 16A and 16B.

Referring to FIGS. 18A and 18B together with FIGS. 16A and 16B, the image sensor 4*a* may include the optical element substrate WFO having the plurality of unit pixels PX including the plurality of photo-sensing elements PD, the plurality of microlenses 550 disposed on the optical element substrate WFO, and the plurality of color filter layers 530 located between the optical element substrate WFO and the plurality of microlenses 550.

The element separation region STI and a pixel separation region DTIc may be arranged in the first substrate 200. The plurality of unit pixels PX may be defined by the pixel separation region DTIc, and the pixel separation region DTIc may surround each of the plurality of photo-sensing elements in a plan view in the first substrate 200. The pixel separation region DTIc may include the first insulating layer 232, the second insulating layer 234, the third insulating layer 236, the first conductive layer 242, the second conductive layer 244*c*, and the third conductive layer 246. The first insulating layer 232, the second insulating layer 234, the third insulating layer 236, and the first conductive layer 242 may be arranged in the narrow region DTIN of the pixel separation region DTIc. In the wide region DTIW of the pixel separation region DTIc, the first insulating layer 232, the second insulating layer 234, the third insulating layer 236, the first conductive layer 242, the second conductive layer 244*c*, and the third conductive layer 246 may be arranged. The first conductive layers 242 spaced apart from each other in the pixel separation region DTIc may be electrically connected to each other by the third conductive layer 246.

FIGS. 19A to 19L are vertical cross-sectional views illustrating a method of manufacturing an image sensor, according to an embodiment. In detail, FIGS. 19A to 19J are enlarged vertical cross-sectional views of each of a portion corresponding to region X3 in FIG. 16A and a portion corresponding to region X4 in FIG. 16B.

Figure 19A:
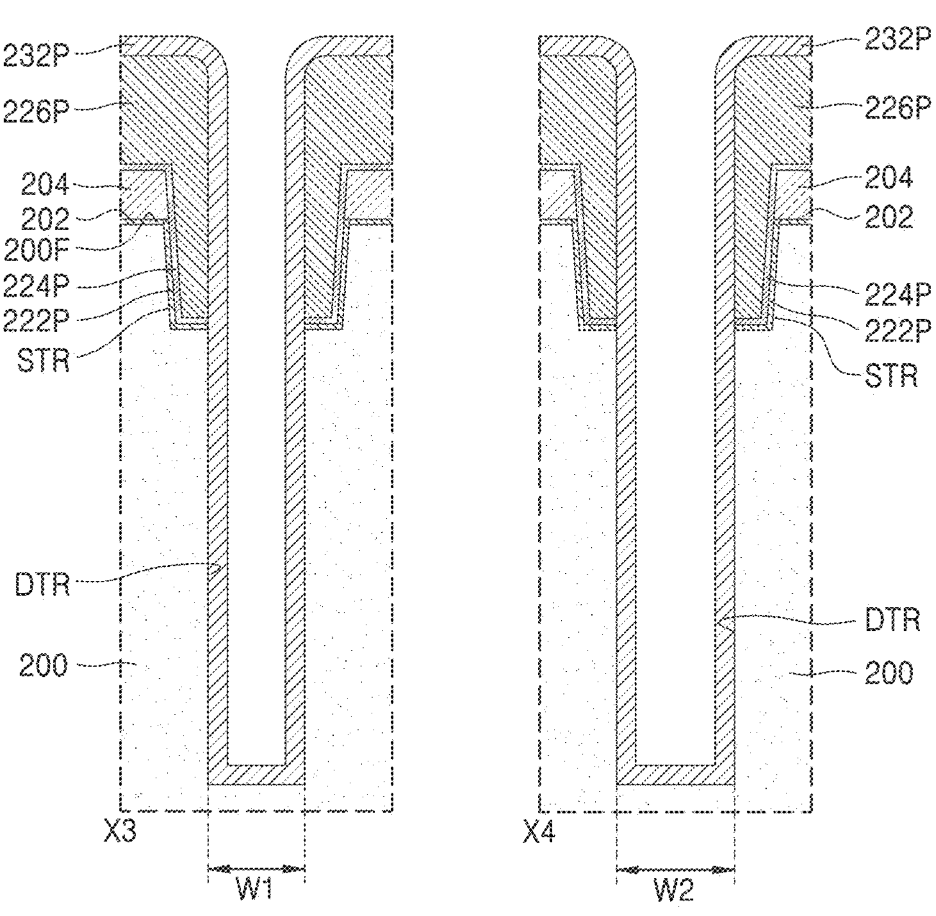
FIGS. 19A to 19L are vertical cross-sectional views illustrating a method of manufacturing an image sensor according to some example embodiments.

Referring to FIG. 19A, the element separation recess STR is formed by forming a first pad layer 202 and a second pad layer 204 on the first surface 200F of the first substrate 200 and then, removing a portion of each of the first pad layer 202, the second pad layer 204, and the first substrate 200. The element separation recess STR passes through the first pad layer 202 and the second pad layer 204 and may be formed to extend into the first substrate 200 from the first surface 200F of the first substrate 200. A preliminary first layer 222P, a preliminary second layer 224P, and a preliminary third layer 226P may be sequentially formed on the first substrate 200, the first pad layer 202, and the second pad layer 204, in which the element separation recess STR is formed.

A portion of each of the preliminary first layer 222P, the preliminary second layer 224P, the preliminary third layer 226P, and the first substrate 200 is removed to form the pixel separation recess DTR. The pixel separation recess DTR passes through the preliminary first layer 222P, the preliminary second layer 224P, and the preliminary third layer 226P, and may be formed to extend into the first substrate 200 from the first surface 200F of the first substrate 200. A portion of the pixel separation recess DTR may be formed to have a first horizontal width W1 that is relatively narrow, and other portions may be formed to have a second horizontal width W2 that is relatively wide.

The preliminary first insulating layer 232P may be formed on the preliminary first layer 222P, the preliminary second layer 224P, the preliminary third layer 226P, and the first substrate 200, in which the pixel separation recess DTR is formed.

Figure 19B:
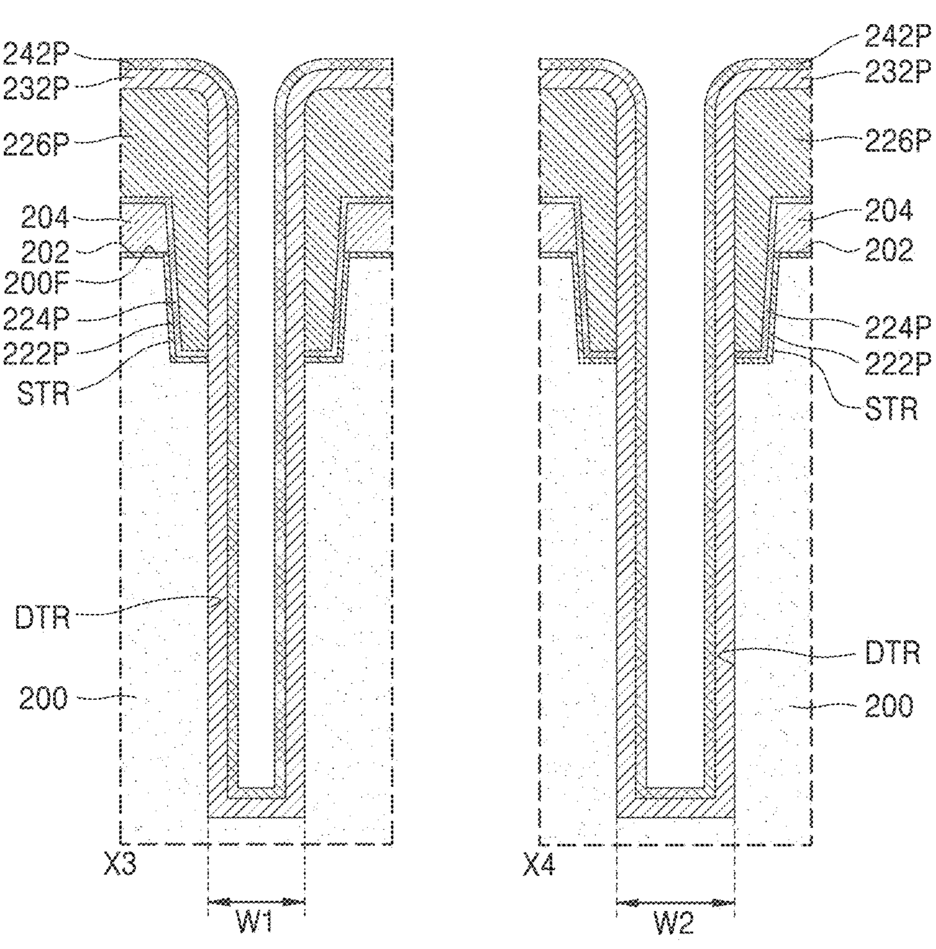

Referring to FIG. 19B, a preliminary first conductive layer 242P may be formed on the preliminary first insulating layer 232P.

Figure 19C:
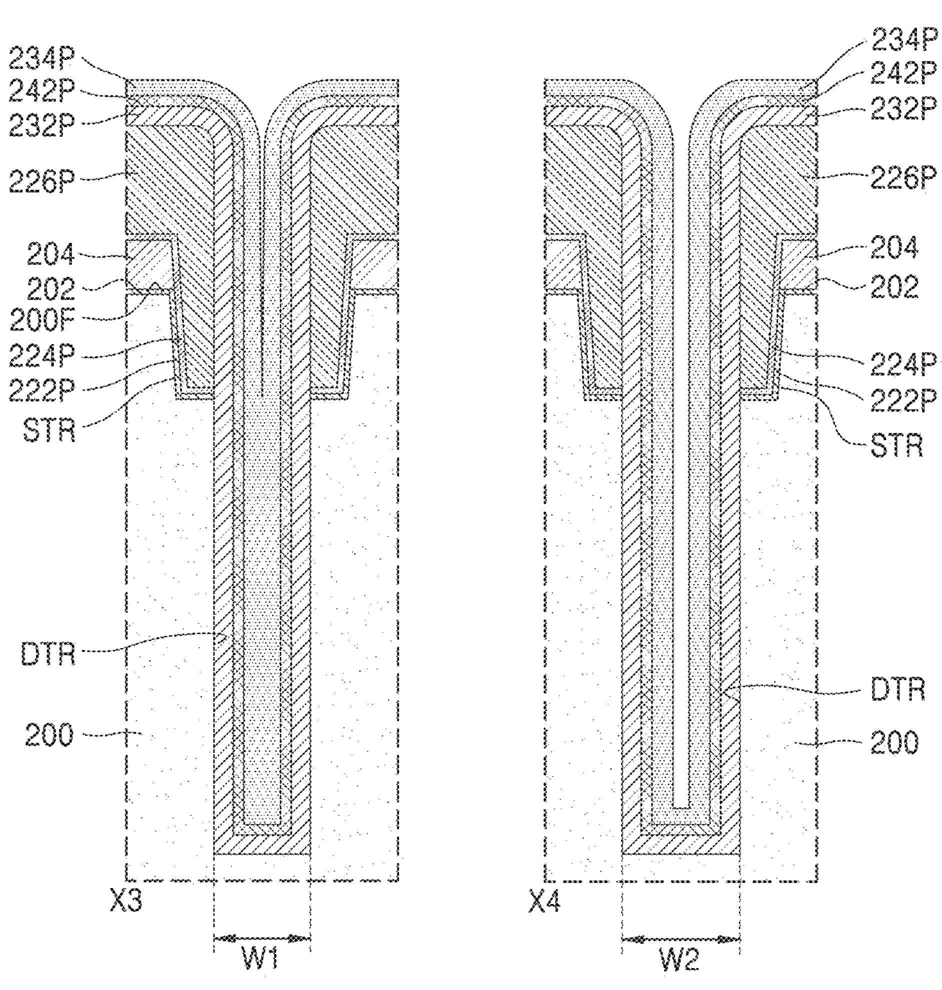

Referring to FIG. 19C, the preliminary second insulating layer 234P may be formed on the preliminary first conductive layer 242P.

Figure 19D:
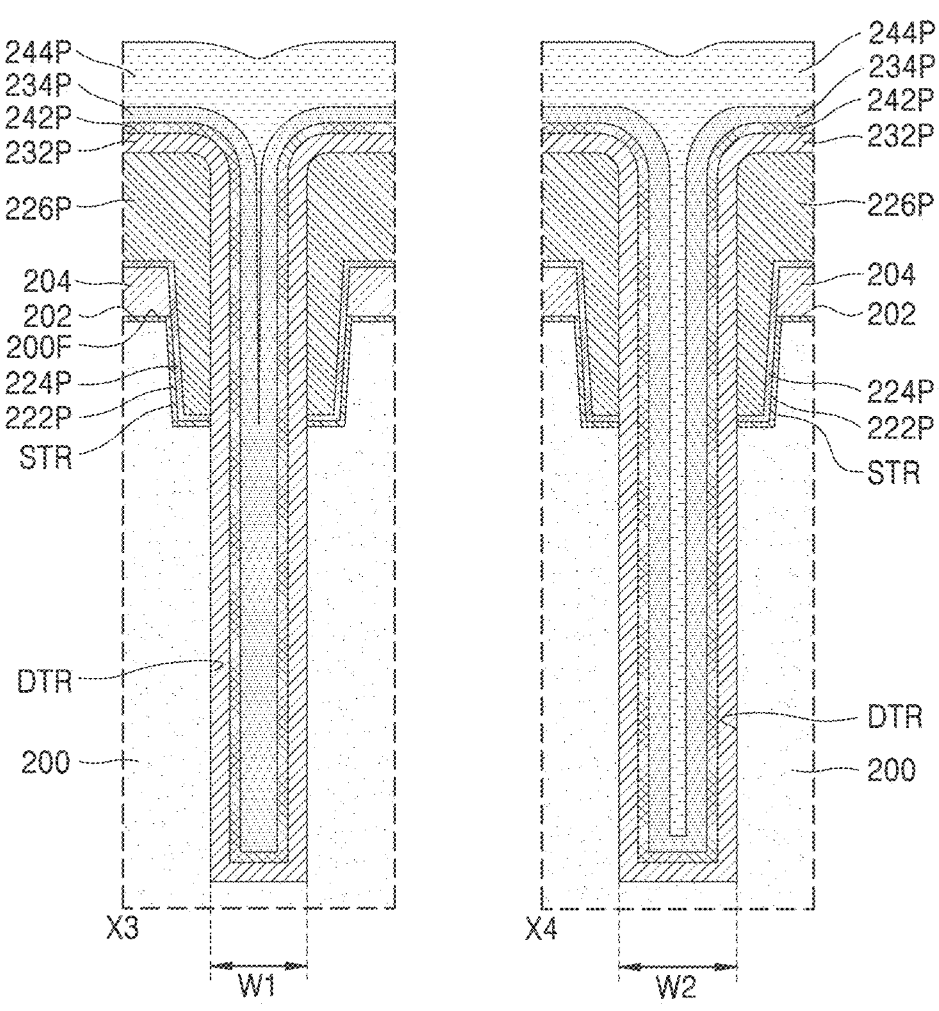

Referring to FIG. 19D, the preliminary second conductive layer 244P may be formed on the preliminary second insulating layer 234P. The preliminary second conductive layer 244P may be formed to fill of the inner space defined by the preliminary second insulating layer 234P.

Figure 19E:
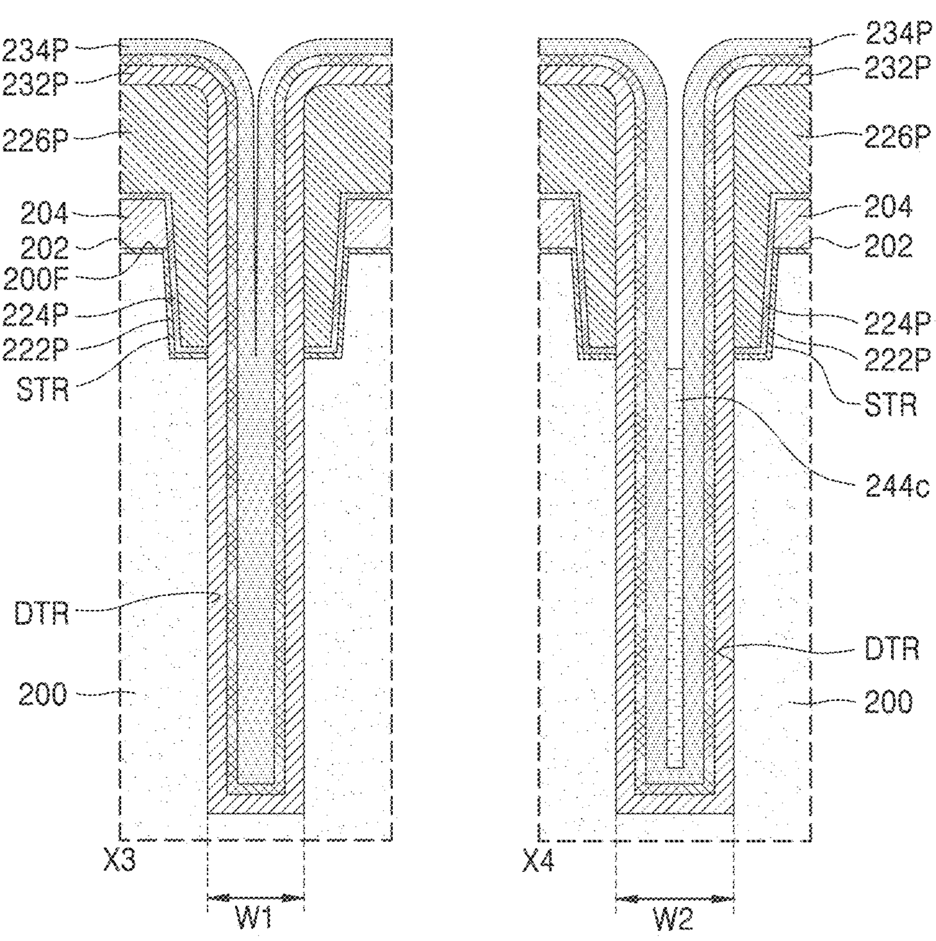

Referring to FIGS. 19D and 19E together, a portion of the preliminary second conductive layer 244P may be removed to form the second conductive layer 244*c*. A portion of the preliminary second conductive layer 244P filling the inner space defined by the preliminary second insulating layer 234P in a portion X3 of the pixel separation recess DTRc corresponding to the narrow region DTIN of FIGS. 16A to 18B may all be removed, an upper portion of the preliminary second conductive layer 244P filling the inner space defined by the preliminary second insulating layer 234P in a portion X4 of the pixel separation recess DTR corresponding to the wide region DTIW may be removed, and a lower portion of the preliminary second conductive layer 244P may remain as the second conductive layer 244*c*.

Figure 19F:
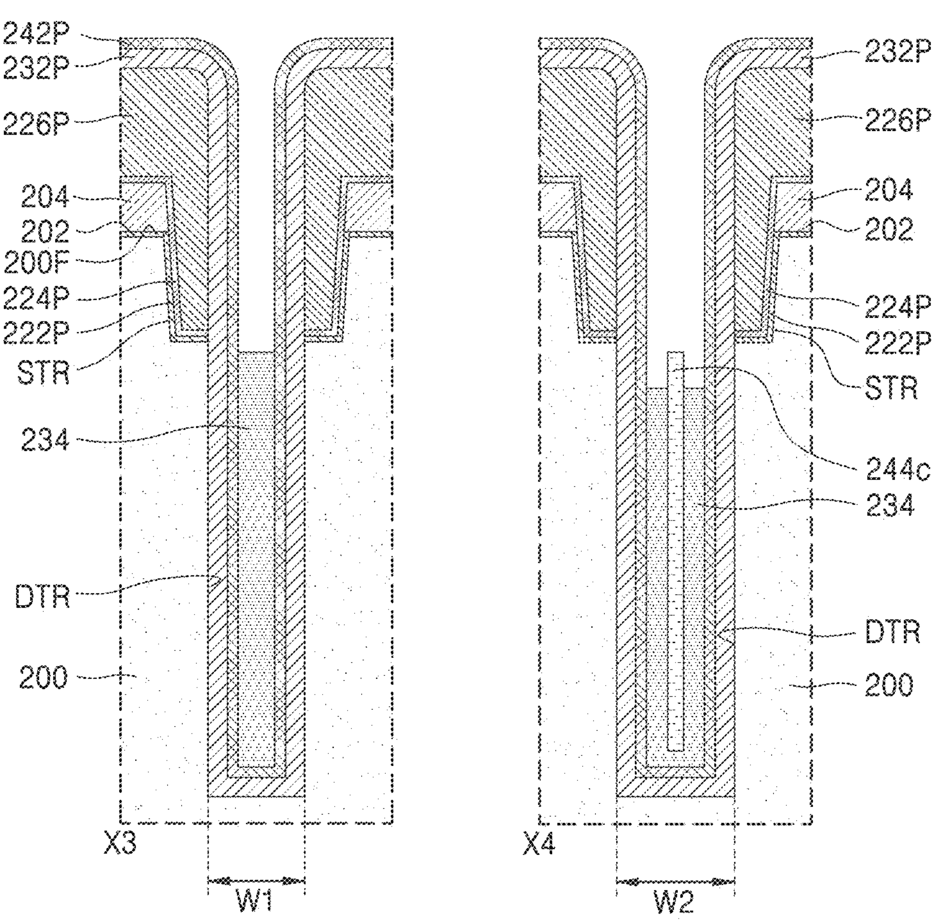

Referring to FIGS. 19E and 19F together, a portion of the preliminary second insulating layer 234P may be removed to form the second insulating layer 234. The second insulating layer 234 may be formed by, for example, removing a portion of the preliminary second insulating layer 234P so that an upper portion of the second conductive layer 244*c* protrudes more upward than an upper surface of the second insulating layer 234.

Figure 19G:
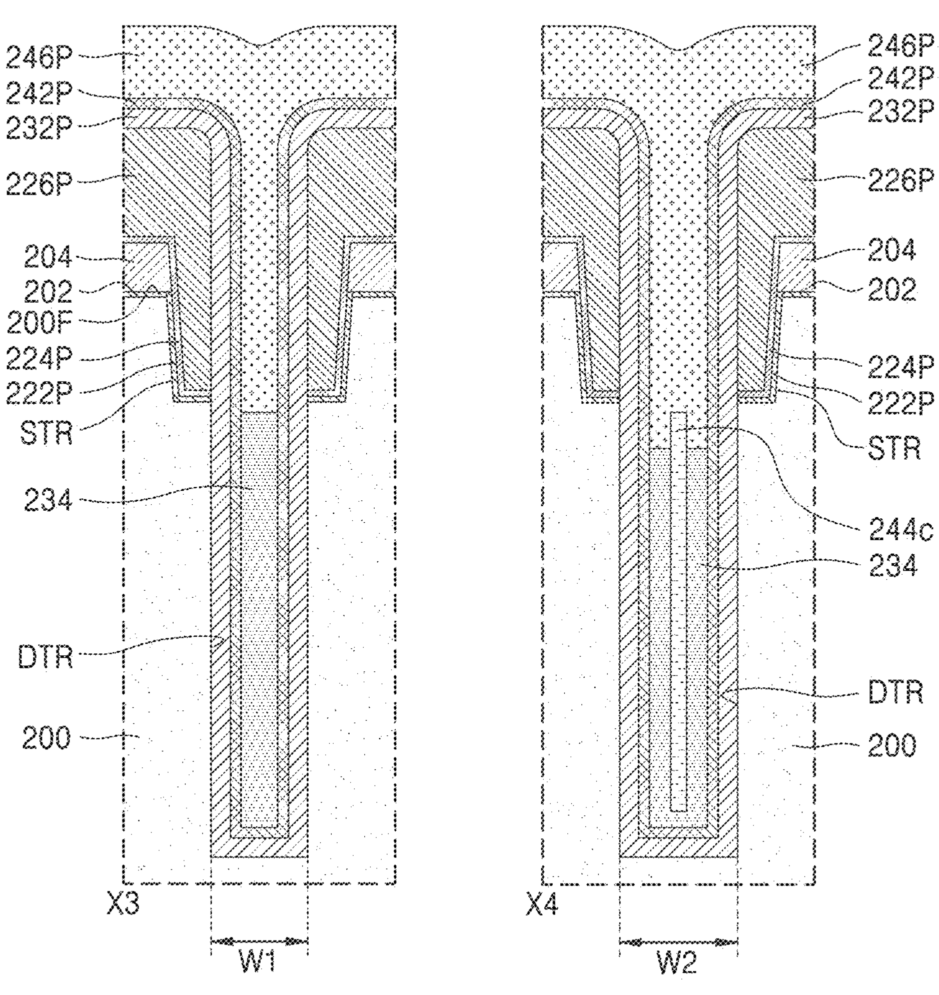

Referring to FIG. 19G, the preliminary third conductive layer 246P may be formed on the second insulating layer 234, the preliminary first conductive layer 242P, and the second conductive layer 244*c*. The preliminary third conductive layer 246P may include at least one of silicon, a metal, metal silicide, metal nitride, and/or a metal-containing film. For example, the preliminary third conductive layer 246P may include doped polysilicon. The preliminary third conductive layer 246P may be formed to fill of the inner space defined by the preliminary first conductive layer 242P, the second insulating layer 234, and the second conductive layer 244.

Figure 19H:
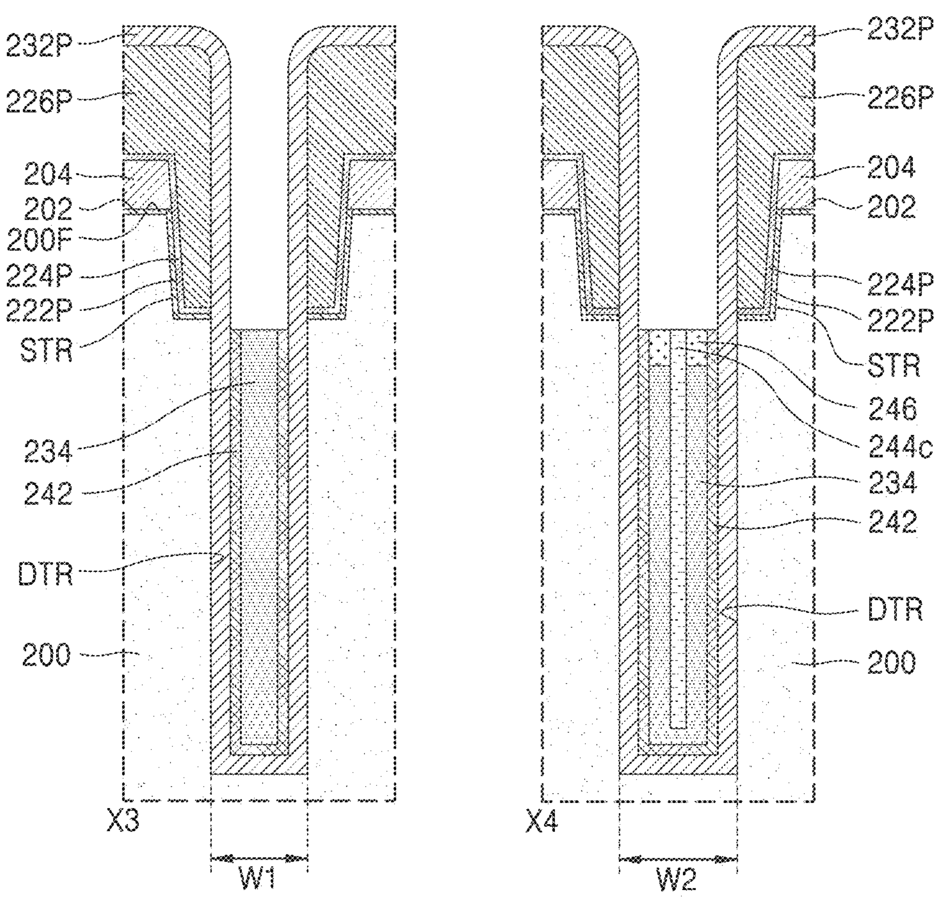
Figure 19I:
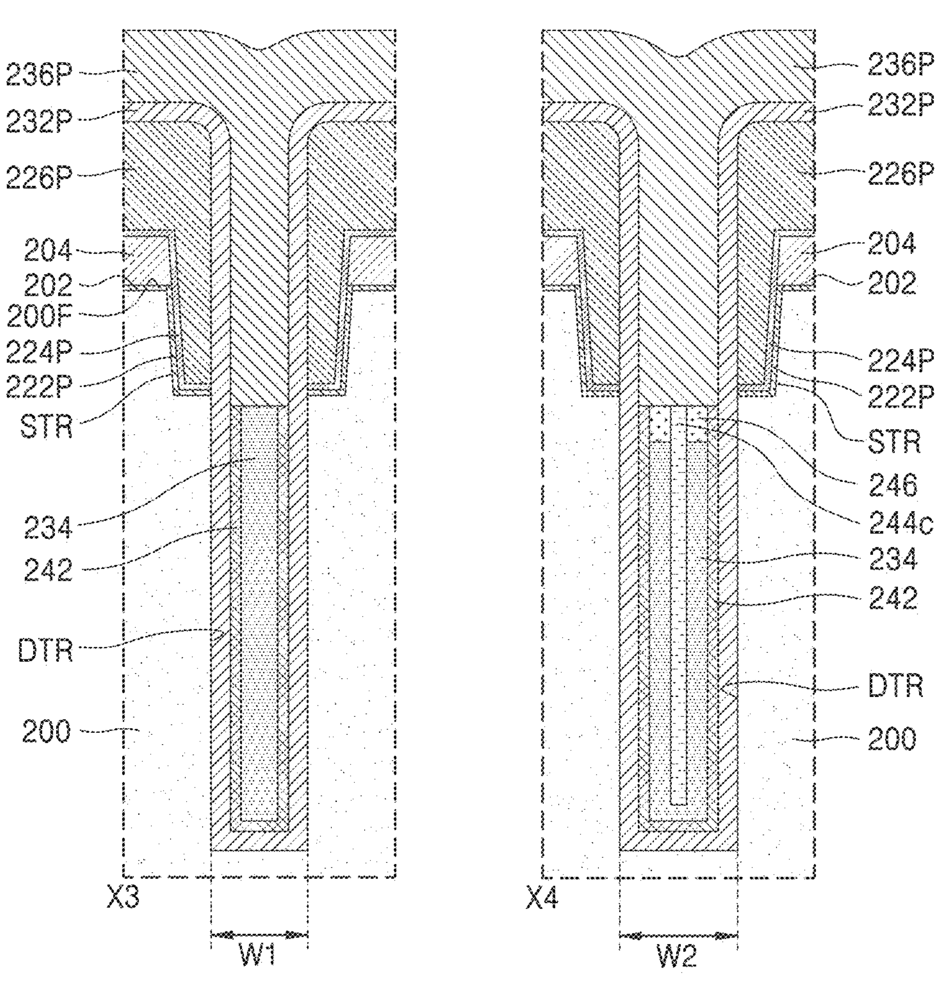

Referring to FIGS. 19G and 19H together, a portion of the preliminary third conductive layer 246P and a portion of the preliminary first conductive layer 242P may be removed to form the third conductive layer 246 and the first conductive layer 242. The inner space defined by the first conductive layer 242 in the portion X3 of the pixel separation recess DTR corresponding to the narrow region DTIN in FIGS. 16A to 18B may all be filled with the second insulating layer 234, and the inner space defined by the first conductive layer 242 in the portion X4 of the pixel separation recess DTR corresponding to the wide region DTIW may all be filled with the second insulating layer 234 and the third conductive layer 246 together. In the portion X4 of the pixel separation recess DTR corresponding to the wide region DTIW, the second insulating layer 234 may conformally cover a lower portion of the inner space defined by the first conductive layer 242 except for a portion of an upper portion, and the third conductive layer 246 may conformally cover a portion of an upper side of the inner space defined by the first conductive layer 242 and fill the inner space defined by the second insulating layer 234. The second conductive layer 244*c* may fill all of the inner space defined by the second insulating layer 234 and the third conductive layer 246. In the portion X4 of the pixel separation recess DTR corresponding to the wide region DTIW, the third conductive layer 246 may be connected and in contact with the upper portion of the first conductive layer 242.

Referring to FIG. 191, a preliminary third insulating layer 236P may be formed on the preliminary first insulating layer 232P, the second insulating layer 234, the first conductive layer 242, the second conductive layer 244*c*, and the third conductive layer 246.

Figure 19J:
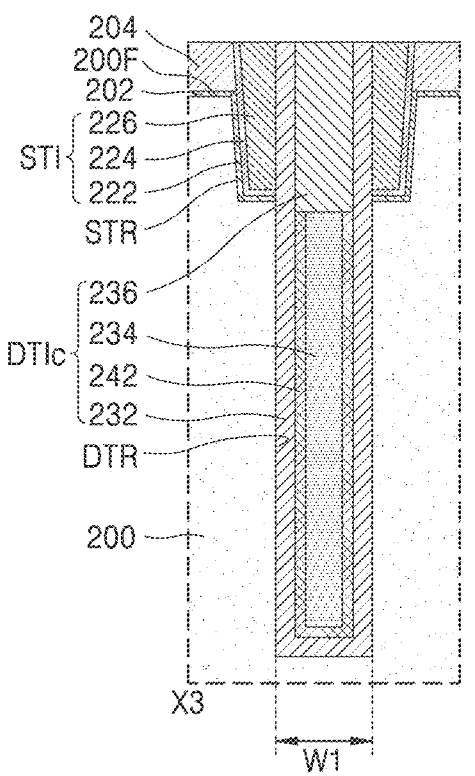
Figure 19J:
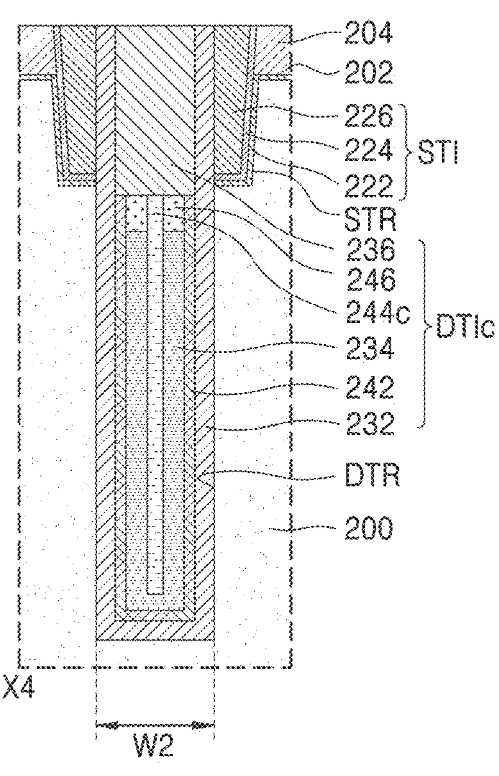

Referring to FIGS. 191 and 19J together, in order for the second pad layer 204 to be exposed, a portion of each of the preliminary first layer 222P, the preliminary second layer 224P, and the preliminary third layer 226P may be removed to form the element separation region STI including the first layer 222, the second layer 224, and the third layer 226, and a portion of each of the preliminary first insulating layer 232P and the preliminary third insulating layer 236P may be removed to form the pixel separation region DTIc including the first insulating layer 232, the first conductive layer 242, the second insulating layer 234, the second conductive layer 244*c*, the third conductive layer 246, and the third insulating layer 236.

Figure 19K:
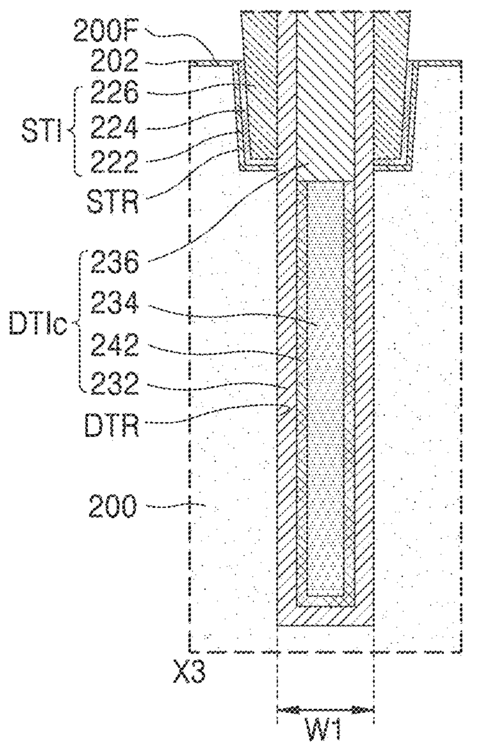
Figure 19K:
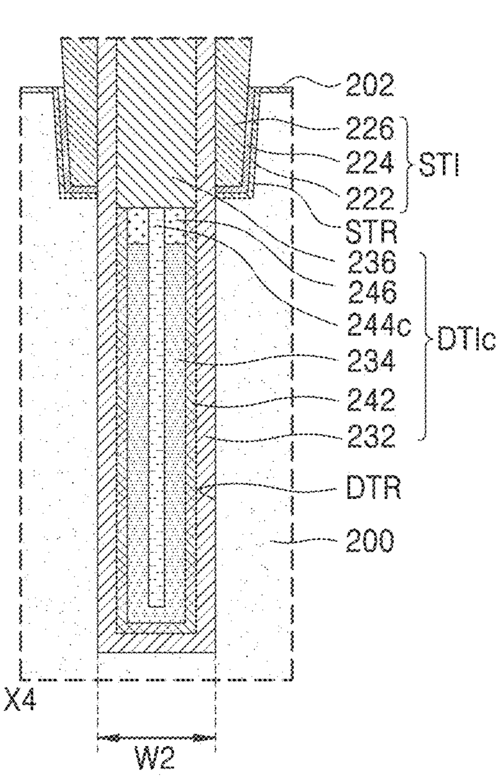

Referring to FIGS. 19J and 19K together, the second pad layer 204 may be removed.

Figure 19L:
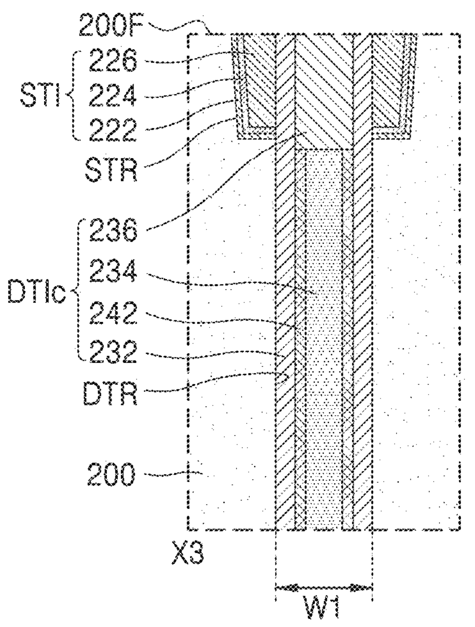
Figure 19L:
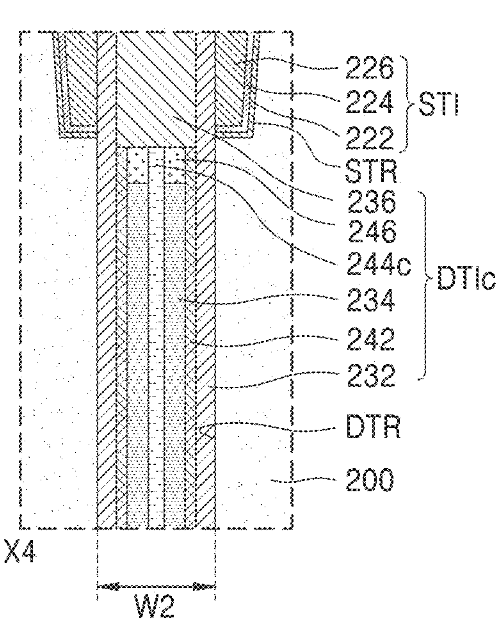

Referring to FIGS. 19K and 19L together, in a subsequent process, the first pad layer 202 may be removed, and a portion of an upper portion of each of the element separation region STI and the pixel separation area DTIc may be removed. In some example embodiments, the first surface 200F of the first substrate 200, an upper surface of the element separation region STI, and an upper surface of the pixel separation region DTIc may be located at the same vertical level.

Figure 20:
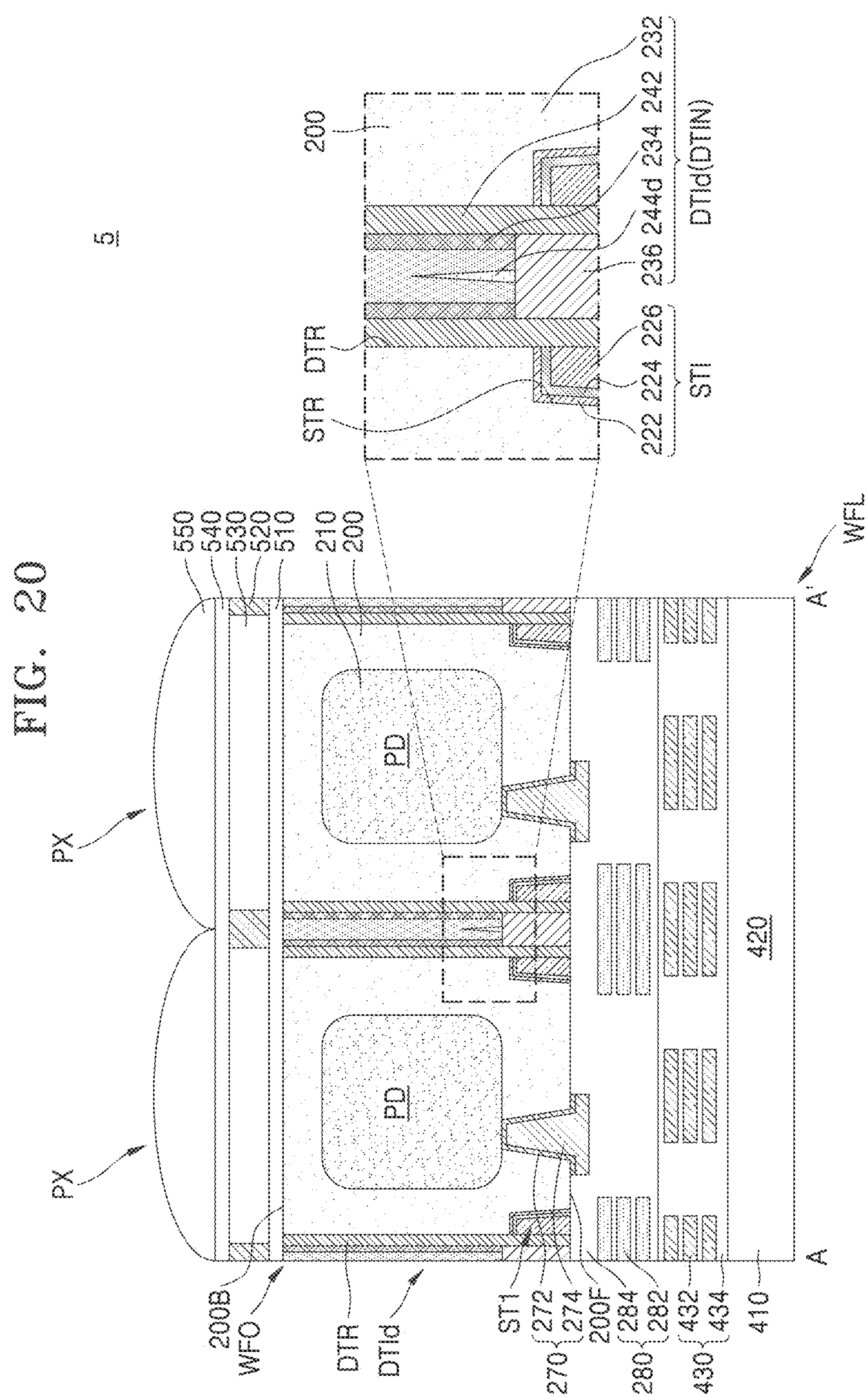
FIGS. 20 to 22 are each vertical cross-sectional views of an image sensor according to some example embodiments.
Figure 21:
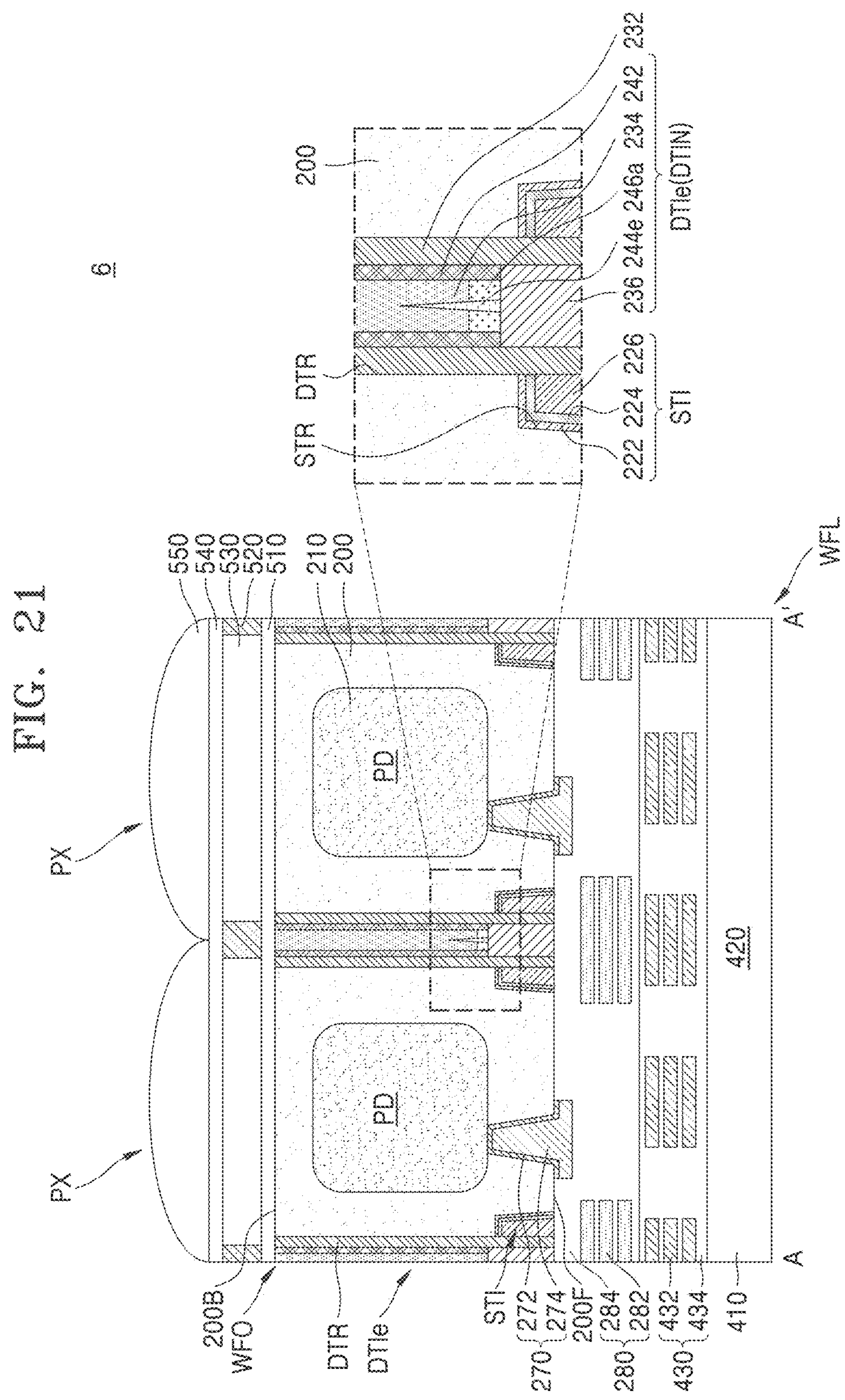
Figure 22:
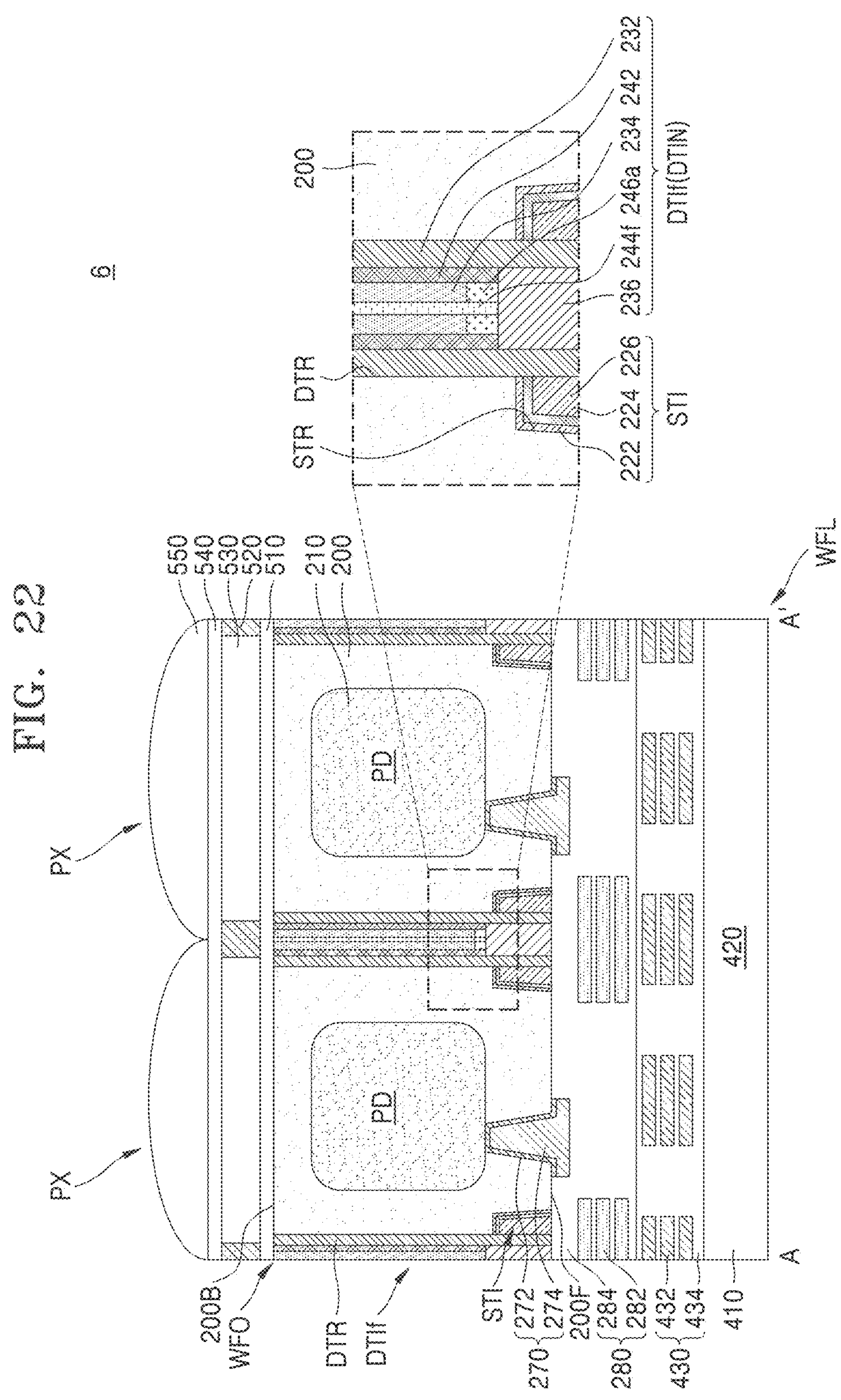

FIGS. 20 to 22 are respectively vertical cross-sectional views of the image sensors 5, 6, and 7 according to some example embodiments.

Referring to FIG. 20, the image sensor 5 may include the optical element substrate WFO having the plurality of unit pixels PX including the plurality of photo-sensing elements PD, the plurality of microlenses 550 disposed on the optical element substrate WFO, and the plurality of color filter layers 530 located between the optical element substrate WFO and the plurality of microlenses 550.

The element separation region STI and a pixel separation region DTId may be arranged in the first substrate 200. The plurality of unit pixels PX may be defined by the pixel separation region DTId, and the pixel separation region DTId may surround at least a portion of each of the plurality of photo-sensing element PD in a plan view in the first substrate 200. The pixel separation region DTId may be arranged between one photo-sensing element PD from among the plurality of photo-sensing elements PD and another photo-sensing element PD adjacent thereto. The pixel separation region DTId may be arranged between each of the plurality of photo-sensing elements PD arranged in a matrix form in a plan view, and may have a grid or mesh shape in a plan view.

The pixel separation region DTId may be formed within the pixel separation recess DTR extending from the first surface 200F of the first substrate 200 to the second surface 200B. For example, the pixel separation recess DTRd may penetrate through the first substrate 200, and the element separation recess STR may not penetrate through the first substrate 200. In some example embodiments, the pixel separation region DTId may overlap a portion of the element separation region STI in a vertical direction.

The pixel separation region DTId may include the narrow region DTIN and the wide region (DTIW in FIG. 16B). The wide region DTIW of the pixel separation region DTId included in the image sensor 5 may be substantially the same as the wide region DTIW of the pixel separation region DTIc shown in FIGS. 17A and 17B, and redundant illustrations and descriptions are omitted.

The pixel separation region DTId may include the first insulating layer 232, the second insulating layer 234, the third insulating layer 236, the first conductive layer 242, the second conductive layer 244*d*, and the third conductive layer (246 in FIG. 16B). The second conductive layer 244*d* and the third conductive layer 246 may be collectively referred to as a second conductive layer, and portions of the second conductive layer 244*d* which protrude from the third conductive layer 246 and extend in a vertical direction may be referred to as a charging portion of the second conductive layer and a connection portion of the second conductive layer, respectively.

In the narrow region DTIN of the pixel separation region DTId, the first insulating layer 232, the second insulating layer 234, the third insulating layer 236, the first conductive layer 242, and the second conductive layer 244*d* may be arranged, but the third conductive layer (246 in FIG. 16B) may not be arranged. An extension length of a portion of the second conductive layer **244*d* in a vertical direction from an upper surface of the third insulating layer 236 in the narrow region DTIN of the pixel separation region DTId may be less than an extension length of a portion of the second conductive layer 244*d* in a vertical direction from the upper surface of the third insulating layer 236 in the wide region (DTIW in FIG. 16**B) of the pixel separation region DTId.

Referring to FIG. 21, the image sensor 6 may include the optical element substrate WFO having the plurality of unit pixels PX including the plurality of photo-sensing elements PD, the plurality of microlenses 550 disposed on the optical element substrate WFO, and the plurality of color filter layers 530 located between the optical element substrate WFO and the plurality of microlenses 550.

The element separation region STI and a pixel separation region DTIe may be arranged in the first substrate 200. The plurality of unit pixels PX may be defined by the pixel separation region DTIe, and the pixel separation region DTIe may surround at least a portion of each of the plurality of photo-sensing element PD in a plan view in the first substrate 200. The pixel separation region DTIe may be arranged between one photo-sensing element PD from among the plurality of photo-sensing elements PD and another photo-sensing element PD adjacent thereto. The pixel separation region DTIe may be arranged between each of the plurality of photo-sensing elements PD arranged in a matrix form in a plan view, and may have a grid or mesh shape in a plan view.

The pixel separation region DTIe may be formed within the pixel separation recess DTR extending from the first surface 200F of the first substrate 200 to the second surface 200B. For example, the pixel separation recess DTRe may penetrate through the first substrate 200, and the element separation recess STR may not penetrate through the first substrate 200. In some example embodiments, the pixel separation region DTIe may overlap a portion of the element separation region STI in a vertical direction.

The pixel separation region DTIe may include the narrow region DTIN and the wide region (DTIW in FIG. 16B). The wide region DTIW of the pixel separation region DTIe included in the image sensor 6 may be substantially the same as the wide region DTIW of the pixel separation region DTIc shown in FIGS. 17A and 17B, and redundant illustrations and descriptions are omitted.

The pixel separation region DTIe may include the first insulating layer 232, the second insulating layer 234, the third insulating layer 236, the first conductive layer 242, a second conductive layer **244*e*, and a third conductive layer 246*a*. The second conductive layer 244*e* and the third conductive layer 246 may be collectively referred to as a second conductive layer, and portions of the second conductive layer 244*e* which protrude from the third conductive layer 246 and extend in a vertical direction may be referred to as a charging portion of the second conductive layer and a connection portion of the second conductive layer, respectively. The first insulating layer 232, the second insulating layer 234, the third insulating layer 236, the first conductive layer 242, a second conductive layer 244*e*, and a third conductive layer 246*a* may be arranged in the narrow region DTIN of the pixel separation region DTIe. The second conductive layer 244*e* may be substantially the same as the second conductive layer 244*d* shown in FIG. 20. A thickness of the third conductive layer 246*a* in a vertical direction from an upper surface of the third insulating layer 236 in the narrow region DTIN of the pixel separation region DTId may be less than a thickness of the third conductive layer 246*a* in a vertical direction from the upper surface of the third insulating layer 236 in the wide region (DTIW in FIG. 16**B) of the pixel separation region DTId.

Referring to FIG. 22, the image sensor 7 may include the optical element substrate WFO having the plurality of unit pixels PX including the plurality of photo-sensing elements PD, the plurality of microlenses 550 disposed on the optical element substrate WFO, and the plurality of color filter layers 530 located between the optical element substrate WFO and the plurality of microlenses 550.

The element separation region STI and a pixel separation region DTIf may be arranged in the first substrate 200. The plurality of unit pixels PX may be defined by the pixel separation region DTIf, and the pixel separation region DTIf may surround at least a portion of each of the plurality of photo-sensing element PD in a plan view in the first substrate 200. The pixel separation region DTIf may be arranged between one photo-sensing element PD from among the plurality of photo-sensing elements PD and another photo-sensing element PD adjacent thereto. The pixel separation region DTIf may be arranged between each of the plurality of photo-sensing elements PD arranged in a matrix form in a plan view, and may have a grid or mesh shape in a plan view.

The pixel separation region DTIf may be formed within the pixel separation recess DTR extending from the first surface 200F of the first substrate 200 to the second surface 200B. For example, a pixel separation recess DTRf may penetrate through the first substrate 200, and the element separation recess STR may not penetrate through the first substrate 200. In some example embodiments, the pixel separation region DTIf may overlap a portion of the element separation region STI in a vertical direction.

The pixel separation region DTIf may include the narrow region DTIN and the wide region (DTIW in FIG. 16B). The wide region DTIW of the pixel separation region DTIf included in the image sensor 7 may be substantially the same as the wide region DTIW of the pixel separation region DTIc shown in FIGS. 17A and 17B, and redundant illustrations and descriptions are omitted.

The pixel separation region DTIf may include the first insulating layer 232, the second insulating layer 234, the third insulating layer 236, the first conductive layer 242, a second conductive layer **244*f*, and the third conductive layer 246*a*. The second conductive layer 244*f* and the third conductive layer 246 may be collectively referred to as a second conductive layer, and portions of the second conductive layer 244*f* which protrude from the third conductive layer 246 and extend in a vertical direction may be referred to as a charging portion of the second conductive layer and a connection portion of the second conductive layer, respectively. The first insulating layer 232, the second insulating layer 234, the third insulating layer 236, the first conductive layer 242, a second conductive layer 244*f*, and a third conductive layer 246*a* may be arranged in the narrow region DTIN of the pixel separation region DTIf. An extension length of a portion of the second conductive layer 244*f* in a vertical direction from an upper surface of the third insulating layer 236 in the narrow region DTIN of the pixel separation region DTIf may be substantially equal to an extension length of a portion of the second conductive layer 244*f* in a vertical direction from the upper surface of the third insulating layer 236 in the wide region (DTIW in FIG. 16B) of the pixel separation region DTIf. A horizontal width of a portion of the second conductive layer 244*f* in the narrow region DTIN of the pixel separation region DTIf may be less than a horizontal width of a portion of the second conductive layer 244f in the wide region (DTIW in FIG. 16**B) of the pixel separation region DTIf.

While the inventive concepts have been particularly shown and described with reference to some example embodiments, it will be understood that various changes in form and details may be made therein without departing from the spirit and scope of the following claims.

What is claimed is:

1. An image sensor comprising:

a substrate having a first surface and a second surface opposite to each other, and having a pixel separation recess extending from the first surface to the second surface;

a plurality of photo-sensing elements in the substrate; and a pixel separation region filling the pixel separation recess, and surrounding at least a portion of each of the plurality of photo-sensing elements, the pixel separation region having a narrow region between sides of adjacent photo-sensing elements facing each other from among the plurality of photo-sensing elements, and a wide region between edges of the adjacent photo-sensing elements facing each other, and the pixel separation region including, a first insulating layer covering an inner wall of the pixel separation recess, a first conductive layer covering at least a portion of a side surface of the first insulating layer within the pixel separation recess, a second insulating layer covering a portion of a side surface of the first conductive layer within an inner space defined by the first conductive layer, and a second conductive layer filling all of a space not filled by the second insulating layer from among the inner space defined by the first conductive layer such that the second conductive layer is connected to and in contact with the first conductive layer.

2. The image sensor of claim 1, wherein the second conductive layer is spaced apart from the first conductive layer with the second insulating layer between the second conductive layer and the first conductive layer, at a first vertical level adjacent to the second surface of the substrate, and the second conductive layer is connected to and in contact with the first conductive layer at a second vertical level adjacent to the first surface of the substrate.

3. The image sensor of claim 1, wherein the second conductive layer is in the wide region of the pixel separation region, but is not in the narrow region of the pixel separation region.

4. The image sensor of claim 1, wherein an extension length in a vertical direction of a portion of the second conductive layer in the wide region of the pixel separation region is greater than an extension length in the vertical direction of a portion of the second conductive layer in the narrow region of the pixel separation region.

5. The image sensor of claim 1, wherein an extension length in a vertical direction of a portion of the second conductive layer in the wide region of the pixel separation region is equal to an extension length in the vertical direction of a portion of the second conductive layer in the narrow region of the pixel separation region, and a horizontal width of the portion of the second conductive layer in the wide region of the pixel separation region is greater than a horizontal width of the portion of the second conductive layer in the narrow region of the pixel separation region.

6. The image sensor of claim 1, wherein the first insulating layer is among a plurality of first insulating layers included in the pixel separation region and the first conductive layer is among a plurality of first conductive layers included in the pixel separation region and surrounds at least one photo-sensing element from among the plurality of photo-sensing elements, and at least two first conductive layers spaced apart from each other from among the plurality of first conductive layers are electrically connected to each other by the second conductive layer.

7. The image sensor of claim 6, wherein each of the plurality of first insulating layers and each of the plurality of first conductive layers are spaced apart from each other and surround each of the plurality of photo-sensing elements.

8. The image sensor of claim 6, wherein the at least two first conductive layers spaced apart from each other from among the plurality of first conductive layers are connected to and in contact with a portion of the second conductive layer in the wide region of the pixel separation region, and electrically connected to each other.

9. The image sensor of claim 1, further comprising:

a third insulating layer filling a portion adjacent to the first surface of the substrate from among another inner space defined by the first insulating layer.

10. The image sensor of claim 9, wherein the second conductive layer extends from an upper surface of the third insulating layer to the second surface of the substrate.

11. An image sensor comprising:

a substrate having a first surface and a second surface opposite to each other, and having a pixel separation recess extending from the first surface to the second surface;

a plurality of photo-sensing elements in the substrate; and a pixel separation region filling the pixel separation recess, and surrounding at least a portion of each of the plurality of photo-sensing elements, the pixel separation region having a narrow region between sides of adjacent photo-sensing elements facing each other from among the plurality of photo-sensing elements, and a wide region between edges of the adjacent photo-sensing elements facing each other, and the pixel separation region including, a plurality of first insulating layers covering an inner wall of the pixel separation recess, and spaced apart from each other and surrounding at least one of the plurality of photo-sensing elements, a plurality of first conductive layers spaced apart from each other and covering at least a portion of a side surface of each of the plurality of first insulating layers within the pixel separation recess, a second insulating layer covering a portion of side surfaces of the plurality of first conductive layers within an inner space defined by the plurality of first conductive layers within the pixel separation recess, and a second conductive layer covering the plurality of first conductive layers and the second insulating layer within the inner space defined by the plurality of first conductive layers within the pixel separation recess, and the second conductive layer including, a connection portion adjacent to the first surface of the substrate and electrically connecting at least some first conductive layers spaced apart from each other from among the plurality of first conductive layers, and an extension portion extending in a vertical direction toward the second surface of the substrate from the connection portion and spaced apart from the plurality of first conductive layers with the second insulating layer therebetween.

12. The image sensor of claim 11, wherein the connection portion and the extension portion of the second conductive layer are in the wide region of the pixel separation region, and the connection portion and the extension portion of the second conductive layer are not in the narrow region of the pixel separation region.

13. The image sensor of claim 11, wherein the connection portion of the second conductive layer is in the wide region of the pixel separation region, and the connection portion of the second conductive layer is not in the narrow region, and the extension portion of the second conductive layer is in both of the wide region and the narrow region of the pixel separation region.

14. The image sensor of claim 13, wherein an extension length in the vertical direction of a portion in the wide region of the pixel separation region from among the extension portion of the second conductive layer is greater than an extension length in the vertical direction of a portion in the narrow region of the pixel separation region from among the extension portion of the second conductive layer.

15. The image sensor of claim 11, wherein the connection portion and the extension portion of the second conductive layer are in the wide region and the narrow region of the pixel separation region, respectively.

16. The image sensor of claim 15, wherein an extension length in the vertical direction of a portion in the wide region of the pixel separation region from among the extension portion of the second conductive layer is greater than an extension length in the vertical direction of a portion in the narrow region of the pixel separation region from among the extension portion of the second conductive layer.

17. The image sensor of claim 15, wherein an extension length in the vertical direction of a portion in the wide region of the pixel separation region from among the extension portion of the second conductive layer is equal to an extension length in the vertical direction of a portion in the narrow region of the pixel separation region from among the extension portion of the second conductive layer.

18. The image sensor of claim 15, wherein a thickness in the vertical direction of a portion in the wide region of the pixel separation region from among the connection portion of the second conductive layer is greater than a thickness in the vertical direction of a portion in the narrow region of the pixel separation region.

19. An image sensor comprising:

a substrate having a first surface and a second surface opposite to each other, and having a pixel separation recess extending from the first surface to the second surface;

a plurality of photo-sensing elements in the substrate; and a pixel separation region filling the pixel separation recess, and surrounding at least a portion of each of the plurality of photo-sensing elements, the pixel separation region having a narrow region between sides of adjacent photo-sensing elements facing each other from among the plurality of photo-sensing elements, and a wide region between edges of the adjacent photo-sensing elements facing each other, and the pixel separation region including, a plurality of first insulating layers covering an inner wall of the pixel separation recess, and spaced apart from each other and surrounding at least one of the plurality of photo-sensing elements, a plurality of first conductive layers spaced apart from each other and covering at least a portion of a side surface of each of the plurality of first insulating layers within the pixel separation recess, a second insulating layer covering a side surface of the plurality of first conductive layers within an inner space defined by the plurality of first conductive layers within the pixel separation recess, and a second conductive layer covering the plurality of first conductive layers and the second insulating layer within the inner space defined by the plurality of first conductive layers within the pixel separation recess, the second conductive layer being in the wide region of the pixel separation region and not in the narrow region of the pixel separation region, and the second conductive layer including, a connection portion adjacent to the first surface of the substrate and electrically connecting at least some first conductive layers spaced apart from each other from among the plurality of first conductive layers, and an extension portion extending in a vertical direction from the connection portion to the second surface of the substrate and spaced apart from the plurality of first conductive layers with the second insulating layer therebetween.

20. The image sensor of claim 19, wherein each of the plurality of first conductive layers and the second conductive layer includes doped polysilicon.

* * * * *